(12) United States Patent
Adib et al.

(10) Patent No.: US 12,240,782 B2
(45) Date of Patent: Mar. 4, 2025

(54) ION EXCHANGEABLE YELLOW GLASS ARTICLES

(71) Applicant: CORNING INCORPORATED, Corning, NY (US)

(72) Inventors: Kaveh Adib, Corning, NY (US); Xiaoju Guo, Pittsford, NY (US); Sean Thomas Ralph Locker, Corning, NY (US); Lina Ma, Corning, NY (US); Nicole Taylor Wiles, Horseheads, NY (US)

(73) Assignee: CORNING INCORPORATED, Corning, NY (US)

( * ) Notice: Subject to any disclaimer, the term of this patent is extended or adjusted under 35 U.S.C. 154(b) by 40 days.

(21) Appl. No.: 17/994,522

(22) Filed: Nov. 28, 2022

(65) Prior Publication Data
US 2023/0382783 A1   Nov. 30, 2023

Related U.S. Application Data

(60) Provisional application No. 63/347,095, filed on May 31, 2022.

(51) Int. Cl.
*C03C 3/095* (2006.01)
*C03C 3/097* (2006.01)
(Continued)

(52) U.S. Cl.
CPC .............. *C03C 3/095* (2013.01); *C03C 3/097* (2013.01); *C03C 4/02* (2013.01); *C03C 21/002* (2013.01);
(Continued)

(58) Field of Classification Search
CPC ........... C03C 3/095; C03C 3/097; C03C 4/02; C03C 21/002; C03C 2204/00; Y10T 428/315
See application file for complete search history.

(56) References Cited

U.S. PATENT DOCUMENTS

| 2,418,605 A | 4/1947 | Shepherd, Jr. et al. |
| 3,524,737 A | 8/1970 | Doyle et al. |

(Continued)

FOREIGN PATENT DOCUMENTS

| CN | 102960081 A | 3/2013 |
| CN | 104640820 A | 5/2015 |

(Continued)

OTHER PUBLICATIONS

Bubsey, R. T. et al., "Closed-Form Expressions for Crack-Mouth Displacement and Stress Intensity Factors for Chevron-Notched Short Bar and Short Rod Specimens Based on Experimental Compliance Measurements," NASA Technical Memorandum 83796, pp. 1-30 (Oct. 1992).

(Continued)

*Primary Examiner* — Laura A Auer
(74) *Attorney, Agent, or Firm* — Russell S. Magaziner; Travis B. Gasa

(57) ABSTRACT

A glass composition includes $SiO_2$, $Al_2O_3$, $B_2O_3$, alkali metal oxides, alkaline earth oxides, $TiO_2$, $CeO_2$, $Fe_2O_3$, and is provides a yellow-colored glass article.

20 Claims, 5 Drawing Sheets

(51) Int. Cl.
    *C03C 4/02*             (2006.01)
    *C03C 21/00*          (2006.01)
    *H05K 5/03*            (2006.01)

(52) U.S. Cl.
    CPC ........... *H05K 5/03* (2013.01); *C03C 2204/00* (2013.01); *Y10T 428/315* (2015.01)

(56) References Cited

U.S. PATENT DOCUMENTS

| | | |
|---|---|---|
| 3,751,238 A | 8/1973 | Grego et al. |
| 3,778,335 A | 12/1973 | Boyd |
| 3,788,865 A | 1/1974 | Babcock et al. |
| 3,902,881 A | 9/1975 | Pirooz |
| 4,086,089 A | 4/1978 | Seward, III et al. |
| 4,102,664 A | 7/1978 | Dumbaugh, Jr. |
| 4,240,836 A | 12/1980 | Borrelli et al. |
| 4,251,278 A | 2/1981 | Hares |
| 4,298,389 A | 11/1981 | Johnson et al. |
| 4,786,305 A | 11/1988 | Ball et al. |
| 4,814,297 A | 3/1989 | Beall et al. |
| 5,300,465 A | 4/1994 | Grateau et al. |
| 6,333,286 B1 | 12/2001 | Kurachi et al. |
| 6,340,647 B1 | 1/2002 | Koyama et al. |
| 6,365,534 B1 | 4/2002 | Koyama et al. |
| 6,376,403 B1 | 4/2002 | Koyama et al. |
| 6,532,770 B2 | 3/2003 | Uhlik et al. |
| 6,547,980 B1 | 4/2003 | Kurachi et al. |
| 7,192,898 B2 | 3/2007 | Mori et al. |
| 7,659,221 B2 | 2/2010 | Arbab et al. |
| 7,666,511 B2 | 2/2010 | Ellison et al. |
| 8,127,571 B2 | 3/2012 | Martin et al. |
| 8,168,313 B2 | 5/2012 | Endo et al. |
| 8,232,218 B2 | 7/2012 | Dejneka et al. |
| 8,455,066 B2 | 6/2013 | Heithoff et al. |
| 8,962,503 B2 | 2/2015 | Nagai et al. |
| 9,053,734 B2 | 6/2015 | Kajita et al. |
| 9,156,725 B2 | 10/2015 | Dejneka et al. |
| 9,199,876 B2 | 12/2015 | Wang et al. |
| 9,284,215 B2 | 3/2016 | Yamamoto et al. |
| 9,403,716 B2 | 8/2016 | Dejneka et al. |
| 9,595,960 B2 | 3/2017 | Wilford |
| 9,701,570 B2 | 7/2017 | Mauro et al. |
| 9,790,124 B2 | 10/2017 | Dejneka et al. |
| 9,963,378 B2 | 5/2018 | Yamamoto |
| 10,081,568 B2 | 9/2018 | Plevacova et al. |
| 10,246,371 B1 | 4/2019 | Dejneka et al. |
| 10,577,275 B2 | 3/2020 | Lambricht et al. |
| 10,626,043 B2 | 4/2020 | Lambricht et al. |
| 10,656,454 B2 | 5/2020 | Bazemore et al. |
| 11,059,739 B2 | 7/2021 | Wolfinger et al. |
| 11,072,557 B2 | 7/2021 | Weiss et al. |
| 11,161,768 B2 | 11/2021 | Lambricht et al. |
| 11,192,817 B2 | 12/2021 | Ono |
| 11,267,748 B2 | 3/2022 | Siebers et al. |
| 11,390,560 B2 | 7/2022 | Murayama et al. |
| 11,420,898 B2 | 8/2022 | He et al. |
| 11,560,329 B1 | 1/2023 | Guo et al. |
| 11,613,497 B2 | 3/2023 | Finkeldey et al. |
| 2003/0210535 A1 | 11/2003 | Gaides |
| 2007/0158317 A1 | 7/2007 | Brix et al. |
| 2010/0035038 A1* | 2/2010 | Barefoot ............... C03C 3/078 428/220 |
| 2012/0135848 A1 | 5/2012 | Beall et al. |
| 2013/0128434 A1 | 5/2013 | Yamamoto et al. |
| 2013/0136909 A1 | 5/2013 | Mauro et al. |
| 2014/0066285 A1 | 3/2014 | Beall et al. |
| 2014/0087194 A1 | 3/2014 | Dejneka et al. |
| 2014/0243183 A1 | 8/2014 | Beall et al. |
| 2014/0285956 A1 | 9/2014 | Russell-Clarke et al. |
| 2015/0064474 A1 | 3/2015 | Dejneka et al. |
| 2015/0166400 A1 | 6/2015 | Yamamoto |
| 2015/0166403 A1 | 6/2015 | Yamamoto |
| 2015/0368149 A1 | 12/2015 | Guo et al. |
| 2016/0090321 A1 | 3/2016 | Bookbinder et al. |
| 2016/0168023 A1 | 6/2016 | Baum et al. |
| 2016/0326045 A1 | 11/2016 | Li |
| 2017/0166478 A1 | 6/2017 | Gross et al. |
| 2017/0184764 A1 | 6/2017 | Matsuyuki et al. |
| 2017/0217825 A1 | 8/2017 | Hasegawa et al. |
| 2017/0291849 A1 | 10/2017 | Dejneka et al. |
| 2017/0305786 A1 | 10/2017 | Roussev et al. |
| 2017/0355636 A1 | 12/2017 | Borrelli et al. |
| 2018/0148370 A1 | 5/2018 | Baker et al. |
| 2018/0162768 A1 | 6/2018 | Boek et al. |
| 2018/0362390 A1 | 12/2018 | Claireaux et al. |
| 2019/0071345 A1 | 3/2019 | Mauro et al. |
| 2019/0177206 A1 | 6/2019 | Dejneka et al. |
| 2019/0177209 A1 | 6/2019 | Dejneka et al. |
| 2019/0263713 A1 | 8/2019 | Murayama et al. |
| 2019/0300422 A1 | 10/2019 | Guo et al. |
| 2020/0140322 A1 | 5/2020 | Comte et al. |
| 2020/0189962 A1 | 6/2020 | Dejneka et al. |
| 2020/0377404 A1 | 12/2020 | Beall et al. |
| 2020/0385303 A1* | 12/2020 | Kiczenski ............... C03C 3/091 |
| 2020/0398539 A1 | 12/2020 | Brennan et al. |
| 2021/0155530 A1 | 5/2021 | Cui et al. |
| 2021/0155531 A1 | 5/2021 | Dejneka et al. |
| 2022/0135466 A1 | 5/2022 | Maeda et al. |
| 2022/0371942 A1 | 11/2022 | Ping et al. |
| 2022/0402804 A1 | 12/2022 | Guo et al. |
| 2022/0402805 A1 | 12/2022 | Guo et al. |
| 2022/0402808 A1 | 12/2022 | Guo et al. |
| 2023/0056403 A1 | 2/2023 | Nguyen et al. |

FOREIGN PATENT DOCUMENTS

| | | |
|---|---|---|
| CN | 107935410 A | 4/2018 |
| CN | 108715510 A | 10/2018 |
| CN | 109970362 A | 7/2019 |
| CN | 110216384 A | 9/2019 |
| CN | 110255896 A | 9/2019 |
| CN | 110615610 A | 12/2019 |
| CN | 113845302 A | 12/2021 |
| DE | 10141666 A1 | 3/2003 |
| EP | 1593658 A1 | 11/2005 |
| EP | 2764320 A2 | 8/2014 |
| EP | 3390311 B1 | 8/2019 |
| JP | 55-045501 A | 3/1980 |
| JP | 60-145930 A | 8/1985 |
| JP | 63-166736 A | 7/1988 |
| JP | 2000-203872 A | 7/2000 |
| JP | 2003-306348 A | 10/2003 |
| JP | 2004-002057 A | 1/2004 |
| JP | 4192232 B2 | 12/2008 |
| JP | 4303999 B2 | 7/2009 |
| JP | 7136100 B2 | 9/2022 |
| RU | 2645687 C1 | 2/2018 |
| WO | 2013/050727 A2 | 4/2013 |
| WO | 2013/099994 A1 | 7/2013 |
| WO | 2014/136751 A1 | 9/2014 |
| WO | 2017/218468 A1 | 12/2017 |
| WO | 2019/064280 A1 | 4/2019 |
| WO | 2019/083937 A2 | 5/2019 |
| WO | 2019/127818 A1 | 7/2019 |
| WO | 2021/010376 A1 | 1/2021 |
| WO | 2021/136726 A1 | 7/2021 |
| WO | 2023/107409 A1 | 6/2023 |

OTHER PUBLICATIONS

"Infrared Sensors Market Set To Show Upsurge With Rise In Home Automated Products—IndustryARC Analysis", 2017, Retrieved from: https://globenewswire.com/news-release/2017/03/21/942857/0/en/Infrared-Sensors-Market-Set-To-Show-Upsurge-With-Rise-In-Home-Automated-Products-IndustryARC-Analysis.html, Retrieved on Jan. 16, 2023.

"Near Infrared Imaging Market—Global Forecast to 2020", Fast Market Research, 2022, Retrieved from: http://www.sbwire.com/press-releases/just-published-near-infrared-imaging-market-global-672492.htm, Retrieved on Jan. 16, 2023.

"Plexiglass Acrylic Sheets", Retrieved from: http://www.eplastics.com/Plastic/Plexiglass_Acrylic_Sheet_Infrared_Transmitting?gclid=

(56) References Cited

OTHER PUBLICATIONS

EAlalQobChMIsL6mu7jp2AIVxRuBCh1EIQyVEAYYASABEgLs_fD_BWE, Retrieved on Jan. 12, 2023.

Reddy, K. P. R. et al, "Fracture Toughness Measurement of Glass and Ceramic Materials Using Chevron-Notched Specimens," J. Am. Ceram. Soc., 71 [6], C-310-C-313 (1988).

Alan R. Frank, "Near-Infrared Image Sensor Targets loT Camera Market", Mar. 2016, Retrieved from: http://electronics360.globalspec.com/article/6487/near-infrared-image-sensor-targets-iot-camera-market, Retrieved on Jan. 12, 2023.

ASTM C1351M-96(2017) "Standard Test Method for Measurement of Viscosity of Glass Between 104 Pas and 108 Pas by Viscous Compression of a Solid Right Cylinder".

ASTM C829-81 (2015), titled "Standard Practice for Measurement of L-iquidus Temperature of Glass by the Gradient Furnace Method".

ASTM E228-85 (1989), "Standard Test Method for Linear Thermal Expansion of Solid Materials With a Vitreous Silica Dilatometer".

ASTM standard C770-16, entitled "Standard Test Method for Measurement of Glass Stress-Optical Coefficient".

David Ashkenasi, Andreas Lemke, "Picosecond laser-induced color centers in glass optics", J. Laser Appl. 23, 012007 (2011).

Hirao et al., "Crystallization effect on non-linear optical response of silicate glass and glass-ceramics containing gold nanoparticles." Journal of non-crystalline solids, vol. 290, No. 1, 2001, pp. 49-56.

Llordes, et al., "Tunable near-infrared and visible-light transmittance in nanocrystals-in-glass composites", Nat. Lett., vol. 500, 2013, pp. 323-327.

Sasai, Jun, and Kazuyuki Hirao. "Crystallization effect on non-linear optical response of silicate glass and glass-ceramics containing gold nanoparticles." Journal of non-crystalline solids 290, No. 1 (2001): 49-56.

Sheng, J., K. Kadono, and T. Yazawa. "Easily recyclable coloured glass by x-ray irradiation induced coloration." Glass technology 43, No. 6 (2002): 238-244.

Sheng, Jiawei, Kohei Kadono, and Tetsuo Yazawa. "Nanosized gold clusters formation in selected areas of soda-lime silicate glass." Journal of non-crystalline solids 324, No. 3 (2003): 295-299.

Stookey, S. D. "Coloration of glass by gold, silver, and copper." Journal of the American Ceramic Society, vol. 32, No. 8, 1949, pp. 246-249.

Yamashita, Masaru, Zhidong Yao, Yoshinobu Matsumoto, Yasushi Utagawa, Kohei Kadono, and Tetsuo Yazawa. "X-ray irradiation-induced coloration of manganese in soda-lime silicate glass." Journal of non-crystalline solids 333, No. 1 (2004): 37-43.

Yazawa, et al., "Nanosized gold clusters formation in selected areas of soda-lime silicate glass." Journal of non-crystalline solids, vol. 324, No. 3, 2003, pp. 295-299.

International Search Report and Written Opinion of the International Searching Authority; PCT/US2023/023491; dated Aug. 25, 2023; 9 pages; US Patent Office.

Berezhnoy et al., "Synthesis and study of some thermophysical properties of photosensitive glass-ceramics in the R2O—ZnO—Al2O3—SiO2 system", 1969, 9 pages.

\* cited by examiner

ION EXCHANGEABLE YELLOW GLASS ARTICLES

CROSS-REFERENCE TO RELATED APPLICATIONS

This application claims priority to U.S. Application No. 63/347,095 filed May 31, 2022, which is incorporated by reference herein in its entirety.

FIELD

The present specification generally relates to glass compositions and glass articles and, in particular, to glass compositions and ion-exchangeable, colored glass articles formed therefrom.

TECHNICAL BACKGROUND

Aluminosilicate glass articles may exhibit superior ion-exchangeability and drop performance. Various industries, including the consumer electronics industry, desire colored materials with the same or similar strength and fracture toughness properties. However, simply including colorants in conventional aluminosilicate glass compositions may not produce the desired color and/or result in colored glass articles suitable for use in electronic devices transmitting and/or receiving high frequencies (e.g., frequencies of fifth generation (5G) wireless).

Accordingly, a need exists for alternative colored glass articles that provide the high strength and fracture toughness necessary for use in electronic devices.

SUMMARY

According to a first aspect, a glass composition is provided. The glass composition, comprising: greater than or equal to 53 mol % to less than or equal to 66 mol % $SiO_2$; greater than or equal to 9 mol % to less than or equal to 18 mol % $Al_2O_3$; greater than or equal to 0 mol % to less than or equal to 15 mol % $B_2O_3$; greater than or equal to 0 mol % to less than or equal to 3 mol % $P_2O_5$; greater than or equal to 0 mol % to less than or equal to 16 mol % $Li_2O$; greater than or equal to 0 mol % to less than or equal to 15 mol % $Na_2O$; greater than or equal to 0 mol % to less than or equal to 5 mol % $K_2O$; greater than or equal to 0 mol % to less than or equal to 6 mol % MgO; greater than or equal to 0 mol % to less than or equal to 6 mol % CaO; greater than or equal to 0 mol % to less than or equal to 3 mol % ZnO; greater than or equal to 0 mol % to less than or equal to 2 mol % $TiO_2$; greater than 0 mol % to less than or equal to 2 mol % $CeO_2$; greater than or equal to 0 mol % to less than or equal to 1 mol % $Fe_2O_3$; greater than or equal to 0 mol % to less than or equal to 0.5 mol % $SnO_2$; greater than or equal to 0 mol % to less than or equal to 0.05 mol % $SO_3$; greater than or equal to 0 mol % to less than or equal to 1 mol % $WO_3$; greater than or equal to 0 mol % to less than or equal to 1 mol % $Nb_2O_5$; greater than or equal to 0 mol % to less than or equal to 1 mol % $Bi_2O_3$; greater than or equal to 0 mol % to less than or equal to 1 mol % $MoO_3$; and greater than or equal to 0 mol % to less than or equal to 3 mol % $La_2O_3$; wherein: $TiO_2+CeO_2$ is greater than or equal to 0.2 mol %; and $Li_2O+Na_2O$ is greater than or equal to 8 mol %.

According to another aspect, a colored glass article is provided. The colored glass article comprises the composition of the first aspect.

According to another aspect, a method of forming a colored glass article is provided. The method of forming a colored glass article, comprising: rolling a glass composition to form a rolled glass article; and cooling the rolled glass article to form the colored glass article, wherein the glass composition is the glass composition of the first aspect.

Additional features and advantages of the colored glass articles described herein will be set forth in the detailed description which follows, and in part will be readily apparent to those skilled in the art from that description or recognized by practicing the embodiments described herein, including the detailed description which follows, the claims, as well as the appended drawings.

It is to be understood that both the foregoing general description and the following detailed description describe various embodiments and are intended to provide an overview or framework for understanding the nature and character of the claimed subject matter. The accompanying drawings are included to provide a further understanding of the various embodiments, and are incorporated into and constitute a part of this specification. The drawings illustrate the various embodiments described herein, and together with the description serve to explain the principles and operations of the claimed subject matter.

DETAILED DESCRIPTION

Figure 1:
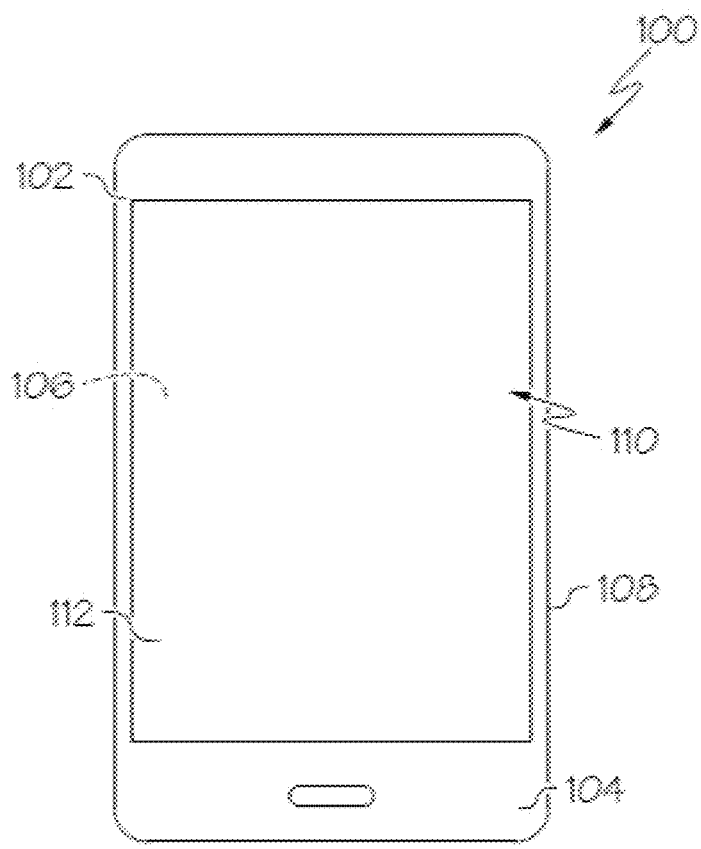
FIG. 1 is a plan view of an electronic device incorporating any of the colored glass articles according to one or more embodiments described herein.

Reference will now be made in detail to various embodiments of glass compositions and colored glass articles formed therefrom having a desired color and suitable for use in high frequency applications. According to embodiments, a glass composition includes greater than or equal to 53 mol % to less than or equal to 66 mol % $SiO_2$; greater than or equal to 9 mol % to less than or equal to 18 mol % $Al_2O_3$; greater than or equal to 0 mol % to less than or equal to 15 mol % $B_2O_3$; greater than or equal to 0 mol % to less than or equal to 3 mol % $P_2O_5$; greater than or equal to 0 mol % to less than or equal to 16 mol % $Li_2O$; greater than or equal to 0 mol % to less than or equal to 15 mol % $Na_2O$; greater than or equal to 0 mol % to less than or equal to 5 mol % $K_2O$; greater than or equal to 0 mol % to less than or equal to 6 mol % MgO; greater than or equal to 0 mol % to less than or equal to 6 mol % CaO; greater than or equal to 0 mol % to less than or equal to 3 mol % ZnO; greater than or equal to 0 mol % to less than or equal to 2 mol % $TiO_2$; greater than 0 mol % to less than or equal to 2 mol % $CeO_2$; greater than or equal to 0 mol % to less than or equal to 1 mol %

$Fe_2O_3$; greater than or equal to 0 mol % to less than or equal to 0.5 mol % $SnO_2$; greater than or equal to 0 mol % to less than or equal to 0.05 mol % $SO_3$; greater than or equal to 0 mol % to less than or equal to 1 mol % $WO_3$; greater than or equal to 0 mol % to less than or equal to 1 mol % $Nb_2O_5$; greater than or equal to 0 mol % to less than or equal to 1 mol % $Bi_2O_3$; greater than or equal to 0 mol % to less than or equal to 1 mol % $MoO_3$; and greater than or equal to 0 mol % to less than or equal to 3 mol % $La_2O_3$; wherein: $TiO_2+CeO_2$ is greater than or equal to 0.2 mol %; and $Li_2O+Na_2O$ is greater than or equal to 8 mol %. Various embodiments of colored glass articles and methods of making the same will be described herein with specific reference to the appended drawings.

Ranges may be expressed herein as from "about" one particular value, and/or to "about" another particular value. When such a range is expressed, another embodiment includes from the one particular value and/or to the other particular value. Similarly, when values are expressed as approximations, by use of the antecedent "about," it will be understood that the particular value forms another embodiment. It will be further understood that the endpoints of each of the ranges are significant both in relation to the other endpoint, and independently of the other endpoint.

Directional terms as used herein—for example up, down, right, left, front, back, top, bottom—are made only with reference to the figures as drawn and are not intended to imply absolute orientation.

Unless otherwise expressly stated, it is in no way intended that any method set forth herein be construed as requiring that its steps be performed in a specific order, nor that with any apparatus specific orientations be required. Accordingly, where a method claim does not actually recite an order to be followed by its steps, or that any apparatus claim does not actually recite an order or orientation to individual components, or it is not otherwise specifically stated in the claims or description that the steps are to be limited to a specific order, or that a specific order or orientation to components of an apparatus is not recited, it is in no way intended that an order or orientation be inferred, in any respect. This holds for any possible non-express basis for interpretation, including: matters of logic with respect to arrangement of steps, operational flow, order of components, or orientation of components; plain meaning derived from grammatical organization or punctuation, and; the number or type of embodiments described in the specification.

As used herein, the singular forms "a," "an" and "the" include plural referents unless the context clearly dictates otherwise. Thus, for example, reference to "a" component includes aspects having two or more such components, unless the context clearly indicates otherwise.

In the embodiments of the glass compositions and the resultant colored glass articles described herein, the concentrations of constituent components in oxide form (e.g., $SiO_2$, $Al_2O_3$, and the like) are specified in mole percent (mol %) on an oxide basis, unless otherwise specified.

The term "substantially free," when used to describe the concentration and/or absence of a particular constituent component in a glass composition and the resultant colored glass article, means that the constituent component is not intentionally added to the glass composition and the resultant colored glass article. However, the glass composition and the colored glass article may contain traces of the constituent component as a contaminant or tramp, such as in amounts of less than 0.01 mol %, unless specified otherwise herein.

The terms "0 mol %" and "free," when used to describe the concentration and/or absence of a particular constituent component in a glass composition, means that the constituent component is not present in the glass composition.

Surface compressive stress is measured with a surface stress meter (FSM) such as commercially available instruments such as the FSM-6000, manufactured by Orihara Industrial Co., Ltd. (Japan). Surface stress measurements rely upon the measurement of the stress optical coefficient (SOC), which is related to the birefringence of the glass article. SOC, in turn, is measured according to Procedure C (Glass Disc Method) described in ASTM standard C770-16, entitled "Standard Test Method for Measurement of Glass Stress-Optical Coefficient," the contents of which are incorporated herein by reference in their entirety. Depth of compression (DOC) is also measured with the FSM. The maximum central tension (CT) values are measured using a scattered light polariscope (SCALP) technique known in the art.

The term "depth of compression" (DOC), as used herein, refers to the position in the article where compressive stress transitions to tensile stress.

The term "CIELAB color space," as used herein, refers to a color space defined by the International Commission on Illumination (CIE) in 1976. It expresses color as three values: L* for the lightness from black (0) to white (100), a* from green (−) to red (+), and B* from blue (−) to yellow (+).

The term "color gamut," as used herein, refers to the pallet of colors that may be achieved by the colored glass articles within the CIELAB color space.

Colorants have been added to conventional aluminosilicate glass compositions to achieve a colored glass article having a desired color and improved mechanical properties. For example, transition metal oxides and/or rare earth oxides may be added. However, simply including colorants in aluminosilicate glass compositions may not produce the desired color and color stability, and/or result in in colored glass articles suitable for use in electronic devices transmitting and/or receiving high frequencies (e.g., frequencies of fifth generation (5G)).

Disclosed herein are glass compositions and colored glass articles formed therefrom that mitigate the aforementioned problems such that transition metal oxides and/or rare earth oxides may be added to produce colored articles having the desired color and a reduced dielectric constant for use in high frequency applications while retaining the superior ion-exchangeability and drop performance of the colored glass articles. Specifically, the glass compositions disclosed herein include cerium oxides to achieve a desired color and color stability. Moreover, the glass compositions disclosed herein include provide a damage resistance and ion exchange capability that allow use in mobile electronic devices.

The glass compositions and colored glass articles described herein may be described as aluminosilicate glass compositions and colored glass articles and comprise $SiO_2$, $Al_2O_3$, and $CeO_2$. In addition to $SiO_2$, $Al_2O_3$, and $CeO_2$, the glass compositions and colored glass articles described herein have a minimum content of $TiO_2+CeO_2$ produce colored glass articles having the desired yellow color. The glass compositions and colored glass articles described herein also include alkali oxides, such as $Li_2O$, $Na_2O$, and $K_2O$, to enable the ion-exchangeability of the colored glass articles.

The glass compositions described herein are capable of forming colored glass articles with a yellow color. The glass composition also provides desirable color stability throughout various forming processes. The color stability discussed herein refers to changes in color as a result of heat exposure/treatment, with decreased susceptibility to color change with heat exposure being desirable. For example, the glass compositions provide color stability throughout a roll forming and cooling process that may be utilized to form thin glass sheets appropriate for use in mobile electronic devices. The color stability is impacted by both the base glass composition and the colorant package. Glass compositions that do not exhibit the color stability of the glass compositions described herein may be subject to undesired color variability within a single article or across multiple articles within a manufacturing run, rendering the produced glass articles outside of the desired color parameters and reducing yield. The glass compositions described herein may be utilized to form colored glass articles for electronic devices, colored glass articles for electronic appliances, and art glass, among other applications.

$SiO_2$ is the primary glass former in the glass compositions described herein and may function to stabilize the network structure of the colored glass articles. The concentration of $SiO_2$ in the glass compositions and resultant colored glass articles should be sufficiently high (e.g., greater than or equal to 53 mol %) to enhance the chemical durability of the glass composition and, in particular, the resistance of the glass composition to degradation upon exposure to acidic solutions, basic solutions, and in water. The amount of $SiO_2$ may be limited (e.g., to less than or equal to 66 mol %) to control the melting point of the glass composition, as the melting point of pure $SiO_2$ or high $SiO_2$ glasses is undesirably high. Thus, limiting the concentration of $SiO_2$ may aid in improving the meltability of the glass composition and the formability of the colored glass article.

In embodiments, the glass composition and the colored glass article may comprise greater than or equal to 53 mol % and less than or equal to 66 mol % $SiO_2$, such as greater than or equal to 55 mol % and less than or equal to 66 mol % $SiO_2$, or greater than or equal to 58 mol % and less than or equal to 64 mol % $SiO_2$. In embodiments, the concentration of $SiO_2$ in the glass composition and the colored glass article may be greater than or equal to 53 mol %, greater than or equal to 55 mol %, greater than or equal to 57 mol %, greater than or equal to 60 mol %, greater than or equal to 63 mol %, or more. In embodiments, the concentration of $SiO_2$ in the glass composition and the colored glass article may be less than or equal to 65 mol %, less than or equal to 64 mol %, less than or equal to 63 mol %, or less. In embodiments, the concentration of $SiO_2$ in the glass composition and the colored glass article may be greater than or equal to 55 mol % and less than or equal to 66 mol %, greater than or equal to 56 mol % and less than or equal to 65 mol %, greater than or equal to 57 mol % and less than or equal to 64 mol %, greater than or equal to 58 mol % and less than or equal to 63 mol %, greater than or equal to 59 mol % and less than or equal to 62 mol %, greater than or equal to 60 mol % and less than or equal to 61 mol %, or any and all sub-ranges formed from any of these endpoints. In embodiments, the concentration of $SiO_2$ in the glass composition and the colored glass article may be greater than or equal to 58 mol % and less than or equal to 64 mol %.

Like $SiO_2$, $Al_2O_3$ may also stabilize the glass network and additionally provides improved mechanical properties and chemical durability to the glass composition and the colored glass article. The amount of $Al_2O_3$ may also be tailored to control the viscosity of the glass composition. $Al_2O_3$ may be included such that the resultant glass composition has the desired fracture toughness. However, if the amount of $Al_2O_3$ is too high (e.g., greater than 18 mol %), the viscosity of the melt may increase, thereby diminishing the formability of the colored glass article.

Accordingly, in embodiments, the glass composition and the colored glass article may comprise greater than or equal to 9 mol % and less than or equal to 18 mol % $Al_2O_3$, such as greater than or equal to 9 mol % and less than or equal to 15 mol % $Al_2O_3$, or greater than or equal to 14 mol % and less than or equal to 16 mol % $Al_2O_3$. In embodiments, the concentration of $Al_2O_3$ in the glass composition and the colored glass article may be greater than or equal to 10 mol %, greater than or equal to 12 mol %, greater than or equal to 13 mol %, greater than or equal to 14 mol %, or more. In embodiments, the concentration of $Al_2O_3$ in the glass composition and the colored glass article may be less than or equal to 17 mol %, less than or equal to 16 mol %, less than or equal to 15 mol %, less than or equal to 14 mol %, or less. In embodiments, the concentration of $Al_2O_3$ in the glass composition and the resultant colored glass article may be greater than or equal to 10 mol % and less than or equal to 17 mol %, greater than or equal to 11 mol % and less than or equal to 16 mol % greater than or equal to 12 mol % and less than or equal to 15 mol %, greater than or equal to 13 mol % and less than or equal to 14 mol %, or any and all sub-ranges formed from any of these endpoints.

$B_2O_3$ decreases the melting point of the glass composition, which may improve the retention of certain colorants in the glass. $B_2O_3$ may also improve the damage resistance of the colored glass article. In addition, $B_2O_3$ is added to reduce the formation of non-bridging oxygen, the presence of which may reduce fracture toughness. The inclusion of $B_2O_3$ reduces the melting point of the glass composition, improves the formability, and increases the fracture toughness of the colored glass article. However, if $B_2O_3$ is too high (e.g., greater than 15 mol %), the annealing point and strain point may decrease, which increases stress relaxation and reduces the overall strength of the colored glass article. Lower $B_2O_3$ contents in the glass composition produce a colored glass article with lighter yellow color (lower b*) but also improve color stability.

In embodiments, the glass composition and the colored glass article may comprise greater than or equal to 0 mol % and less than or equal to 15 mol % $B_2O_3$, such as greater than or equal to 1 mol % and less than or equal to 9 mol % $B_2O_3$, or greater than or equal to 4 mol % and less than or equal to 7 mol % $B_2O_3$. In embodiments, the concentration of $B_2O_3$ in the glass composition and the colored glass article may be greater than or equal to 0.1 mol %, greater than or equal to 1 mol %, greater than or equal to 2 mol %, greater than or equal to 3 mol %, greater than or equal to 4 mol %, greater than or equal to 5 mol %, or more. In embodiments, the concentration of $B_2O_3$ in the glass composition and the colored glass article may be less than or equal to 14 mol %, less than or equal to 13 mol %, less than or equal to 10 mol %, less than or equal to 9 mol %, less than or equal to 7 mol %, or less. In embodiments, the concentration of $B_2O_3$ in the glass composition and the resultant colored glass article may be greater than or equal to 1 mol % and less than or equal to 14 mol %, greater than or equal to 2 mol % and less than or equal to 13 mol %, greater than or equal to 3 mol % and less than or equal to 12 mol %, greater than or equal to 4 mol % and less than or equal to 11 mol %, greater than or equal to 5 mol % and less than or equal to 10 mol %, greater than or equal to 6 mol % and less than or equal to 9 mol %, greater than or equal to 7 mol % and less than or equal to 8 mol %, or any and all sub-ranges formed from any of these endpoints.

As described hereinabove, the glass compositions and the colored glass articles may contain alkali oxides, such as $Li_2O$, $Na_2O$, and $K_2O$, to enable the ion-exchangeability of the colored glass articles.

$Li_2O$ aids in the ion-exchangeability of the colored glass article and also reduces the softening point of the glass composition, thereby increasing the formability of the colored glass articles. $Li_2O$ is also the most beneficial of the alkali metal oxides for the purposes of promoting color stability in the colored glass article. In addition, $Li_2O$ decreases the melting point of the glass composition, which may help improve retention of colorants in the glass. The concentration of $Li_2O$ in the glass compositions and resultant colored glass articles should be sufficiently high to reduce the melting point of the glass composition and achieve the desired maximum central tension. However, if the amount of $Li_2O$ is too high (e.g., greater than 16 mol %), the liquidus temperature may increase, thereby diminishing the manufacturability of the colored glass article.

In embodiments, the glass composition and the colored glass article may comprise greater than or equal to 0 mol % and less than or equal to 16 mol % $Li_2O$, such as greater than or equal to 6 mol % and less than or equal to 14 mol % $Li_2O$, or greater than or equal to 9 mol % and less than or equal to 15 mol % $Li_2O$. In embodiments, the concentration of $Li_2O$ in the glass composition and the colored glass article may be greater than or equal to 1 mol %, greater than or equal to 5 mol %, greater than or equal to 10 mol %, or more. In embodiments, the concentration of $Li_2O$ in the glass composition and the colored glass article may be less than or equal to 14 mol %, less than or equal to 12 mol %, less than or equal to 10 mol %, or less. In embodiments, the concentration of $Li_2O$ in the glass composition and the resultant colored glass article may be greater than or equal to 0.1 mol % and less than or equal to 15 mol %, greater than or equal to 1 mol % and less than or equal to 14 mol %, greater than or equal to 2 mol % and less than or equal to 13 mol %, greater than or equal to 3 mol % and less than or equal to 12 mol %, greater than or equal to 4 mol % and less than or equal to 11 mol %, greater than or equal to 5 mol % and less than or equal to 10 mol %, greater than or equal to 6 mol % and less than or equal to 9 mol %, greater than or equal to 7 mol % and less than or equal to 8 mol %, or any and all sub-ranges formed from any of these endpoints.

$Na_2O$ improves diffusivity of alkali ions in the glass and thereby reduces ion-exchange time and helps achieve the desired surface compressive stress (e.g., greater than or equal to 300 MPa). $Na_2O$ also improves formability of the colored glass article. In addition, $Na_2O$ decreases the melting point of the glass composition, which may help improve colorant retention. However, if too much $Na_2O$ is added to the glass composition, the melting point may be too low. As such, in embodiments, the concentration of $Li_2O$ present in the glass composition and the colored glass article may be greater than the concentration of $Na_2O$ present in the glass composition and the colored glass article.

In embodiments, the glass composition and the colored glass article may comprise greater than or equal to 0 mol % and less than or equal to 15 mol % $Na_2O$, such as greater than or equal to 0.1 mol % and less than or equal to 7 mol % $Na_2O$, or greater than or equal to 0.1 mol % and less than or equal to 2 mol % $Na_2O$. In embodiments, the concentration of $Na_2O$ in the glass composition and the colored glass article may be greater than 0 mol %, greater than or equal to 0.1 mol %, greater than or equal to 0.5 mol %, greater than or equal to 1 mol %, or more. In embodiments, the concentration of $Na_2O$ in the glass composition and the colored glass article may be less than or equal to 12 mol %, less than or equal to 10 mol %, less than or equal to 8 mol %, less than or equal to 6 mol %, less than or equal to 4 mol %, less than or equal to 3 mol %, or less. In embodiments, the concentration of $Na_2O$ in the glass composition and the resultant colored glass article may be greater than 0 mol % and less than or equal to 14 mol %, greater than or equal to 0.1 mol % and less than or equal to 13 mol %, greater than or equal to 0.5 mol % and less than or equal to 12 mol %, greater than or equal to 1 mol % and less than or equal to 11 mol %, greater than or equal to 2 mol % and less than or equal to 10 mol %, greater than or equal to 3 mol % and less than or equal to 9 mol %, greater than or equal to 4 mol % and less than or equal to 8 mol %, greater than or equal to 5 mol % and less than or equal to 7 mol %, greater than or equal to 2 mol % and less than or equal to 6 mol %, or any and all sub-ranges formed from any of these endpoints.

$K_2O$ promotes ion-exchange and may increase the depth of compression and decrease the melting point to improve the formability of the colored glass article. However, adding too much $K_2O$ may cause the surface compressive stress and melting point to be too low. $K_2O$ may also negatively impact the color stability of the colored glass article. Accordingly, in embodiments, the amount of $K_2O$ added to the glass composition may be limited.

In embodiments, the glass composition and the colored glass article may comprise greater than or equal to 0 mol % and less than or equal to 5 mol % $K_2O$, such as greater than or equal to 0 mol % and less than or equal to 3 mol % $K_2O$, or greater than or equal to 0 mol % and less than or equal to 0.5 mol % $K_2O$. In embodiments, the concentration of $K_2O$ in the glass composition and the colored glass article may be greater than 0 mol %, greater than or equal to 0.1 mol %, greater than or equal to 0.2 mol %, or more. In embodiments, the concentration of $K_2O$ in the glass composition and the colored glass article may be less than or equal to 1 mol %, less than or equal to 0.7 mol %, less than or equal to 0.5 mol %, or less. In embodiments, the concentration of $K_2O$ in the glass composition and the resultant colored glass article may be greater than 0 mol % and less than or equal to 4 mol %, greater than or equal to 0.1 mol % and less than or equal to 3 mol %, greater than or equal to 0.2 mol % and less than or equal to 2 mol %, greater than or equal to 0.5 mol % and less than or equal to 1 mol %, or any and all sub-ranges formed from any of these endpoints.

$R_2O$ is the sum (in mol %) of $Li_2O$, $Na_2O$, and $K_2O$ present in the glass composition and the colored glass article (i.e., $R_2O=Li_2O$ (mol %)+$Na_2O$ (mol %)+$K_2O$ (mol %). Like $B_2O_3$, the alkali oxides aid in decreasing the softening point and molding temperature of the glass composition, thereby offsetting the increase in the softening point and molding temperature of the glass composition due to higher amounts of $SiO_2$ in the glass composition, for example. The softening point and molding temperature may be further reduced by including combinations of alkali oxides (e.g., two or more alkali oxides) in the glass composition, a phenomenon referred to as the "mixed alkali effect." However, it has been found that if the amount of $R_2O$ is too high, the average coefficient of thermal expansion of the glass composition increases to greater than $100 \times 10^{-7}$C, which may be undesirable.

In embodiments, the concentration of $R_2O$ in the glass composition and the colored glass article may be greater than or equal to 10 mol %, greater than or equal to 12 mol %, greater than 14 mol %, greater than or equal to 16 mol %, or more. In embodiments, the concentration of $R_2O$ in the glass composition and the colored glass article may be less than or equal to 19 mol %, less than or equal to 18 mol %, less than or equal to 15 mol %, less than or equal to 13 mol %, or less. In embodiments, the concentration of $R_2O$ in the glass composition and the colored glass article may be greater than or equal to 10 mol % and less than or equal to 19 mol %, greater than or equal to 11 mol % and less than or equal to 18 mol %, greater than or equal to 12 mol % and less than or equal to 17 mol %, greater than or equal to 13 mol % and less than or equal to 16 mol %, greater than or equal to 14 mol % and less than or equal to 15 mol %, or any and all sub-ranges formed from any of these endpoints.

The concentration of $Li_2O+Na_2O$ in the glass composition and the colored glass article determines the ability of the glass composition and the colored glass article to be strengthened through an ion exchange process. Generally, the ion exchange process strengthens the glass by replacing alkali ions in the glass with larger alkali ions. For example, a glass containing $Li_2O$ and/or $Na_2O$ may be strengthened by ion exchange such that potassium ions ($K^+$) replace the $Li^+$ or $Na^+$ ions in the glass. In this manner, the ability of the colored glass article to be strengthened by an ion exchange process relates directly to the content of $Li_2O+Na_2O$, and if the $Li_2O+Na_2O$ content is too low (e.g., less than about 8 mol %) the colored glass article may not be able to be sufficiently strengthened by ion exchange processes.

In embodiments, the concentration of $Li_2O+Na_2O$ in the glass composition and the colored glass article is greater than or equal to than or equal to 8 mol %, such as greater than or equal to 10 mol % and less than or equal to than or equal to 19 mol %. In embodiments, the concentration of $Li_2O+Na_2O$ in the glass composition and the colored glass article is greater than or equal to than or equal to 9 mol %, greater than or equal to 10 mol %, greater than or equal to 12 mol %, greater than or equal to 14 mol %, greater than or equal to 16 mol %, or more. In embodiments, the concentration of $Li_2O+Na_2O$ in the glass composition and the colored glass article is less than or equal to than or equal to 20 mol %, less than or equal to than or equal to 18 mol %, less than or equal to than or equal to 16 mol %, less than or equal to than or equal to 14 mol %, less than or equal to than or equal to 12 mol %, less than or equal to than or equal to 10 mol %, or less. In embodiments, the concentration of $Li_2O+Na_2O$ in the glass composition and the colored glass article is greater than or equal to 8 mol % and less than or equal to than or equal to 20 mol %, greater than or equal to 9 mol % and less than or equal to than or equal to 19 mol %, greater than or equal to 10 mol % and less than or equal to than or equal to 18 mol %, greater than or equal to 11 mol % and less than or equal to than or equal to 17 mol %, greater than or equal to 12 mol % and less than or equal to than or equal to 16 mol %, greater than or equal to 13 mol % and less than or equal to than or equal to 15 mol %, greater than or equal to 8 mol % and less than or equal to than or equal to 14 mol %, or any and all sub-ranges formed from any of these endpoints.

In embodiments, the glass compositions and the colored glass articles described herein may further comprise $P_2O_5$. $P_2O_5$ may increase the ion exchange rate of the colored glass articles, allowing the desired strengthening and stress profile to be achieved in a reduced time. In embodiments, the concentration of $P_2O_5$ in the glass composition and the colored glass article may be greater than or equal to 0 mol % and less than or equal to 3 mol %, greater than or equal to 0.1 mol % and less than or equal to 2 mol %, greater or equal to 0 mol % and less than or equal to 1 mol %, or any and all sub-ranges formed from any of these endpoints.

In embodiments, the glass composition and the colored glass article may be substantially free or free of $P_2O_5$.

In embodiments, the difference between $R_2O$ and $Al_2O_3$ (i.e. $R_2O$ (mol %)— $Al_2O_3$ (mol %)) in the glass composition may be adjusted to reduce the formation of non-bridging oxygen, the presence of which may reduce fracture toughness. Decreasing the amount of $R_2O$—$Al_2O_3$ in the glass composition while maintaining the $Al_2O_3$ content at a fixed value produces a lighter yellow color (lower b* value) but improved color stability. For this reason, it may be desirable to utilize a higher $R_2O$ value and lower $Al_2O_3$ content, optionally with an increased $SiO_2$ content, that allows the achievement of a greater yellow colors (greater b*) and improved color stability. In embodiments, $R_2O$—$Al_2O_3$ in the glass composition and the colored glass article may be greater than or equal to −7 mol %, greater than or equal to −6 mol %, greater than or equal to −5 mol %, greater than or equal to −4 mol %, greater than or equal to −3 mol %, greater than or equal to −2 mol %, greater than or equal to −1 mol %, greater than or equal to 0 mol %, greater than or equal to 1 mol %, greater than or equal to 2 mol %, greater than or equal to 3 mol %, or more. In embodiments, $R_2O$—$Al_2O_3$ in the glass composition and the colored glass article may be less than or equal to 4 mol %, less than or equal to 3 mol %, less than or equal to 2 mol %, less than or equal to 1 mol %, less than or equal to 0 mol %, or less. In embodiments, $R_2O$—$Al_2O_3$ in the glass composition and the resultant colored glass article may be greater than or equal to −7 mol % and less than or equal to 4 mol %, greater than or equal to −6 mol % and less than or equal to 3 mol %, greater than or equal to −5 mol % and less than or equal to 2 mol %, greater than or equal to −4 mol % and less than or equal to 1 mol %, greater than or equal to −3 mol % and less than or equal to 0 mol %, greater than or equal to −2 mol % and less than or equal to −1 mol %, or any and all sub-ranges formed from any of these endpoints.

In embodiments, the glass compositions and the colored glass articles described herein may further comprise MgO. MgO lowers the viscosity of the glass compositions, which enhances the formability, the strain point, and the Young's modulus, and may improve ion-exchangeability. However, when too much MgO is added to the glass composition, the diffusivity of sodium and potassium ions in the glass composition decreases which, in turn, adversely impacts the ion-exchange performance (i.e., the ability to ion-exchange) of the colored glass article. MgO promotes color stability of the colored glass article, with the effect less pronounced than that of CaO but greater than ZnO.

In embodiments, the glass composition and the colored glass article may comprise greater than or equal to 0 mol % and less than or equal to 6 mol % MgO, such as greater than or equal to 0 mol % and less than or equal to 5 mol % MgO, or greater than or equal to 2 mol % and less than or equal to 4.5 mol % MgO. In embodiments, the concentration of MgO in the glass composition may be greater than or equal to 0 mol %, greater than or equal to 0.1 mol %, greater than or equal to 0.5 mol %, greater than or equal to 1 mol %, greater than or equal to 2 mol %, or more. In embodiments, the concentration of MgO in the glass composition may be less than or equal to 6 mol %, less than or equal to 5 mol %, less than or equal to 4 mol %, less than or equal to 3 mol %, or less. In embodiments, the concentration of MgO in the glass composition may be greater than or equal to 0 mol % and less than or equal to 6 mol %, greater than 0 mol % and less than or equal to 5 mol %, greater than or equal to 0.1 mol % and less than or equal to 4 mol %, greater than or equal to 0.5 mol % and less than or equal to 3 mol %, greater than or equal to 1 mol % and less than or equal to 2 mol %, or any and all sub-ranges formed from any of these endpoints. In embodiments, the glass composition and the colored glass article may be substantially free or free of MgO.

In embodiments, the glass compositions and the colored glass articles described herein may further comprise CaO. CaO lowers the viscosity of a glass composition, which enhances the formability, the strain point and the Young's modulus, and may improve the ion-exchangeability. However, when too much CaO is added to the glass composition, the diffusivity of sodium and potassium ions in the glass composition decreases which, in turn, adversely impacts the ion-exchange performance (i.e., the ability to ion-exchange) of the resultant glass. CaO promotes color stability in the colored glass article, and is the most preferred among the R'O components for the purposes of promoting color stability In embodiments, the concentration of CaO in the glass composition and the colored glass article may be greater than or equal to 0 mol % and less than or equal to 6 mol %, such as greater than or equal to 0 mol % and less than or equal to 5 mol %, or greater than or equal to 0 mol % and less than or equal to 4.5 mol %. In embodiments, the concentration of CaO in the glass composition and the colored glass article may be greater than or equal to 0 mol %, greater than 0 mol %, greater than or equal to 0.1 mol %, greater than or equal to 0.5 mol %, greater than or equal to 1 mol %, or more. In embodiments, the concentration of CaO in the glass composition and the colored glass article may be less than or equal to 6 mol %, less than or equal to 5 mol %, less than or equal to 4 mol %, less than or equal to 3 mol %, less than or equal to 2 mol %, or less. In embodiments, the concentration of CaO in the glass composition and the resultant colored glass article may be greater than or equal to 0 mol % and less than or equal to 6 mol %, greater than 0 mol % and less than or equal to 5 mol %, greater than or equal to 0.1 mol % and less than or equal to 4 mol %, greater than or equal to 0.5 mol % and less than or equal to 3 mol %, greater than or equal to 1 mol % and less than or equal to 2 mol %, or any and all sub-ranges formed from any of these endpoints. In embodiments, the glass composition and the colored glass article may be substantially free or free of CaO.

In embodiments, the glass compositions and the colored glass articles described herein may further comprise ZnO. ZnO lowers the viscosity of the glass compositions, which enhances the formability, the strain point, and the Young's modulus, and may improve ion-exchangeability. However, when too much ZnO is added to the glass composition, the diffusivity of sodium and potassium ions in the glass composition decreases which, in turn, adversely impacts the ion-exchange performance (i.e., the ability to ion-exchange) of the colored glass article. In contrast to other R'O components, ZnO does not significantly affect the color stability of the colored glass article.

In embodiments, the glass composition and the colored glass article may comprise greater than or equal to 0 mol % and less than or equal to 3 mol % ZnO, such as greater than or equal to 0 mol % and less than or equal to 2 mol % ZnO. In embodiments, the concentration of ZnO in the glass composition may be greater than or equal to 0 mol %, greater than 0 mol %, greater than or equal to 0.1 mol %, greater than or equal to 0.5 mol %, greater than or equal to 1 mol %, greater than or equal to 2 mol %, or more. In embodiments, the concentration of ZnO in the glass composition may be less than or equal to 3 mol %, less than or equal to 2 mol %, less than or equal to 1 mol %, or less. In embodiments, the concentration of ZnO in the glass composition may be greater than or equal to 0 mol % and less than or equal to 3 mol %, greater than 0 mol % and less than or equal to 2 mol %, greater than or equal to 0.1 mol % and less than or equal to 1 mol %, or any and all sub-ranges formed from any of these endpoints. In embodiments, the glass composition and the colored glass article may be substantially free or free of ZnO.

R'O is the sum (in mol %) of CaO, MgO, and ZnO present in the glass composition and the colored glass article (i.e., R'O=CaO (mol %)+MgO (mol %)+ZnO (mol %)). The content of R'O correlates to the color stability of the article, with color stability decreasing with decreasing R'O contents. In embodiments, the concentration of R'O in the glass composition and the colored glass article may be greater than or equal 3 mol %, greater than or equal to 4 mol %, greater than or equal to 5 mol %, greater than or equal to 6 mol %, greater than or equal to 7 mol %, or more. In embodiments, the concentration of R'O in the glass composition and the colored glass article may be less than or equal to 8 mol %, less than or equal to 7 mol %, less than or equal to 6.5 mol %, less than or equal to 6 mol %, less than or equal to 5 mol %, less than or equal to 4 mol %, or less. In embodiments, the concentration of R'O in the glass composition and the colored glass article may be greater than or equal to 3 mol % and less than or equal to 8 mol %, greater than or equal to 3 mol % and less than or equal to 7 mol %, greater than or equal to 4 mol % and less than or equal to 6.5 mol %, greater than or equal to 5 mol % and less than or equal to 6 mol %, or any and all sub-ranged formed from any of these endpoints.

The glass compositions and the colored glass articles described herein may further comprise $Fe_2O_3$, which may help improve colorant retention and color stability. The inclusion of $Fe_2O_3$ improves the color stability without impacting the target color, if included in appropriate amounts. Without wishing to be bound by any particular theory, $Fe_2O_3$ may prevent the conversion of $Ti^{4+}$ to $Ti^{3+}$ in glasses that contain $CeO_2$ during extended exposure to heat, preventing a color shift associated with the change in the oxidation state of titanium. In embodiments, the concentration of $Fe_2O_3$ in the glass composition may be greater than or equal to 0 mol %, greater than 0 mol %, greater than or equal to 0.001 mol %, greater than or equal to 0.01 mol %, or more. In embodiments, the concentration of $Fe_2O_3$ in the glass composition may be less than or equal to 1 mol %, less than or equal to 0.5 mol %, less than or equal to 0.1 mol %, or less. In embodiments, the concentration of $Fe_2O_3$ in the glass composition may be greater than or equal to 0 mol % and less than or equal to 1 mol %, greater than 0 mol % and less than or equal to 0.5 mol %, greater than or equal to 0.001 mol % and less than or equal to 0.1 mol %, greater than or equal to 0.01 mol % and less than or equal to 0.1 mol %, or any and all sub-ranges formed from any of these endpoints. In embodiments, the glass composition and the colored glass article may be substantially free or free of $Fe_2O_3$.

The glass compositions and the colored glass articles described herein may further comprise $SnO_2$. The $SnO_2$ in the glass compositions may be added as a fining agent. $SnO_2$ may also be present in the glass composition as a product of tin electrode decomposition during the melting process. $SnO_2$ contents in the glass composition above 0.05 mol % may negatively impact the color stability of colored glass articles with b* values over 0.5. In embodiments, the concentration of $SnO_2$ in the glass composition and the colored glass article may be greater than or equal to 0 mol %, greater than or equal to 0.01 mol %, or more. In embodiments, the concentration of $SnO_2$ in the glass composition and the colored glass article may be less than or equal to 0.5 mol %, less than or equal to 0.2 mol %, less than or equal to 0.1 mol %, or less. In embodiments, the concentration of $SnO_2$ in the glass composition and the resultant colored glass article may be greater than or equal to 0 mol % and less than or equal to 0.5 mol %, greater than 0 mol % and less than or equal to 0.5 mol %, greater than or equal to 0.001 mol % and less than or equal to 0.5 mol %, greater than or equal to 0.01 mol % and less than or equal to 0.2 mol %, greater than or equal to 0 mol % and less than or equal to 0.05 mol %, or any and all sub-ranges formed from any of these endpoints. In embodiments, the glass composition and the colored glass article may be substantially free or free of $SnO_2$.

The glass compositions and the colored glass articles described herein may further comprise $SO_3$ as a fining agent. $SO_3$ may be utilized as a fining agent without impacting the color or color stability of the colored glass article. In embodiments, the concentration of $SO_3$ in the glass composition and the colored glass article may be greater than or equal to 0 mol % to less than or equal to 0.05 mol %, greater than or equal to 0.001 mol % to less than or equal to 0.05 mol %, or any and all sub-ranges formed from any of these endpoints. In embodiments, the glass composition and the colored glass article may be substantially free or free of $SO_3$.

In embodiments, the glass compositions and the colored glass articles include a colorant package to achieve a desired color. The colorant package includes $CeO_2$, as the sole colorant or in combination with other colorants. In embodiments, the colorant package may include $TiO_2$ in addition to $CeO_2$, with the total amount of $TiO_2+CeO_2$ being sufficiently high to provide the desired color. Additional colorants in the color package may include $WO_3$, $Nb_2O_5$, $Bi_2O_3$, $MoO_3$, $La_2O_3$, and/or combinations thereof. In general, increasing colorant package concentrations are associated with a decrease in color stability of the colored glass article.

The glass composition and the colored glass article comprise greater than 0 mol % $CeO_2$ to provide the desired yellow color. In embodiments, the concentration of $CeO_2$ in the glass composition and the colored glass article may be greater than 0 mol % and less than or equal to 2 mol %, such as greater than or equal to 0.05 mol % and less than or equal to 2 mol %, greater than or equal to 0.4 mol % and less than or equal to 0.8 mol %, greater than or equal to 0.1 mol % and less than or equal to 1.9 mol %, greater than or equal to 0.2 mol % and less than or equal to 1.8 mol %, greater than or equal to 0.3 mol % and less than or equal to 1.7 mol %, greater than or equal to 0.4 mol % and less than or equal to 1.6 mol %, greater than or equal to 0.5 mol % and less than or equal to 1.5 mol %, greater than or equal to 0.6 mol % and less than or equal to 1.4 mol %, greater than or equal to 0.7 mol % and less than or equal to 1.3 mol %, greater than or equal to 0.8 mol % and less than or equal to 1.2 mol %, greater than or equal to 0.9 mol % and less than or equal to 1.1 mol %, greater than or equal to 0.01 mol % and less than or equal to 1 mol %, or any and all sub-ranges formed from any of these endpoints.

The glass composition and the colored glass article may include $TiO_2$ to provide the desired yellow color. In embodiments, the concentration of $TiO_2$ in the glass composition and the colored glass article may be greater than or equal to 0 mol % and less than or equal to 2 mol %, such as greater than or equal to 0.6 mol % and less than or equal to 1.5 mol %, greater than 0 mol % and less than or equal to 2 mol %, greater than or equal to 0.1 mol % and less than or equal to 1.9 mol %, greater than or equal to 0.2 mol % and less than or equal to 1.8 mol %, greater than or equal to 0.3 mol % and less than or equal to 1.7 mol %, greater than or equal to 0.4 mol % and less than or equal to 1.6 mol %, greater than or equal to 0.5 mol % and less than or equal to 1.5 mol %, greater than or equal to 0.6 mol % and less than or equal to 1.4 mol %, greater than or equal to 0.7 mol % and less than or equal to 1.3 mol %, greater than or equal to 0.8 mol % and less than or equal to 1.2 mol %, greater than or equal to 0.9 mol % and less than or equal to 1.1 mol %, greater than or equal to 0.01 mol % and less than or equal to 1 mol %, or any and all sub-ranges formed from any of these endpoints.

The glass composition and the colored glass article include sufficient $TiO_2+CeO_2$ to provide the desired yellow color. In embodiments, the concentration of $TiO_2+CeO_2$ in the glass composition and the colored glass article is greater than or equal to 0.2 mol %, greater than or equal to 0.3 mol %, greater than or equal to 0.4 mol %, greater than or equal to 0.5 mol %, greater than or equal to 0.6 mol %, greater than or equal to 0.7 mol %, greater than or equal to 0.8 mol %, or more. In embodiments, the concentration of $TiO_2+CeO_2$ in the glass composition and the colored glass article may be less than or equal to 3 mol %, less than or equal to 2.5 mol %, less than or equal to 2 mol %, less than or equal to 1.5 mol %, less than or equal to 1 mol %, or less. In embodiments, the concentration of $TiO_2+CeO_2$ in the glass composition and the colored glass article may be greater than or equal to 0.2 mol % and less than or equal to 3 mol %, such as greater than or equal to 0.3 mol % and less than or equal to 2.5 mol %, greater than or equal to 0.4 mol % and less than or equal to 2 mol %, greater than or equal to 0.5 mol % and less than or equal to 2.0 mol %, greater than or equal to 0.5 mol % and less than or equal to 1.5 mol %, greater than or equal to 0.6 mol % and less than or equal to 1 mol %, greater than or equal to 0.7 mol % and less than or equal to 0.9 mol %, greater than or equal to 0.8 mol % and less than or equal to 1.5 mol %, or any and all sub-ranges formed from any of these endpoints.

The glass composition and the colored glass article may comprise $WO_3$ as an additional component in the color package for the purposes of achieving the desired yellow color. In embodiments, the concentration of $WO_3$ in the glass composition and the resultant colored glass article may be greater than or equal to 0 mol % and less than or equal to 1 mol %, such as greater than or equal to 0 mol % and less than or equal to 0.5 mol %, greater than 0 mol % and less than or equal to 0.1 mol %, greater than or equal to 0.001 mol % and less than or equal to 0.01 mol %, and all sub-ranges formed from any of these endpoints. In embodiments, the glass composition and the colored glass article may be substantially free or free of $WO_3$.

The glass composition and the colored glass article may comprise $Nb_2O_5$ as an additional component in the color package for the purposes of achieving the desired yellow color. In embodiments, the concentration of $Nb_2O_5$ in the glass composition and the resultant colored glass article may be greater than or equal to 0 mol % and less than or equal to 1 mol %, such as greater than or equal to 0 mol % and less than or equal to 0.5 mol %, greater than 0 mol % and less than or equal to 0.1 mol %, greater than or equal to 0.001 mol % and less than or equal to 0.01 mol %, and all sub-ranges formed from any of these endpoints. In embodiments, the glass composition and the colored glass article may be substantially free or free of $Nb_2O_5$.

The glass composition and the colored glass article may comprise $Bi_2O_3$ as an additional component in the color package for the purposes of achieving the desired yellow color. In embodiments, the concentration of $Bi_2O_3$ in the glass composition and the resultant colored glass article may be greater than or equal to 0 mol % and less than or equal to 1 mol %, such as greater than or equal to 0 mol % and less than or equal to 0.5 mol %, greater than 0 mol % and less than or equal to 0.1 mol %, greater than or equal to 0.001 mol % and less than or equal to 0.01 mol %, and all sub-ranges formed from any of these endpoints. In embodiments, the glass composition and the colored glass article may be substantially free or free of $Bi_2O_3$.

The glass composition and the colored glass article may comprise $MoO_3$ as an additional component in the color package for the purposes of achieving the desired yellow color. In embodiments, the concentration of $MoO_3$ in the glass composition and the resultant colored glass article may be greater than or equal to 0 mol % and less than or equal to 1 mol %, such as greater than or equal to 0 mol % and less than or equal to 0.5 mol %, greater than 0 mol % and less than or equal to 0.1 mol %, greater than or equal to 0.001 mol % and less than or equal to 0.01 mol %, and all sub-ranges formed from any of these endpoints. In embodiments, the glass composition and the colored glass article may be substantially free or free of $MoO_3$.

The glass composition and the colored glass article may comprise $La_2O_3$ as an additional component in the color package for the purposes of achieving the desired yellow color. In embodiments, the concentration of $La_2O_3$ in the glass composition and the resultant colored glass article may be greater than or equal to 0 mol % and less than or equal to 3 mol %, such as greater than or equal to 0 mol % and less than or equal to 2 mol %, greater than 0 mol % and less than or equal to 1 mol %, greater than or equal to 0.001 mol % and less than or equal to 0.1 mol %, and all sub-ranges formed from any of these endpoints. In embodiments, the glass composition and the colored glass article may be substantially free or free of $La_2O_3$.

The glass compositions described herein may be formed into a colored glass article by any appropriate forming process. In embodiments, the glass compositions are formed into a colored glass article by a roll forming process. The roll forming process may include rolling the glass composition to form a rolled glass article, and then cooling the rolled glass article to form a colored glass article. The glass compositions described herein are especially suitable for roll forming processes due to the increased color stability provided by the glass compositions, enabling increased color uniformity within the colored glass article and across many colored glass articles in a manufacturing run. The color stability of the glass compositions described herein increases the yield of roll forming processes for the production of colored glass articles. In particular, roll forming processes with quenching times in the range of 30 seconds to 200 seconds do not produce color variation for the glass compositions described herein.

The glass compositions described herein may be melted utilizing any appropriate process. The melting temperature has not shown any significant impact on the color of the colored glass article, at least across the range of temperatures from the liquidus temperature of the glass composition up to 1650° C. Where a tin electrode is utilized in the melting process, the melting temperature may impact the color of the colored glass article because higher temperatures produce greater tin electrode wear and higher $SnO_2$ contents in the colored glass article, which reduces the yellow appearance of the colored glass article. The melting atmosphere may impact the color of the colored glass article. A reducing atmosphere, such as that produced by a gas/oxy furnace, produces a colored glass article that appears less yellow (lower b*) than the same glass composition melted in an electric furnace. The material of the melting vessel may also impact the color of the colored glass article, with colored glass articles melted in Rh containing vessels are slightly yellower or darker than the same glass composition melted in Pt vessels due to the leaching of Rh into the glass, but the presence of Rh in the glass was not found to impact the color stability of the colored glass articles.

In embodiments, the process for making a glass article may include heat treating a glass composition described herein at one or more preselected temperatures for one or more preselected times to induce glass homogenization. In embodiments, the heat treatment for making a glass article may include (i) heating a glass composition at a rate of 1-100° C./min to glass homogenization temperature; (ii) maintaining the glass composition at the glass homogenization temperature for a time greater than or equal to 0.25 hour and less than or equal to 4 hours to produce a glass article; and (iii) cooling the formed glass article to room temperature. In embodiments, the glass homogenization temperature may be greater than or equal to 300° C. and less than or equal to 700° C. In embodiments, the formed glass article may be a colored glass article such that additional heat treatment is not necessary.

The colored glass articles formed from the glass compositions described herein may be any suitable thickness, which may vary depending on the particular application of the colored glass article. In embodiments, the colored glass articles may have a thickness greater than or equal to 250 μm and less than or equal to 6 mm, greater than or equal to 250 μm and less than or equal to 4 mm, greater than or equal to 250 μm and less than or equal to 2 mm, greater than or equal to 250 μm and less than or equal to 1 mm, greater than or equal to 250 μm and less than or equal to 750 μm, greater than or equal to 250 μm and less than or equal to 500 μm, greater than or equal to 500 μm and less than or equal to 6 mm, greater than or equal to 500 μm and less than or equal to 4 mm, greater than or equal to 500 μm and less than or equal to 2 mm, greater than or equal to 500 μm and less than or equal to 1 mm, greater than or equal to 500 μm and less than or equal to 750 μm, greater than or equal to 750 μm and less than or equal to 6 mm, greater than or equal to 750 μm and less than or equal to 4 mm, greater than or equal to 750 μm and less than or equal to 2 mm, greater than or equal to 750 μm and less than or equal to 1 mm, greater than or equal to 1 mm and less than or equal to 6 mm, greater than or equal to 1 mm and less than or equal to 4 mm, greater than or equal to 1 mm and less than or equal to 2 mm, greater than or equal to 2 mm and less than or equal to 6 mm, greater than or equal to 2 mm and less than or equal to 4 mm, or even greater than or equal to 4 mm and less than or equal to 6 mm, or any and all sub-ranges formed from any of these endpoints.

As discussed hereinabove, colored glass articles formed from the glass compositions described herein may have an increased fracture toughness such that the colored glass articles are more resistant to damage. In embodiments, the colored glass article may have a Kw fracture toughness as measured by a chevron notch short bar method greater than or equal to 0.7 MPa·m$^{1/2}$, greater than or equal to 0.8 MPa·m$^{1/2}$, greater than or equal to 0.9 MPa·m$^{1/2}$ or even greater than or equal to 1.0 MPa·m$^{1/2}$.

In embodiments, the glass compositions described herein are ion-exchangeable to facilitate strengthening the colored glass article made from the glass compositions. In typical ion-exchange processes, smaller metal ions in the glass compositions are replaced or "exchanged" with larger metal ions of the same valence within a layer that is close to the outer surface of the colored glass article made from the glass composition. The replacement of smaller ions with larger ions creates a compressive stress within the layer of the colored glass article made from the glass composition. In embodiments, the metal ions are monovalent metal ions (e.g., $Li^+$, $Na^+$, $K^+$, and the like), and ion-exchange is accomplished by immersing the glass article made from the glass composition in a bath comprising at least one molten salt of the larger metal ion that is to replace the smaller metal ion in the colored glass article. Alternatively, other monovalent ions such as $Ag^+$, $Tl^+$, $Cu^+$, and the like may be exchanged for monovalent ions. The ion-exchange process or processes that are used to strengthen the colored glass article made from the glass composition may include contacting the colored glass article with an ion-exchange medium. In embodiments, the ion-exchange medium may be a molten salt bath. For example, the ion-exchange process may include, but is not limited to, immersion in a single bath or multiple baths of like or different compositions with optional washing and/or annealing steps between immersions.

Upon exposure to the colored glass article, the ion-exchange solution (e.g., $KNO_3$ and/or $NaNO_3$ molten salt bath) may, according to embodiments, be at a temperature greater than or equal to 350° C. and less than or equal to 500° C., greater than or equal to 360° C. and less than or equal to 450° C., greater than or equal to 370° C. and less than or equal to 440° C., greater than or equal to 360° C. and less than or equal to 420° C., greater than or equal to 370° C. and less than or equal to 400° C., greater than or equal to 375° C. and less than or equal to 475° C., greater than or equal to 400° C. and less than or equal to 500° C., greater than or equal to 410° C. and less than or equal to 490° C., greater than or equal to 420° C. and less than or equal to 480° C., greater than or equal to 430° C. and less than or equal to 470° C., or even greater than or equal to 440° C. and less than or equal to 460° C., or any and all sub-ranges between the foregoing values. In embodiments, the colored glass article may be exposed to the ion-exchange solution for a duration greater than or equal to 2 hours and less than or equal to 24 hours, greater than or equal to 2 hours and less than or equal to 12 hours, greater than or equal to 2 hours and less than or equal to 6 hours, greater than or equal to 8 hours and less than or equal to 24 hours, greater than or equal to 6 hours and less than or equal to 24 hours, greater than or equal to 6 hours and less than or equal to 12 hours, greater than or equal to 8 hours and less than or equal to 24 hours, or even greater than or equal to 8 hours and less than or equal to 12 hours, or any and all sub-ranges formed from any of these endpoints.

In embodiments, a colored glass article made from a glass composition may be ion-exchanged to achieve a depth of compression of greater than or equal to 30 µm, greater than or equal to 40 µm, greater than or equal to 50 µm, greater than or equal to 60 µm, greater than or equal to 70 µm, greater than or equal to 80 µm, greater than or equal to 90 µm, greater than or equal to 100 µm, or more. In embodiments, the colored glass article made from the glass composition may have a thickness "t" and may be ion-exchanged to achieve a depth of compression greater than or equal to 0.1t, greater than or equal to 0.15t, greater than or equal to 0.2t, or more. In embodiments, the colored glass article made from the glass composition described herein may have a thickness "t" and may be ion-exchanged to achieve a depth of compression greater than or equal to 0.1t and less than or equal to 0.3t, greater than or equal to 0.15t and less than or equal to 0.25t, or any and all sub-ranges formed from any of these endpoints.

The development of this surface compression layer is beneficial for achieving a better crack resistance and higher flexural strength compared to non-ion-exchanged materials. The surface compression layer has a higher concentration of the ions exchanged into the colored glass article in comparison to the concentration of the ions exchanged into the colored glass article for the body (i.e., the area not including the surface compression) of the colored glass article. In embodiments, the colored glass article made from the glass composition may have a surface compressive stress after ion-exchange strengthening greater than or equal to 300 MPa, greater than or equal to 400 MPa, greater than or equal to 500 MPa, greater than or equal to 600 MPa, or more. In embodiments, the colored glass article made from the glass composition may have a surface compressive stress after ion-exchange strengthening greater than or equal to 300 MPa and less than or equal to 1.5 GPa, greater than or equal to 300 MPa and less than or equal to 1 GPa, greater than or equal to 400 MPa and less than or equal to 900 MPa, greater than or equal to 500 MPa and less than or equal to 800 MPa, greater than or equal to 600 MPa and less than or equal to 700 MPa, or any and all sub-ranges formed from any of these endpoints.

In embodiments, the colored glass articles made from the glass composition may have a central tension after ion-exchange strengthening greater than or equal to 40 MPa, greater than or equal to 60 MPa, greater than or equal to 80 MPa, greater than or equal to 100 MPa, or more. In embodiments, the colored glass article made from the glass composition may have a central tension after ion-exchange strengthening less than or equal to 250 MPa, less than or equal to 200 MPa, less than or equal to 150 MPa, or less. In embodiments, the colored glass article made from the glass composition may have a central tension after ion-exchange strengthening greater than or equal to 40 MPa and less than or equal to 250 MPa, greater than or equal to 40 MPa and less than or equal to 200 MPa, greater than or equal to 40 MPa and less than or equal to 150 MPa, greater than or equal to 60 MPa and less than or equal to 250 MPa, greater than or equal to 60 MPa and less than or equal to 200 MPa, greater than or equal to 60 MPa and less than or equal to 150 MPa, greater than or equal to 80 MPa and less than or equal to 250 MPa, greater than or equal to 80 MPa and less than or equal to 200 MPa, greater than or equal to 80 MPa and less than or equal to 150 MPa, greater than or equal to 100 MPa and less than or equal to 250 MPa, greater than or equal to 100 MPa and less than or equal to 200 MPa, or even greater than or equal to 100 MPa and less than or equal to 150 MPa, or any and all sub-ranges formed from any of these endpoints. As utilized herein, central tension refers to a maximum central tension value unless otherwise indicated.

As described herein, the glass compositions described herein include a colorant that comprises or consists of transition metal oxides, rare earth oxides, or combinations thereof, to achieve a desired color. In embodiments, a colored glass article may have a transmittance color coordinate in the CIELAB color space, under F2 illumination and a 10° standard observer angle, of $L^*$ greater than or equal to 85 and less than or equal to 98, $a^*$ greater than or equal to −4.0 and less than or equal to 0, and $b^*$ greater than or equal to 0.1 and less than or equal to 12. In embodiments, a colored glass article may have a transmittance color coordinate in the CIELAB color space, under F2 illumination and a 10° standard observer angle, of $L^*$ greater than or equal to 90 and less than or equal to 98, a* greater than or equal to −1.0 and less than or equal to 0, and b* greater than or equal to 1.0 and less than or equal to 6.0. In embodiments, a colored glass article may have a transmittance color coordinate in the CIELAB color space, under F2 illumination and a 10° standard observer angle, of L* greater than or equal to 92 and less than or equal to 98, a* greater than or equal to −1.0 and less than or equal to −0.6, and b* greater than or equal to 3.5 and less than or equal to 5.5.

In embodiments, a colored glass article may have a transmittance color coordinate in the CIELAB color space, as measured under F2 illumination and a 10° standard observer angle, of L* greater than or equal to 85 and less than or equal to 98, such as greater than or equal to 90 and less than or equal to 98, greater than or equal to 92 and less than or equal to 98, greater than or equal to 91 and less than or equal to 96, or any and all sub-ranges formed from any of these endpoints.

In embodiments, a colored glass article may have a transmittance color coordinate in the CIELAB color space, as measured under F2 illumination and a 10° standard observer angle, of a* greater than or equal to −4.0 and less than or equal to 0, greater than or equal to −3.0 and less than or equal to 0, greater than or equal to −2.0 and less than or equal to −0.1, greater than or equal to −1.0 and less than or equal to −0.5, greater than or equal to −1.0 and less than or equal to −0.6, or any and all sub-ranges formed from any of these endpoints.

In embodiments, a colored glass article may have a transmittance color coordinate in the CIELAB color space, as measured under F2 illumination and a 10° standard observer angle, of b* greater than or equal to 0.1 and less than or equal to 12, greater than or equal to 0.5 and less than or equal to 11, greater than or equal to 1.0 and less than or equal to 10.0, greater than or equal to 1.0 and less than or equal to 6.0, greater than or equal to 1.5 and less than or equal to 9.5, greater than or equal to 2.0 and less than or equal to 9.0, greater than or equal to 2.5 and less than or equal to 8.5, greater than or equal to 3.0 and less than or equal to 8.0, greater than or equal to 3.5 and less than or equal to 7.5, greater than or equal to 4.0 and less than or equal to 7.0, greater than or equal to 4.5 and less than or equal to 6.5, greater than or equal to 5.0 and less than or equal to 6.0, greater than or equal to 3.5 and less than or equal to 5.5, or any and all sub-ranges formed from any of these endpoints.

Figure 2:
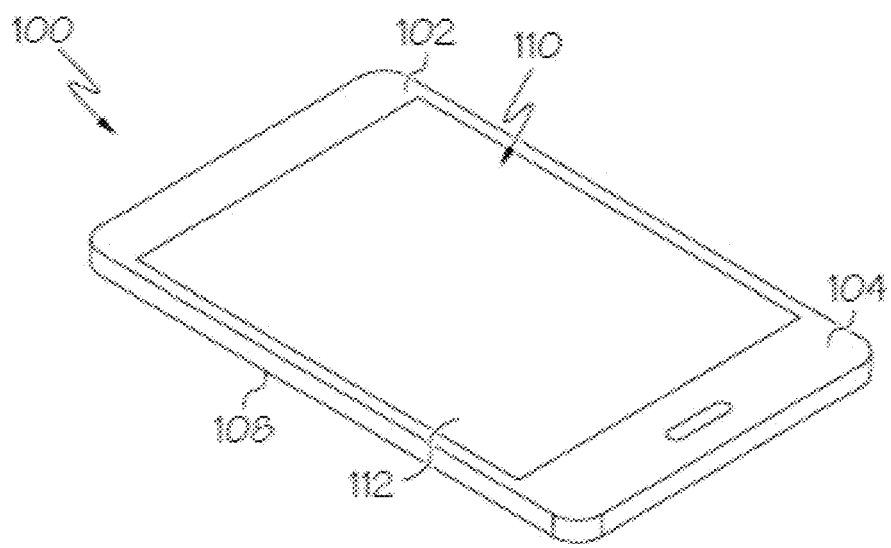
FIG. 2 is a perspective view of the electronic device of FIG. 1.

The colored glass articles described herein may be used for a variety of applications including, for example, back cover applications in consumer or commercial electronic devices such as smartphones, tablet computers, personal computers, ultrabooks, televisions, and cameras. An exemplary article incorporating any of the colored glass articles disclosed herein is shown in FIGS. 1 and 2. Specifically, FIGS. 1 and 2 show a consumer electronic device 100 including a housing 102 having front 104, back 106, and side surfaces 108; electrical components (not shown) that are at least partially inside or entirely within the housing and including at least a controller, a memory, and a display 110 at or adjacent to the front surface of the housing; and a cover substrate 112 at or over the front surface of the housing such that it is over the display. In embodiments, at least a portion of housing 102, such as the back 106, may include any of the colored glass articles disclosed herein.

Examples

In order that various embodiments be more readily understood, reference is made to the following examples, which illustrate various embodiments of the colored glass articles described herein.

Table 1 shows the analyzed compositions of exemplary colored glass articles (in terms of mol %). Examples 422 to 448 in Table I were annealed at 600° C. for 1 hour prior to analysis.

TABLE I

| Example | 1 | 2 | 3 | 4 | 5 | 6 | 7 | 8 | 9 | 10 |
|---|---|---|---|---|---|---|---|---|---|---|
| $SiO_2$ | 61.002 | 60.927 | 60.970 | 61.007 | 61.010 | 60.948 | 61.004 | 61.073 | 61.062 | 61.035 |
| $Al_2O_3$ | 15.489 | 15.485 | 15.422 | 15.381 | 15.380 | 15.350 | 15.307 | 15.296 | 15.263 | 15.237 |
| $B_2O_3$ | 6.051 | 6.055 | 6.050 | 6.048 | 6.007 | 6.008 | 6.006 | 6.011 | 6.013 | 6.015 |
| $P_2O_5$ | 0.000 | 0.000 | 0.000 | 0.000 | 0.000 | 0.000 | 0.000 | 0.000 | 0.000 | 0.000 |
| $Li_2O$ | 9.486 | 9.491 | 9.483 | 9.481 | 9.396 | 9.397 | 9.394 | 9.317 | 9.319 | 9.323 |
| $Na_2O$ | 1.581 | 1.601 | 1.608 | 1.612 | 1.655 | 1.700 | 1.673 | 1.680 | 1.695 | 1.710 |
| $K_2O$ | 0.196 | 0.197 | 0.199 | 0.196 | 0.197 | 0.202 | 0.196 | 0.196 | 0.196 | 0.197 |
| MgO | 1.959 | 1.949 | 1.921 | 1.902 | 1.867 | 1.861 | 1.846 | 1.833 | 1.828 | 1.808 |
| CaO | 4.201 | 4.214 | 4.211 | 4.204 | 4.229 | 4.237 | 4.240 | 4.246 | 4.258 | 4.259 |
| ZnO | 0.000 | 0.000 | 0.000 | 0.001 | 0.001 | 0.001 | 0.001 | 0.001 | 0.000 | 0.000 |
| $SnO_2$ | 0.001 | 0.002 | 0.002 | 0.003 | 0.002 | 0.003 | 0.002 | 0.003 | 0.002 | 0.003 |
| $Fe_2O_3$ | 0.007 | 0.007 | 0.007 | 0.007 | 0.008 | 0.007 | 0.007 | 0.007 | 0.007 | 0.007 |
| $TiO_2$ | 0.016 | 0.048 | 0.088 | 0.108 | 0.172 | 0.199 | 0.223 | 0.233 | 0.248 | 0.281 |
| $CeO_2$ | 0.009 | 0.020 | 0.037 | 0.045 | 0.073 | 0.084 | 0.096 | 0.102 | 0.105 | 0.122 |
| $ZrO_2$ | 0.002 | 0.003 | 0.004 | 0.004 | 0.004 | 0.003 | 0.003 | 0.004 | 0.003 | 0.004 |
| $La_2O_3$ | | | | | | | | | | |
| $SO_3$ | | | | | | | | | | |
| $WO_3$ | | | | | | | | | | |
| $Nb_2O_5$ | | | | | | | | | | |
| $Bi_2O_3$ | | | | | | | | | | |
| $MoO_3$ | | | | | | | | | | |
| $CeO_2 + TiO_2$ | 0.025 | 0.068 | 0.125 | 0.153 | 0.244 | 0.283 | 0.319 | 0.334 | 0.353 | 0.403 |
| $R_2O$ | 11.262 | 11.289 | 11.290 | 11.289 | 11.248 | 11.299 | 11.263 | 11.192 | 11.211 | 11.230 |
| $Li_2O + Na_2O$ | 11.067 | 11.092 | 11.091 | 11.093 | 11.051 | 11.097 | 11.067 | 10.996 | 11.014 | 11.033 |
| $R_2O - Al_2O_3$ | −4.227 | −4.196 | −4.132 | −4.092 | −4.132 | −4.052 | −4.044 | −4.104 | −4.052 | −4.007 |
| R'O | 6.160 | 6.163 | 6.131 | 6.107 | 6.097 | 6.099 | 6.087 | 6.080 | 6.086 | 6.067 |
| Thickness (mm) | 2.400 | 2.400 | 2.400 | 2.400 | 2.400 | 2.400 | 2.400 | 2.400 | 2.400 | 2.400 |

TABLE I-continued

| | | | | | | | | | | |
|---|---|---|---|---|---|---|---|---|---|---|
| L* | 96.82 | 96.83 | 96.86 | 96.87 | 96.88 | 96.87 | 96.87 | 96.84 | 96.87 | 96.85 |
| a* | −0.07 | −0.07 | −0.06 | −0.05 | −0.06 | −0.08 | −0.1 | −0.1 | −0.11 | −0.14 |
| b* | 0.29 | 0.29 | 0.3 | 0.32 | 0.4 | 0.49 | 0.57 | 0.62 | 0.66 | 0.81 |
| Density (g/cm³) | | | | | | | | | | |
| Liquidus Temp. (° C.) | | | | | | | | | | |

| Example | 11 | 12 | 13 | 14 | 15 | 16 | 17 | 18 | 19 | 20 |
|---|---|---|---|---|---|---|---|---|---|---|
| $SiO_2$ | 60.976 | 60.958 | 60.918 | 60.830 | 60.802 | 60.816 | 60.779 | 60.702 | 60.716 | 60.696 |
| $Al_2O_3$ | 15.190 | 15.176 | 15.147 | 15.121 | 15.063 | 14.993 | 14.977 | 14.982 | 14.810 | 14.781 |
| $B_2O_3$ | 6.021 | 6.020 | 6.021 | 6.050 | 6.051 | 6.005 | 6.006 | 6.008 | 6.010 | 6.011 |
| $P_2O_5$ | 0.000 | 0.000 | 0.000 | 0.000 | 0.000 | 0.000 | 0.000 | 0.000 | 0.000 | 0.000 |
| $Li_2O$ | 9.382 | 9.380 | 9.382 | 9.290 | 9.293 | 9.335 | 9.337 | 9.340 | 9.343 | 9.344 |
| $Na_2O$ | 1.716 | 1.729 | 1.742 | 1.786 | 1.814 | 1.829 | 1.843 | 1.850 | 1.893 | 1.908 |
| $K_2O$ | 0.200 | 0.198 | 0.199 | 0.197 | 0.199 | 0.198 | 0.199 | 0.197 | 0.200 | 0.200 |
| MgO | 1.788 | 1.780 | 1.769 | 1.729 | 1.699 | 1.666 | 1.658 | 1.651 | 1.581 | 1.567 |
| CaO | 4.255 | 4.256 | 4.275 | 4.321 | 4.323 | 4.334 | 4.335 | 4.359 | 4.360 | 4.372 |
| ZnO | 0.001 | 0.000 | 0.001 | 0.000 | 0.000 | 0.000 | 0.000 | 0.000 | 0.000 | 0.000 |
| $SnO_2$ | 0.003 | 0.003 | 0.003 | 0.002 | 0.003 | 0.003 | 0.003 | 0.003 | 0.003 | 0.003 |
| $Fe_2O_3$ | 0.007 | 0.007 | 0.007 | 0.007 | 0.006 | 0.006 | 0.006 | 0.006 | 0.006 | 0.006 |
| $TiO_2$ | 0.321 | 0.345 | 0.371 | 0.466 | 0.522 | 0.570 | 0.602 | 0.635 | 0.763 | 0.788 |
| $CeO_2$ | 0.137 | 0.145 | 0.161 | 0.197 | 0.221 | 0.241 | 0.250 | 0.263 | 0.312 | 0.320 |
| $ZrO_2$ | 0.003 | 0.003 | 0.004 | 0.004 | 0.004 | 0.004 | 0.004 | 0.005 | 0.004 | 0.005 |
| $La_2O_3$ | | | | | | | | | | |
| $SO_3$ | | | | | | | | | | |
| $WO_3$ | | | | | | | | | | |
| $Nb_2O_5$ | | | | | | | | | | |
| $Bi_2O_3$ | | | | | | | | | | |
| $MoO_3$ | | | | | | | | | | |
| $CeO_2 + TiO_2$ | 0.458 | 0.489 | 0.532 | 0.663 | 0.743 | 0.811 | 0.853 | 0.897 | 1.075 | 1.107 |
| $R_2O$ | 11.298 | 11.308 | 11.323 | 11.274 | 11.306 | 11.362 | 11.379 | 11.387 | 11.435 | 11.452 |
| $Li_2O + Na_2O$ | 11.098 | 11.110 | 11.124 | 11.076 | 11.106 | 11.164 | 11.180 | 11.190 | 11.235 | 11.252 |
| $R_2O − Al_2O_3$ | −3.893 | −3.868 | −3.824 | −3.848 | −3.757 | −3.630 | −3.597 | −3.595 | −3.375 | −3.329 |
| R'O | 6.044 | 6.036 | 6.046 | 6.050 | 6.022 | 5.999 | 5.993 | 6.010 | 5.941 | 5.939 |
| Thickness (mm) | 2.400 | 2.400 | 2.400 | 2.400 | 2.400 | 2.400 | 2.400 | 2.400 | 2.400 | 2.400 |
| L* | 96.84 | 96.82 | 96.81 | 96.78 | 96.75 | 96.71 | 96.69 | 96.67 | 96.57 | 96.53 |
| a* | −0.18 | −0.2 | −0.23 | −0.33 | −0.39 | −0.47 | −0.51 | −0.56 | −0.74 | −0.79 |
| b* | 0.97 | 1.08 | 1.22 | 1.72 | 2.05 | 2.46 | 2.65 | 2.96 | 3.99 | 4.26 |
| Density (g/cm³) | | | | | | | | | | |
| Liquidus Temp. (° C.) | | | | | | | | | | |

| Example | 21 | 22 | 23 | 24 | 25 | 26 | 27 | 28 | 29 | 30 |
|---|---|---|---|---|---|---|---|---|---|---|
| $SiO_2$ | 60.631 | 60.704 | 60.669 | 60.654 | 60.659 | 60.639 | 60.654 | 60.777 | 60.742 | 60.733 |
| $Al_2O_3$ | 14.741 | 14.741 | 14.749 | 14.758 | 14.738 | 14.739 | 14.725 | 14.647 | 14.654 | 14.635 |
| $B_2O_3$ | 6.012 | 6.041 | 6.042 | 6.040 | 6.040 | 6.040 | 5.987 | 5.986 | 5.987 | 5.986 |
| $P_2O_5$ | 0.000 | 0.000 | 0.000 | 0.000 | 0.000 | 0.000 | 0.000 | 0.000 | 0.000 | 0.000 |
| $Li_2O$ | 9.347 | 9.104 | 9.106 | 9.103 | 9.103 | 9.103 | 9.128 | 9.126 | 9.127 | 9.127 |
| $Na_2O$ | 1.931 | 1.972 | 1.966 | 1.971 | 1.976 | 1.975 | 1.991 | 1.981 | 1.982 | 1.995 |
| $K_2O$ | 0.201 | 0.202 | 0.203 | 0.200 | 0.201 | 0.199 | 0.201 | 0.201 | 0.202 | 0.199 |
| MgO | 1.544 | 1.537 | 1.529 | 1.530 | 1.527 | 1.519 | 1.513 | 1.489 | 1.490 | 1.491 |
| CaO | 4.396 | 4.427 | 4.439 | 4.438 | 4.438 | 4.449 | 4.451 | 4.427 | 4.434 | 4.439 |
| ZnO | 0.000 | 0.000 | 0.000 | 0.000 | 0.000 | 0.000 | 0.000 | 0.000 | 0.001 | 0.000 |
| $SnO_2$ | 0.003 | 0.003 | 0.003 | 0.003 | 0.003 | 0.003 | 0.003 | 0.003 | 0.003 | 0.003 |
| $Fe_2O_3$ | 0.006 | 0.006 | 0.006 | 0.006 | 0.006 | 0.006 | 0.006 | 0.006 | 0.006 | 0.006 |
| $TiO_2$ | 0.844 | 0.902 | 0.918 | 0.926 | 0.934 | 0.950 | 0.958 | 0.966 | 0.979 | 0.991 |
| $CeO_2$ | 0.338 | 0.359 | 0.365 | 0.367 | 0.370 | 0.373 | 0.379 | 0.387 | 0.388 | 0.391 |
| $ZrO_2$ | 0.005 | 0.004 | 0.004 | 0.004 | 0.005 | 0.004 | 0.004 | 0.004 | 0.004 | 0.005 |
| $La_2O_3$ | | | | | | | | | | |
| $SO_3$ | | | | | | | | | | |
| $WO_3$ | | | | | | | | | | |
| $Nb_2O_5$ | | | | | | | | | | |
| $Bi_2O_3$ | | | | | | | | | | |
| $MoO_3$ | | | | | | | | | | |
| $CeO_2 + TiO_2$ | 1.182 | 1.261 | 1.283 | 1.292 | 1.304 | 1.323 | 1.337 | 1.353 | 1.367 | 1.381 |
| $R_2O$ | 11.479 | 11.278 | 11.275 | 11.274 | 11.281 | 11.278 | 11.320 | 11.309 | 11.312 | 11.320 |
| $Li_2O + Na_2O$ | 11.277 | 11.076 | 11.072 | 11.074 | 11.079 | 11.079 | 11.119 | 11.107 | 11.109 | 11.122 |
| $R_2O − Al_2O_3$ | −3.262 | −3.463 | −3.474 | −3.483 | −3.458 | −3.461 | −3.405 | −3.338 | −3.343 | −3.315 |
| R'O | 5.940 | 5.963 | 5.968 | 5.968 | 5.964 | 5.968 | 5.964 | 5.916 | 5.926 | 5.929 |
| Thickness (mm) | 2.400 | 2.400 | 2.400 | 2.400 | 2.400 | 2.400 | 2.400 | 2.400 | 2.400 | 2.400 |

TABLE I-continued

| | | | | | | | | | | |
|---|---|---|---|---|---|---|---|---|---|---|
| L* | 96.44 | 96.37 | 96.36 | 96.34 | 96.3 | 96.32 | 96.3 | 96.27 | 96.26 | 96.24 |
| a* | −0.89 | −0.99 | −1.01 | −1.03 | −1.05 | −1.07 | −1.1 | −1.12 | −1.15 | −1.17 |
| b* | 4.9 | 5.52 | 5.65 | 5.78 | 5.91 | 6.05 | 6.2 | 6.36 | 6.54 | 6.67 |
| Density (g/cm³) | | | | | | | | | | |
| Liquidus Temp. (° C.) | | | | | | | | | | |

| Example | 31 | 32 | 33 | 34 | 35 | 36 | 37 | 38 | 39 | 40 |
|---|---|---|---|---|---|---|---|---|---|---|
| $SiO_2$ | 60.647 | 60.851 | 60.921 | 60.845 | 60.809 | 60.660 | 60.650 | 60.706 | 60.692 | 60.684 |
| $Al_2O_3$ | 14.685 | 14.689 | 14.621 | 14.656 | 14.674 | 14.606 | 14.621 | 14.595 | 14.584 | 14.598 |
| $B_2O_3$ | 5.989 | 6.014 | 6.012 | 6.014 | 6.016 | 6.038 | 6.039 | 6.038 | 6.039 | 6.040 |
| $P_2O_5$ | 0.000 | 0.000 | 0.000 | 0.000 | 0.000 | 0.000 | 0.000 | 0.000 | 0.000 | 0.000 |
| $Li_2O$ | 9.130 | 8.904 | 8.901 | 8.903 | 8.906 | 9.099 | 9.101 | 9.100 | 9.101 | 9.102 |
| $Na_2O$ | 1.995 | 1.991 | 2.005 | 2.013 | 2.009 | 2.015 | 2.006 | 1.995 | 2.006 | 2.008 |
| $K_2O$ | 0.200 | 0.201 | 0.203 | 0.202 | 0.200 | 0.203 | 0.201 | 0.200 | 0.200 | 0.202 |
| MgO | 1.490 | 1.492 | 1.481 | 1.488 | 1.485 | 1.481 | 1.479 | 1.472 | 1.474 | 1.474 |
| CaO | 4.455 | 4.446 | 4.433 | 4.445 | 4.447 | 4.436 | 4.436 | 4.425 | 4.425 | 4.414 |
| ZnO | 0.001 | 0.001 | 0.000 | 0.000 | 0.000 | 0.000 | 0.000 | 0.000 | 0.000 | 0.000 |
| $SnO_2$ | 0.003 | 0.003 | 0.003 | 0.003 | 0.003 | 0.003 | 0.003 | 0.003 | 0.003 | 0.003 |
| $Fe_2O_3$ | 0.006 | 0.006 | 0.006 | 0.006 | 0.006 | 0.006 | 0.006 | 0.006 | 0.006 | 0.006 |
| $TiO_2$ | 0.998 | 1.000 | 1.008 | 1.016 | 1.025 | 1.022 | 1.022 | 1.022 | 1.022 | 1.022 |
| $CeO_2$ | 0.395 | 0.397 | 0.400 | 0.405 | 0.415 | 0.426 | 0.431 | 0.433 | 0.443 | 0.442 |
| $ZrO_2$ | 0.004 | 0.004 | 0.004 | 0.004 | 0.005 | 0.005 | 0.005 | 0.004 | 0.005 | 0.005 |
| $La_2O_3$ | | | | | | | | | | |
| $SO_3$ | | | | | | | | | | |
| $WO_3$ | | | | | | | | | | |
| $Nb_2O_5$ | | | | | | | | | | |
| $Bi_2O_3$ | | | | | | | | | | |
| $MoO_3$ | | | | | | | | | | |
| $CeO_2 + TiO_2$ | 1.393 | 1.397 | 1.408 | 1.421 | 1.440 | 1.448 | 1.453 | 1.455 | 1.465 | 1.464 |
| $R_2O$ | 11.326 | 11.096 | 11.109 | 11.118 | 11.115 | 11.317 | 11.308 | 11.295 | 11.307 | 11.312 |
| $Li_2O + Na_2O$ | 11.126 | 10.895 | 10.906 | 10.916 | 10.915 | 11.114 | 11.107 | 11.095 | 11.107 | 11.110 |
| $R_2O − Al_2O_3$ | −3.359 | −3.593 | −3.512 | −3.538 | −3.560 | −3.289 | −3.313 | −3.299 | −3.277 | −3.286 |
| R'O | 5.946 | 5.939 | 5.914 | 5.933 | 5.932 | 5.917 | 5.915 | 5.897 | 5.899 | 5.888 |
| Thickness (mm) | 2.400 | 2.400 | 2.400 | 2.400 | 2.400 | 2.400 | 2.400 | 2.400 | 2.400 | 2.400 |
| L* | 96.26 | 96.24 | 96.25 | 96.21 | 96.17 | 96.13 | 96.11 | 96.1 | 96.09 | 96.05 |
| a* | −1.18 | −1.18 | −1.2 | −1.22 | −1.27 | −1.31 | −1.32 | −1.33 | −1.35 | −1.37 |
| b* | 6.75 | 6.76 | 6.86 | 7.03 | 7.34 | 7.65 | 7.77 | 7.86 | 7.97 | 8.15 |
| Density (g/cm³) | | | | | | | | | | |
| Liquidus Temp. (° C.) | | | | | | | | | | |

| Example | 41 | 42 | 43 | 44 | 45 | 46 | 47 | 48 | 49 | 50 |
|---|---|---|---|---|---|---|---|---|---|---|
| $SiO_2$ | 60.676 | 60.627 | 60.659 | 60.557 | 60.488 | 60.462 | 60.525 | 60.517 | 60.541 | 60.560 |
| $Al_2O_3$ | 14.658 | 14.671 | 14.658 | 14.704 | 14.707 | 14.707 | 14.666 | 14.666 | 14.647 | 14.641 |
| $B_2O_3$ | 5.992 | 5.992 | 5.992 | 5.995 | 6.001 | 6.002 | 6.000 | 6.000 | 6.000 | 6.000 |
| $P_2O_5$ | 0.000 | 0.000 | 0.000 | 0.000 | 0.000 | 0.000 | 0.000 | 0.000 | 0.000 | 0.000 |
| $Li_2O$ | 8.998 | 8.998 | 8.998 | 9.003 | 9.013 | 9.013 | 9.011 | 9.011 | 9.011 | 9.011 |
| $Na_2O$ | 2.020 | 2.027 | 2.017 | 2.033 | 2.029 | 2.027 | 2.024 | 2.030 | 2.025 | 2.023 |
| $K_2O$ | 0.203 | 0.204 | 0.201 | 0.201 | 0.203 | 0.202 | 0.203 | 0.204 | 0.204 | 0.202 |
| MgO | 1.480 | 1.483 | 1.475 | 1.479 | 1.477 | 1.489 | 1.485 | 1.485 | 1.485 | 1.479 |
| CaO | 4.449 | 4.461 | 4.461 | 4.475 | 4.468 | 4.480 | 4.467 | 4.468 | 4.463 | 4.455 |
| ZnO | 0.000 | 0.000 | 0.000 | 0.000 | 0.000 | 0.000 | 0.000 | 0.000 | 0.000 | 0.000 |
| $SnO_2$ | 0.004 | 0.003 | 0.003 | 0.003 | 0.003 | 0.003 | 0.003 | 0.003 | 0.003 | 0.003 |
| $Fe_2O_3$ | 0.006 | 0.006 | 0.006 | 0.006 | 0.006 | 0.006 | 0.006 | 0.006 | 0.006 | 0.006 |
| $TiO_2$ | 1.033 | 1.041 | 1.041 | 1.042 | 1.043 | 1.043 | 1.043 | 1.043 | 1.043 | 1.043 |
| $CeO_2$ | 0.476 | 0.481 | 0.484 | 0.498 | 0.558 | 0.562 | 0.562 | 0.563 | 0.568 | 0.572 |
| $ZrO_2$ | 0.006 | 0.005 | 0.004 | 0.004 | 0.004 | 0.005 | 0.005 | 0.004 | 0.005 | 0.005 |
| $La_2O_3$ | | | | | | | | | | |
| $SO_3$ | | | | | | | | | | |
| $WO_3$ | | | | | | | | | | |
| $Nb_2O_5$ | | | | | | | | | | |
| $Bi_2O_3$ | | | | | | | | | | |
| $MoO_3$ | | | | | | | | | | |
| $CeO_2 + TiO_2$ | 1.509 | 1.522 | 1.525 | 1.540 | 1.601 | 1.605 | 1.604 | 1.606 | 1.611 | 1.615 |
| $R_2O$ | 11.221 | 11.229 | 11.217 | 11.237 | 11.244 | 11.241 | 11.238 | 11.245 | 11.239 | 11.236 |
| $Li_2O + Na_2O$ | 11.018 | 11.025 | 11.015 | 11.036 | 11.041 | 11.040 | 11.035 | 11.041 | 11.036 | 11.034 |
| $R_2O − Al_2O_3$ | −3.436 | −3.442 | −3.442 | −3.467 | −3.463 | −3.466 | −3.428 | −3.421 | −3.407 | −3.405 |
| R'O | 5.929 | 5.944 | 5.936 | 5.954 | 5.946 | 5.968 | 5.952 | 5.953 | 5.948 | 5.933 |
| Thickness (mm) | 2.400 | 2.400 | 2.400 | 2.400 | 2.400 | 2.400 | 2.400 | 2.400 | 2.400 | 2.400 |

TABLE I-continued

| | | | | | | | | | | |
|---|---|---|---|---|---|---|---|---|---|---|
| L* | 95.95 | 95.92 | 95.9 | 95.86 | 95.6 | 95.6 | 95.46 | 95.44 | 95.46 | 95.46 |
| a* | −1.45 | −1.48 | −1.49 | −1.52 | −1.67 | −1.66 | −1.66 | −1.67 | −1.68 | −1.68 |
| b* | 8.86 | 9.08 | 9.2 | 9.44 | 10.94 | 10.9 | 11.05 | 11.13 | 11.2 | 11.28 |
| Density (g/cm³) | | | | | | | | | | |
| Liquidus Temp. (° C.) | | | | | | | | | | |

| Example | 51 | 52 | 53 | 54 | 55 | 56 | 57 | 58 | 59 | 60 |
|---|---|---|---|---|---|---|---|---|---|---|
| $SiO_2$ | 60.513 | 60.470 | 60.471 | 60.487 | 60.502 | 60.460 | 60.459 | 60.385 | 60.465 | 60.434 |
| $Al_2O_3$ | 14.673 | 14.696 | 14.696 | 14.680 | 14.667 | 14.697 | 14.697 | 14.715 | 14.659 | 14.675 |
| $B_2O_3$ | 6.003 | 6.005 | 6.005 | 6.031 | 6.031 | 6.033 | 6.033 | 6.054 | 6.051 | 6.053 |
| $P_2O_5$ | 0.000 | 0.000 | 0.000 | 0.000 | 0.000 | 0.000 | 0.000 | 0.000 | 0.000 | 0.000 |
| $Li_2O$ | 9.015 | 9.018 | 9.018 | 8.994 | 8.994 | 8.996 | 8.997 | 8.978 | 8.975 | 8.977 |
| $Na_2O$ | 2.018 | 2.016 | 2.014 | 2.023 | 2.020 | 2.029 | 2.025 | 2.029 | 2.028 | 2.023 |
| $K_2O$ | 0.201 | 0.202 | 0.203 | 0.201 | 0.203 | 0.202 | 0.201 | 0.203 | 0.202 | 0.201 |
| MgO | 1.484 | 1.491 | 1.484 | 1.484 | 1.484 | 1.480 | 1.487 | 1.477 | 1.476 | 1.469 |
| CaO | 4.456 | 4.459 | 4.465 | 4.473 | 4.471 | 4.474 | 4.468 | 4.475 | 4.455 | 4.453 |
| ZnO | 0.000 | 0.000 | 0.002 | 0.002 | 0.002 | 0.002 | 0.002 | 0.002 | 0.002 | 0.002 |
| $SnO_2$ | 0.004 | 0.003 | 0.004 | 0.003 | 0.003 | 0.003 | 0.003 | 0.003 | 0.003 | 0.004 |
| $Fe_2O_3$ | 0.006 | 0.006 | 0.006 | 0.006 | 0.006 | 0.006 | 0.006 | 0.006 | 0.006 | 0.006 |
| $TiO_2$ | 1.043 | 1.044 | 1.042 | 1.028 | 1.028 | 1.028 | 1.031 | 1.081 | 1.087 | 1.106 |
| $CeO_2$ | 0.578 | 0.585 | 0.585 | 0.584 | 0.586 | 0.585 | 0.588 | 0.589 | 0.586 | 0.591 |
| $ZrO_2$ | 0.005 | 0.005 | 0.005 | 0.004 | 0.004 | 0.005 | 0.004 | 0.004 | 0.005 | 0.005 |
| $La_2O_3$ | | | | | | | | | | |
| $SO_3$ | | | | | | | | | | |
| $WO_3$ | | | | | | | | | | |
| $Nb_2O_5$ | | | | | | | | | | |
| $Bi_2O_3$ | | | | | | | | | | |
| $MoO_3$ | | | | | | | | | | |
| $CeO_2 + TiO_2$ | 1.622 | 1.629 | 1.627 | 1.611 | 1.614 | 1.613 | 1.619 | 1.670 | 1.674 | 1.698 |
| $R_2O$ | 11.234 | 11.236 | 11.235 | 11.218 | 11.217 | 11.227 | 11.222 | 11.210 | 11.205 | 11.201 |
| $Li_2O + Na_2O$ | 11.033 | 11.034 | 11.032 | 11.017 | 11.014 | 11.025 | 11.021 | 11.006 | 11.003 | 11.000 |
| $R_2O − Al_2O_3$ | −3.439 | −3.461 | −3.461 | −3.462 | −3.450 | −3.469 | −3.475 | −3.505 | −3.454 | −3.474 |
| R'O | 5.940 | 5.950 | 5.950 | 5.959 | 5.956 | 5.956 | 5.956 | 5.954 | 5.933 | 5.924 |
| Thickness (mm) | 2.400 | 2.400 | 2.400 | 2.400 | 2.400 | 2.400 | 2.400 | 2.400 | 2.400 | 2.400 |
| L* | 95.38 | 95.38 | 95.45 | 95.4 | 95.43 | 95.44 | 95.42 | 95.4 | 95.39 | 95.38 |
| a* | −1.7 | −1.7 | −1.72 | −1.72 | −1.73 | −1.73 | −1.73 | −1.79 | −1.8 | −1.83 |
| b* | 11.45 | 11.52 | 11.59 | 11.74 | 11.76 | 11.76 | 11.8 | 12.13 | 12.24 | 12.42 |
| Density (g/cm³) | | | | | | | | | | |
| Liquidus Temp. (° C.) | | | | | | | | | | |

| Example | 61 | 62 | 63 | 64 | 65 | 66 | 67 | 68 | 69 | 70 |
|---|---|---|---|---|---|---|---|---|---|---|
| $SiO_2$ | 60.414 | 60.401 | 60.373 | 60.387 | 60.323 | 60.339 | 60.319 | 60.321 | 60.332 | 60.332 |
| $Al_2O_3$ | 14.673 | 14.662 | 14.685 | 14.665 | 14.700 | 14.681 | 14.696 | 14.696 | 14.696 | 14.701 |
| $B_2O_3$ | 6.052 | 6.053 | 6.054 | 6.054 | 6.055 | 5.988 | 5.989 | 5.989 | 5.989 | 5.988 |
| $P_2O_5$ | 0.000 | 0.000 | 0.000 | 0.000 | 0.000 | 0.000 | 0.000 | 0.000 | 0.000 | 0.000 |
| $Li_2O$ | 8.976 | 8.977 | 8.979 | 8.979 | 8.981 | 9.020 | 9.022 | 9.021 | 9.022 | 9.020 |
| $Na_2O$ | 2.026 | 2.022 | 2.028 | 2.023 | 2.031 | 2.026 | 2.023 | 2.023 | 2.017 | 2.021 |
| $K_2O$ | 0.200 | 0.202 | 0.202 | 0.201 | 0.202 | 0.203 | 0.202 | 0.204 | 0.202 | 0.203 |
| MgO | 1.484 | 1.480 | 1.472 | 1.465 | 1.468 | 1.478 | 1.480 | 1.478 | 1.476 | 1.473 |
| CaO | 4.470 | 4.461 | 4.455 | 4.464 | 4.474 | 4.487 | 4.484 | 4.485 | 4.484 | 4.488 |
| ZnO | 0.002 | 0.002 | 0.002 | 0.002 | 0.000 | 0.002 | 0.000 | 0.002 | 0.000 | 0.002 |
| $SnO_2$ | 0.004 | 0.004 | 0.003 | 0.004 | 0.003 | 0.004 | 0.004 | 0.003 | 0.003 | 0.004 |
| $Fe_2O_3$ | 0.006 | 0.006 | 0.006 | 0.006 | 0.006 | 0.006 | 0.006 | 0.006 | 0.006 | 0.006 |
| $TiO_2$ | 1.101 | 1.135 | 1.144 | 1.152 | 1.158 | 1.171 | 1.174 | 1.171 | 1.174 | 1.171 |
| $CeO_2$ | 0.587 | 0.591 | 0.593 | 0.594 | 0.594 | 0.592 | 0.597 | 0.596 | 0.594 | 0.586 |
| $ZrO_2$ | 0.005 | 0.004 | 0.005 | 0.005 | 0.005 | 0.005 | 0.005 | 0.005 | 0.005 | 0.005 |
| $La_2O_3$ | | | | | | | | | | |
| $SO_3$ | | | | | | | | | | |
| $WO_3$ | | | | | | | | | | |
| $Nb_2O_5$ | | | | | | | | | | |
| $Bi_2O_3$ | | | | | | | | | | |
| $MoO_3$ | | | | | | | | | | |
| $CeO_2 + TiO_2$ | 1.688 | 1.727 | 1.737 | 1.746 | 1.751 | 1.763 | 1.771 | 1.767 | 1.768 | 1.757 |
| $R_2O$ | 11.202 | 11.201 | 11.209 | 11.203 | 11.214 | 11.249 | 11.247 | 11.249 | 11.241 | 11.245 |
| $Li_2O + Na_2O$ | 11.002 | 10.999 | 11.007 | 11.002 | 11.012 | 11.046 | 11.045 | 11.045 | 11.039 | 11.042 |
| $R_2O − Al_2O_3$ | −3.471 | −3.462 | −3.476 | −3.462 | −3.486 | −3.432 | −3.449 | −3.447 | −3.456 | −3.456 |

TABLE I-continued

| | | | | | | | | | | |
|---|---|---|---|---|---|---|---|---|---|---|
| R'O | 5.956 | 5.942 | 5.928 | 5.930 | 5.942 | 5.966 | 5.965 | 5.965 | 5.960 | 5.963 |
| Thickness (mm) | 2.400 | 2.400 | 2.400 | 2.400 | 2.400 | 2.400 | 2.400 | 2.400 | 2.400 | 2.400 |
| L* | 95.35 | 95.29 | 95.28 | 95.27 | 95.27 | 95.27 | 95.27 | 95.27 | 95.24 | 95.3 |
| a* | −1.84 | −1.91 | −1.92 | −1.93 | −1.93 | −1.97 | −1.97 | −1.96 | −1.96 | −1.95 |
| b* | 12.51 | 13.06 | 13.2 | 13.27 | 13.21 | 13.47 | 13.49 | 13.47 | 13.49 | 13.25 |
| Density (g/cm$^3$) | | | | | | | | | | |
| Liquidus Temp. (° C.) | | | | | | | | | | |

| Example | 71 | 72 | 73 | 74 | 75 | 76 | 77 | 78 | 79 | 80 |
|---|---|---|---|---|---|---|---|---|---|---|
| SiO$_2$ | 60.295 | 60.290 | 60.285 | 60.395 | 60.350 | 60.436 | 60.382 | 60.449 | 60.481 | 60.565 |
| Al$_2$O$_3$ | 14.728 | 14.745 | 14.743 | 14.679 | 14.719 | 14.678 | 14.724 | 14.692 | 14.681 | 14.678 |
| B$_2$O$_3$ | 5.979 | 5.979 | 5.978 | 5.975 | 5.976 | 5.972 | 5.970 | 5.968 | 5.968 | 5.967 |
| P$_2$O$_5$ | 0.000 | 0.000 | 0.000 | 0.000 | 0.000 | 0.000 | 0.000 | 0.000 | 0.000 | 0.000 |
| Li$_2$O | 9.021 | 9.020 | 9.019 | 9.015 | 9.016 | 9.011 | 9.011 | 9.007 | 9.005 | 9.003 |
| Na$_2$O | 2.028 | 2.023 | 2.025 | 2.014 | 2.025 | 2.034 | 2.032 | 2.020 | 2.021 | 2.020 |
| K$_2$O | 0.202 | 0.202 | 0.201 | 0.203 | 0.202 | 0.203 | 0.201 | 0.202 | 0.202 | 0.199 |
| MgO | 1.480 | 1.477 | 1.482 | 1.476 | 1.472 | 1.467 | 1.471 | 1.473 | 1.478 | 1.472 |
| CaO | 4.496 | 4.507 | 4.506 | 4.492 | 4.492 | 4.479 | 4.491 | 4.477 | 4.484 | 4.463 |
| ZnO | 0.000 | 0.000 | 0.000 | 0.000 | 0.002 | 0.000 | 0.000 | 0.000 | 0.001 | 0.000 |
| SnO$_2$ | 0.004 | 0.004 | 0.004 | 0.004 | 0.004 | 0.004 | 0.004 | 0.003 | 0.003 | 0.003 |
| Fe$_2$O$_3$ | 0.006 | 0.006 | 0.006 | 0.006 | 0.006 | 0.006 | 0.006 | 0.006 | 0.006 | 0.006 |
| TiO$_2$ | 1.174 | 1.173 | 1.181 | 1.181 | 1.182 | 1.180 | 1.188 | 1.188 | 1.172 | 1.131 |
| CeO$_2$ | 0.583 | 0.570 | 0.565 | 0.556 | 0.550 | 0.525 | 0.514 | 0.506 | 0.493 | 0.488 |
| ZrO$_2$ | 0.005 | 0.005 | 0.005 | 0.004 | 0.004 | 0.005 | 0.004 | 0.005 | 0.005 | 0.005 |
| La$_2$O$_3$ | | | | | | | | | | |
| SO$_3$ | | | | | | | | | | |
| WO$_3$ | | | | | | | | | | |
| Nb$_2$O$_5$ | | | | | | | | | | |
| Bi$_2$O$_3$ | | | | | | | | | | |
| MoO$_3$ | | | | | | | | | | |
| CeO$_2$ + TiO$_2$ | 1.756 | 1.744 | 1.747 | 1.737 | 1.732 | 1.705 | 1.702 | 1.694 | 1.665 | 1.619 |
| R$_2$O | 11.251 | 11.245 | 11.245 | 11.231 | 11.243 | 11.248 | 11.244 | 11.230 | 11.227 | 11.222 |
| Li$_2$O + Na$_2$O | 11.049 | 11.043 | 11.044 | 11.028 | 11.041 | 11.045 | 11.043 | 11.028 | 11.025 | 11.023 |
| R$_2$O − Al$_2$O$_3$ | −3.476 | −3.500 | −3.498 | −3.448 | −3.476 | −3.430 | −3.480 | −3.462 | −3.454 | −3.456 |
| R'O | 5.976 | 5.984 | 5.988 | 5.969 | 5.966 | 5.946 | 5.961 | 5.950 | 5.963 | 5.936 |
| Thickness (mm) | 2.400 | 2.400 | 2.400 | 2.400 | 2.400 | 2.400 | 2.400 | 2.400 | 2.400 | 2.400 |
| L* | 95.33 | 95.36 | 95.41 | 95.42 | 95.45 | 95.57 | 95.64 | 95.66 | 95.65 | 95.81 |
| a* | −1.93 | −1.91 | −1.9 | −1.89 | −1.88 | −1.8 | −1.78 | −1.75 | −1.7 | −1.58 |
| b* | 13.03 | 12.84 | 12.63 | 12.52 | 12.4 | 11.57 | 11.3 | 11.03 | 10.61 | 9.76 |
| Density (g/cm$^3$) | | | | | | | | | | |
| Liquidus Temp. (° C.) | | | | | | | | | | |

| Example | 81 | 82 | 83 | 84 | 85 | 86 | 87 | 88 | 89 | 90 |
|---|---|---|---|---|---|---|---|---|---|---|
| SiO$_2$ | 60.576 | 60.566 | 60.579 | 60.603 | 60.735 | 60.761 | 60.731 | 60.660 | 60.607 | 60.663 |
| Al$_2$O$_3$ | 14.676 | 14.702 | 14.695 | 14.690 | 14.628 | 14.622 | 14.646 | 14.681 | 14.746 | 14.719 |
| B$_2$O$_3$ | 5.966 | 5.966 | 6.031 | 6.026 | 6.024 | 6.024 | 6.027 | 6.028 | 6.006 | 6.005 |
| P$_2$O$_5$ | 0.000 | 0.000 | 0.000 | 0.000 | 0.000 | 0.000 | 0.000 | 0.000 | 0.000 | 0.000 |
| Li$_2$O | 9.001 | 9.002 | 9.023 | 9.016 | 9.013 | 9.013 | 9.016 | 9.018 | 8.984 | 8.983 |
| Na$_2$O | 2.013 | 2.026 | 2.010 | 2.016 | 2.015 | 2.008 | 2.017 | 2.008 | 2.018 | 2.006 |
| K$_2$O | 0.201 | 0.199 | 0.202 | 0.200 | 0.199 | 0.200 | 0.200 | 0.199 | 0.199 | 0.201 |
| MgO | 1.483 | 1.487 | 1.487 | 1.488 | 1.470 | 1.475 | 1.474 | 1.499 | 1.503 | 1.505 |
| CaO | 4.474 | 4.474 | 4.474 | 4.468 | 4.452 | 4.446 | 4.448 | 4.465 | 4.499 | 4.476 |
| ZnO | 0.000 | 0.000 | 0.000 | 0.002 | 0.002 | 0.000 | 0.000 | 0.002 | 0.000 | 0.000 |
| SnO$_2$ | 0.003 | 0.003 | 0.003 | 0.004 | 0.003 | 0.003 | 0.004 | 0.003 | 0.003 | 0.003 |
| Fe$_2$O$_3$ | 0.006 | 0.006 | 0.006 | 0.006 | 0.006 | 0.006 | 0.006 | 0.006 | 0.006 | 0.006 |
| TiO$_2$ | 1.106 | 1.074 | 0.985 | 0.974 | 0.938 | 0.920 | 0.911 | 0.904 | 0.906 | 0.905 |
| CeO$_2$ | 0.488 | 0.489 | 0.501 | 0.501 | 0.509 | 0.515 | 0.516 | 0.522 | 0.521 | 0.524 |
| ZrO$_2$ | 0.005 | 0.005 | 0.005 | 0.005 | 0.005 | 0.005 | 0.004 | 0.006 | 0.004 | 0.004 |
| La$_2$O$_3$ | | | | | | | | | | |
| SO$_3$ | | | | | | | | | | |
| WO$_3$ | | | | | | | | | | |
| Nb$_2$O$_5$ | | | | | | | | | | |
| Bi$_2$O$_3$ | | | | | | | | | | |
| MoO$_3$ | | | | | | | | | | |
| CeO$_2$ + TiO$_2$ | 1.594 | 1.563 | 1.486 | 1.475 | 1.447 | 1.435 | 1.427 | 1.426 | 1.426 | 1.429 |
| R$_2$O | 11.215 | 11.227 | 11.235 | 11.233 | 11.227 | 11.222 | 11.233 | 11.226 | 11.200 | 11.190 |
| Li$_2$O + Na$_2$O | 11.014 | 11.028 | 11.033 | 11.032 | 11.028 | 11.021 | 11.034 | 11.027 | 11.001 | 10.989 |

TABLE I-continued

| | | | | | | | | | | |
|---|---|---|---|---|---|---|---|---|---|---|
| $R_2O - Al_2O_3$ | −3.461 | −3.475 | −3.461 | −3.457 | −3.402 | −3.400 | −3.413 | −3.455 | −3.546 | −3.529 |
| R'O | 5.958 | 5.961 | 5.961 | 5.958 | 5.924 | 5.922 | 5.922 | 5.965 | 6.002 | 5.981 |
| Thickness (mm) | 2.400 | 2.400 | 2.400 | 2.400 | 2.400 | 2.400 | 2.400 | 2.400 | 2.400 | 2.400 |
| L* | 95.81 | 95.81 | 95.86 | 95.86 | 95.84 | 95.82 | 95.82 | 95.84 | 95.84 | 95.83 |
| a* | −1.59 | −1.53 | −1.49 | −1.47 | −1.53 | −1.42 | −1.41 | −1.42 | −1.42 | −1.41 |
| b* | 9.81 | 9.45 | 9.28 | 9.2 | 9.44 | 9.04 | 8.99 | 9.03 | 9.07 | 9.03 |
| Density (g/cm³) | | | | | | | | | | |
| Liquidus Temp. (° C.) | | | | | | | | | | |

| Example | 91 | 92 | 93 | 94 | 95 | 96 | 97 | 98 | 99 | 100 |
|---|---|---|---|---|---|---|---|---|---|---|
| $SiO_2$ | 60.726 | 60.601 | 60.720 | 60.707 | 60.668 | 60.678 | 60.673 | 60.696 | 60.659 | 60.668 |
| $Al_2O_3$ | 14.705 | 14.758 | 14.696 | 14.703 | 14.697 | 14.703 | 14.703 | 14.666 | 14.706 | 14.704 |
| $B_2O_3$ | 6.005 | 6.008 | 6.006 | 6.006 | 6.013 | 6.013 | 6.013 | 6.011 | 6.014 | 6.013 |
| $P_2O_5$ | 0.000 | 0.000 | 0.000 | 0.000 | 0.000 | 0.000 | 0.000 | 0.000 | 0.000 | 0.000 |
| $Li_2O$ | 8.982 | 8.987 | 8.985 | 8.985 | 9.024 | 9.024 | 9.024 | 9.021 | 9.026 | 9.024 |
| $Na_2O$ | 2.009 | 2.018 | 2.010 | 2.008 | 2.016 | 2.009 | 2.013 | 2.009 | 2.005 | 2.008 |
| $K_2O$ | 0.200 | 0.199 | 0.199 | 0.200 | 0.198 | 0.198 | 0.201 | 0.199 | 0.199 | 0.199 |
| MgO | 1.498 | 1.519 | 1.508 | 1.509 | 1.509 | 1.511 | 1.506 | 1.550 | 1.527 | 1.527 |
| CaO | 4.441 | 4.469 | 4.442 | 4.448 | 4.440 | 4.440 | 4.440 | 4.427 | 4.418 | 4.417 |
| ZnO | 0.000 | 0.002 | 0.000 | 0.002 | 0.000 | 0.000 | 0.000 | 0.000 | 0.000 | 0.000 |
| $SnO_2$ | 0.003 | 0.003 | 0.003 | 0.003 | 0.003 | 0.003 | 0.003 | 0.004 | 0.003 | 0.004 |
| $Fe_2O_3$ | 0.006 | 0.006 | 0.006 | 0.006 | 0.006 | 0.006 | 0.006 | 0.006 | 0.006 | 0.006 |
| $TiO_2$ | 0.902 | 0.901 | 0.896 | 0.894 | 0.888 | 0.887 | 0.884 | 0.883 | 0.900 | 0.897 |
| $CeO_2$ | 0.519 | 0.524 | 0.524 | 0.525 | 0.532 | 0.524 | 0.528 | 0.522 | 0.533 | 0.528 |
| $ZrO_2$ | 0.004 | 0.004 | 0.004 | 0.005 | 0.005 | 0.005 | 0.004 | 0.004 | 0.005 | 0.005 |
| $La_2O_3$ | | | | | | | | | | |
| $SO_3$ | | | | | | | | | | |
| $WO_3$ | | | | | | | | | | |
| $Nb_2O_5$ | | | | | | | | | | |
| $Bi_2O_3$ | | | | | | | | | | |
| $MoO_3$ | | | | | | | | | | |
| $CeO_2 + TiO_2$ | 1.421 | 1.426 | 1.420 | 1.418 | 1.420 | 1.411 | 1.411 | 1.406 | 1.433 | 1.425 |
| $R_2O$ | 11.191 | 11.205 | 11.193 | 11.193 | 11.238 | 11.230 | 11.238 | 11.229 | 11.229 | 11.231 |
| $Li_2O + Na_2O$ | 10.991 | 11.006 | 10.994 | 10.993 | 11.040 | 11.032 | 11.037 | 11.030 | 11.030 | 11.032 |
| $R_2O - Al_2O_3$ | −3.514 | −3.553 | −3.503 | −3.510 | −3.459 | −3.472 | −3.466 | −3.437 | −3.476 | −3.473 |
| R'O | 5.939 | 5.990 | 5.950 | 5.959 | 5.949 | 5.951 | 5.946 | 5.978 | 5.945 | 5.944 |
| Thickness (mm) | 2.400 | 2.400 | 2.400 | 2.400 | 2.400 | 2.400 | 2.400 | 2.400 | 2.400 | 2.400 |
| L* | 95.85 | 95.84 | 95.84 | 95.85 | 95.85 | 95.87 | 95.85 | 95.87 | 95.85 | 95.87 |
| a* | −1.41 | −1.41 | −1.41 | −1.41 | −1.4 | −1.4 | −1.4 | −1.39 | −1.4 | −1.39 |
| b* | 9.01 | 9.03 | 8.99 | 9.02 | 8.97 | 8.93 | 8.93 | 8.89 | 8.93 | 8.84 |
| Density (g/cm³) | | | | | | | | | | |
| Liquidus Temp. (° C.) | | | | | | | | | | |

| Example | 101 | 102 | 103 | 104 | 105 | 106 | 107 | 108 | 109 | 110 |
|---|---|---|---|---|---|---|---|---|---|---|
| $SiO_2$ | 60.669 | 60.684 | 60.652 | 60.705 | 60.708 | 60.663 | 60.672 | 60.718 | 60.695 | 60.765 |
| $Al_2O_3$ | 14.704 | 14.681 | 14.707 | 14.679 | 14.679 | 14.692 | 14.728 | 14.714 | 14.720 | 14.679 |
| $B_2O_3$ | 6.014 | 6.021 | 6.022 | 6.018 | 6.018 | 6.018 | 6.007 | 6.006 | 6.006 | 6.004 |
| $P_2O_5$ | 0.000 | 0.000 | 0.000 | 0.000 | 0.000 | 0.000 | 0.000 | 0.000 | 0.000 | 0.000 |
| $Li_2O$ | 9.025 | 9.022 | 9.023 | 9.017 | 9.017 | 9.017 | 8.963 | 8.962 | 8.962 | 8.960 |
| $Na_2O$ | 2.010 | 2.008 | 2.015 | 2.005 | 2.003 | 2.003 | 2.006 | 2.007 | 2.010 | 2.007 |
| $K_2O$ | 0.199 | 0.199 | 0.198 | 0.199 | 0.198 | 0.198 | 0.199 | 0.197 | 0.200 | 0.199 |
| MgO | 1.525 | 1.533 | 1.536 | 1.541 | 1.538 | 1.554 | 1.550 | 1.543 | 1.540 | 1.538 |
| CaO | 4.418 | 4.416 | 4.417 | 4.409 | 4.414 | 4.421 | 4.431 | 4.419 | 4.430 | 4.418 |
| ZnO | 0.000 | 0.000 | 0.000 | 0.001 | 0.000 | 0.002 | 0.000 | 0.000 | 0.000 | 0.000 |
| $SnO_2$ | 0.004 | 0.003 | 0.003 | 0.004 | 0.003 | 0.004 | 0.004 | 0.004 | 0.003 | 0.003 |
| $Fe_2O_3$ | 0.006 | 0.006 | 0.006 | 0.006 | 0.006 | 0.006 | 0.006 | 0.006 | 0.006 | 0.006 |
| $TiO_2$ | 0.894 | 0.893 | 0.893 | 0.889 | 0.888 | 0.894 | 0.897 | 0.889 | 0.897 | 0.891 |
| $CeO_2$ | 0.528 | 0.527 | 0.524 | 0.523 | 0.525 | 0.524 | 0.533 | 0.530 | 0.527 | 0.525 |
| $ZrO_2$ | 0.004 | 0.004 | 0.004 | 0.005 | 0.004 | 0.005 | 0.005 | 0.004 | 0.004 | 0.004 |
| $La_2O_3$ | | | | | | | | | | |
| $SO_3$ | | | | | | | | | | |
| $WO_3$ | | | | | | | | | | |
| $Nb_2O_5$ | | | | | | | | | | |
| $Bi_2O_3$ | | | | | | | | | | |
| $MoO_3$ | | | | | | | | | | |
| $CeO_2 + TiO_2$ | 1.422 | 1.420 | 1.417 | 1.411 | 1.413 | 1.418 | 1.430 | 1.419 | 1.424 | 1.416 |
| $R_2O$ | 11.234 | 11.230 | 11.235 | 11.221 | 11.218 | 11.218 | 11.168 | 11.167 | 11.172 | 11.166 |
| $Li_2O + Na_2O$ | 11.035 | 11.031 | 11.038 | 11.022 | 11.020 | 11.021 | 10.970 | 10.970 | 10.972 | 10.967 |
| $R_2O - Al_2O_3$ | −3.470 | −3.451 | −3.472 | −3.458 | −3.460 | −3.474 | −3.560 | −3.547 | −3.548 | −3.513 |

TABLE I-continued

| | | | | | | | | | | |
|---|---|---|---|---|---|---|---|---|---|---|
| R'O | 5.943 | 5.949 | 5.953 | 5.952 | 5.952 | 5.976 | 5.981 | 5.962 | 5.970 | 5.956 |
| Thickness (mm) | 2.400 | 2.400 | 2.400 | 2.400 | 2.400 | 2.400 | 2.400 | 2.400 | 2.400 | 2.400 |
| L* | 95.87 | 95.87 | 95.87 | 95.85 | 95.87 | 95.86 | 95.87 | 95.88 | 95.87 | 95.81 |
| a* | −1.38 | −1.38 | −1.38 | −1.38 | −1.38 | −1.38 | −1.38 | −1.38 | −1.38 | −1.37 |
| b* | 8.83 | 8.81 | 8.83 | 8.82 | 8.84 | 8.82 | 8.79 | 8.78 | 8.81 | 8.8 |
| Density (g/cm³) | | | | | | | | | | |
| Liquidus Temp. (° C.) | | | | | | | | | | |

| Example | 111 | 112 | 113 | 114 | 115 | 116 | 117 | 118 | 119 | 120 |
|---|---|---|---|---|---|---|---|---|---|---|
| $SiO_2$ | 60.799 | 60.679 | 60.695 | 60.729 | 60.761 | 60.660 | 60.675 | 60.669 | 60.706 | 60.775 |
| $Al_2O_3$ | 14.665 | 14.730 | 14.714 | 14.693 | 14.672 | 14.721 | 14.707 | 14.688 | 14.671 | 14.680 |
| $B_2O_3$ | 6.004 | 6.007 | 6.015 | 6.014 | 6.013 | 6.015 | 6.015 | 6.010 | 6.008 | 5.974 |
| $P_2O_5$ | 0.000 | 0.000 | 0.000 | 0.000 | 0.000 | 0.000 | 0.000 | 0.000 | 0.000 | 0.000 |
| $Li_2O$ | 8.959 | 8.964 | 8.962 | 8.961 | 8.960 | 8.963 | 8.962 | 9.041 | 9.037 | 9.000 |
| $Na_2O$ | 2.007 | 2.008 | 2.010 | 2.002 | 2.009 | 2.016 | 2.010 | 2.002 | 2.004 | 2.006 |
| $K_2O$ | 0.199 | 0.199 | 0.199 | 0.199 | 0.198 | 0.199 | 0.199 | 0.200 | 0.198 | 0.199 |
| MgO | 1.535 | 1.546 | 1.551 | 1.552 | 1.548 | 1.558 | 1.551 | 1.536 | 1.525 | 1.504 |
| CaO | 4.406 | 4.425 | 4.417 | 4.413 | 4.406 | 4.430 | 4.442 | 4.426 | 4.425 | 4.439 |
| ZnO | 0.000 | 0.002 | 0.002 | 0.002 | 0.000 | 0.000 | 0.000 | 0.000 | 0.000 | 0.000 |
| $SnO_2$ | 0.003 | 0.003 | 0.003 | 0.003 | 0.004 | 0.003 | 0.004 | 0.003 | 0.003 | 0.004 |
| $Fe_2O_3$ | 0.006 | 0.006 | 0.006 | 0.006 | 0.006 | 0.006 | 0.006 | 0.006 | 0.006 | 0.006 |
| $TiO_2$ | 0.889 | 0.891 | 0.890 | 0.889 | 0.889 | 0.889 | 0.889 | 0.880 | 0.880 | 0.888 |
| $CeO_2$ | 0.524 | 0.534 | 0.531 | 0.532 | 0.530 | 0.534 | 0.535 | 0.535 | 0.533 | 0.521 |
| $ZrO_2$ | 0.004 | 0.005 | 0.005 | 0.004 | 0.004 | 0.005 | 0.005 | 0.004 | 0.004 | 0.005 |
| $La_2O_3$ | | | | | | | | | | |
| $SO_3$ | | | | | | | | | | |
| $WO_3$ | | | | | | | | | | |
| $Nb_2O_5$ | | | | | | | | | | |
| $Bi_2O_3$ | | | | | | | | | | |
| $MoO_3$ | | | | | | | | | | |
| $CeO_2 + TiO_2$ | 1.413 | 1.425 | 1.422 | 1.422 | 1.419 | 1.423 | 1.424 | 1.415 | 1.412 | 1.409 |
| $R_2O$ | 11.165 | 11.171 | 11.171 | 11.162 | 11.166 | 11.178 | 11.171 | 11.243 | 11.239 | 11.204 |
| $Li_2O + Na_2O$ | 10.966 | 10.972 | 10.972 | 10.963 | 10.968 | 10.978 | 10.972 | 11.043 | 11.041 | 11.006 |
| $R_2O - Al_2O_3$ | −3.501 | −3.559 | −3.543 | −3.531 | −3.506 | −3.544 | −3.536 | −3.446 | −3.431 | −3.475 |
| R'O | 5.941 | 5.973 | 5.970 | 5.967 | 5.954 | 5.988 | 5.993 | 5.962 | 5.950 | 5.943 |
| Thickness (mm) | 2.400 | 2.400 | 2.400 | 2.400 | 2.400 | 2.400 | 2.400 | 2.400 | 2.400 | 2.400 |
| L* | 95.87 | 95.86 | 95.87 | 95.86 | 95.86 | 95.84 | 95.85 | 95.85 | 95.85 | 95.91 |
| a* | −1.37 | −1.38 | −1.38 | −1.38 | −1.38 | −1.38 | −1.38 | −1.38 | −1.38 | −1.36 |
| b* | 8.77 | 8.8 | 8.79 | 8.8 | 8.81 | 8.86 | 8.84 | 8.84 | 8.83 | 8.58 |
| Density (g/cm³) | | | | | | | | | | |
| Liquidus Temp. (° C.) | | | | | | | | | | |

| Example | 121 | 122 | 123 | 124 | 125 | 126 | 127 | 128 | 129 | 130 |
|---|---|---|---|---|---|---|---|---|---|---|
| $SiO_2$ | 60.747 | 60.799 | 60.778 | 60.734 | 60.742 | 60.783 | 60.797 | 60.807 | 60.903 | 60.905 |
| $Al_2O_3$ | 14.692 | 14.685 | 14.688 | 14.699 | 14.705 | 14.689 | 14.693 | 14.692 | 14.633 | 14.672 |
| $B_2O_3$ | 5.974 | 5.974 | 5.975 | 5.991 | 5.990 | 5.989 | 5.988 | 5.988 | 5.984 | 6.001 |
| $P_2O_5$ | 0.000 | 0.000 | 0.000 | 0.000 | 0.000 | 0.000 | 0.000 | 0.000 | 0.000 | 0.000 |
| $Li_2O$ | 8.999 | 8.999 | 9.001 | 9.018 | 9.018 | 9.016 | 9.014 | 9.013 | 9.008 | 8.984 |
| $Na_2O$ | 2.011 | 2.003 | 2.011 | 2.009 | 2.008 | 2.004 | 2.010 | 2.013 | 2.001 | 2.008 |
| $K_2O$ | 0.201 | 0.199 | 0.201 | 0.201 | 0.201 | 0.200 | 0.200 | 0.199 | 0.200 | 0.200 |
| MgO | 1.510 | 1.493 | 1.494 | 1.492 | 1.487 | 1.492 | 1.485 | 1.485 | 1.486 | 1.493 |
| CaO | 4.450 | 4.441 | 4.450 | 4.465 | 4.460 | 4.450 | 4.447 | 4.447 | 4.444 | 4.431 |
| ZnO | 0.000 | 0.002 | 0.002 | 0.002 | 0.000 | 0.002 | 0.000 | 0.001 | 0.000 | 0.000 |
| $SnO_2$ | 0.004 | 0.004 | 0.004 | 0.004 | 0.004 | 0.004 | 0.004 | 0.004 | 0.004 | 0.003 |
| $Fe_2O_3$ | 0.006 | 0.006 | 0.006 | 0.006 | 0.006 | 0.006 | 0.006 | 0.006 | 0.006 | 0.006 |
| $TiO_2$ | 0.888 | 0.884 | 0.884 | 0.887 | 0.888 | 0.883 | 0.887 | 0.884 | 0.887 | 0.887 |
| $CeO_2$ | 0.513 | 0.508 | 0.503 | 0.489 | 0.486 | 0.479 | 0.464 | 0.457 | 0.441 | 0.408 |
| $ZrO_2$ | 0.005 | 0.004 | 0.005 | 0.004 | 0.005 | 0.004 | 0.004 | 0.004 | 0.004 | 0.004 |
| $La_2O_3$ | | | | | | | | | | |
| $SO_3$ | | | | | | | | | | |
| $WO_3$ | | | | | | | | | | |
| $Nb_2O_5$ | | | | | | | | | | |
| $Bi_2O_3$ | | | | | | | | | | |
| $MoO_3$ | | | | | | | | | | |
| $CeO_2 + TiO_2$ | 1.401 | 1.392 | 1.386 | 1.376 | 1.374 | 1.362 | 1.352 | 1.341 | 1.328 | 1.294 |
| $R_2O$ | 11.211 | 11.201 | 11.213 | 11.228 | 11.226 | 11.220 | 11.223 | 11.225 | 11.209 | 11.191 |
| $Li_2O + Na_2O$ | 11.011 | 11.002 | 11.012 | 11.027 | 11.026 | 11.019 | 11.024 | 11.026 | 11.009 | 10.991 |

TABLE I-continued

| | | | | | | | | | |
|---|---|---|---|---|---|---|---|---|---|
| $R_2O - Al_2O_3$ | -3.481 | -3.484 | -3.475 | -3.471 | -3.479 | -3.470 | -3.470 | -3.467 | -3.423 | -3.482 |
| R'O | 5.961 | 5.936 | 5.945 | 5.958 | 5.947 | 5.944 | 5.932 | 5.933 | 5.930 | 5.924 |
| Thickness (mm) | 2.400 | 2.400 | 2.400 | 2.400 | 2.400 | 2.400 | 2.400 | 2.400 | 2.400 | 2.400 |
| L* | 95.91 | 95.95 | 95.96 | 96.05 | 96.03 | 96.08 | 95.85 | 96.15 | 96.19 | 96.29 |
| a* | -1.34 | -1.33 | -1.32 | -1.29 | -1.28 | -1.27 | -1.22 | -1.22 | -1.19 | -1.1 |
| b* | 8.44 | 8.32 | 8.21 | 7.88 | 7.86 | 7.67 | 7.4 | 7.26 | 6.97 | 6.29 |
| Density (g/cm³) | | | | | | | | | | |
| Liquidus Temp. (° C.) | | | | | | | | | | |

| Example | 131 | 132 | 133 | 134 | 135 | 136 | 137 | 138 | 139 | 140 |
|---|---|---|---|---|---|---|---|---|---|---|
| $SiO_2$ | 60.915 | 60.903 | 61.594 | 61.212 | 61.723 | 61.723 | 61.723 | 61.723 | 61.566 | 61.654 |
| $Al_2O_3$ | 14.675 | 14.680 | 15.016 | 14.863 | 14.763 | 14.763 | 14.763 | 14.763 | 14.849 | 14.808 |
| $B_2O_3$ | 5.999 | 5.999 | 5.254 | 5.238 | 5.275 | 5.275 | 5.275 | 5.275 | 5.271 | 5.266 |
| $P_2O_5$ | 0.000 | 0.000 | 0.000 | 0.000 | 0.000 | 0.000 | 0.000 | 0.000 | 0.000 | 0.000 |
| $Li_2O$ | 8.982 | 8.981 | 9.695 | 9.665 | 9.147 | 9.147 | 9.147 | 9.147 | 9.142 | 9.132 |
| $Na_2O$ | 2.011 | 2.013 | 3.772 | 2.563 | 2.244 | 2.244 | 2.244 | 2.244 | 2.094 | 2.153 |
| $K_2O$ | 0.199 | 0.199 | 0.066 | 0.154 | 0.181 | 0.181 | 0.181 | 0.181 | 0.194 | 0.190 |
| MgO | 1.496 | 1.496 | 0.477 | 1.178 | 1.334 | 1.334 | 1.334 | 1.334 | 1.429 | 1.375 |
| CaO | 4.428 | 4.441 | 3.499 | 4.167 | 4.313 | 4.313 | 4.313 | 4.313 | 4.423 | 4.400 |
| ZnO | 0.001 | 0.000 | 0.000 | 0.008 | 0.016 | 0.016 | 0.016 | 0.016 | 0.024 | 0.024 |
| $SnO_2$ | 0.003 | 0.004 | 0.115 | 0.087 | 0.046 | 0.046 | 0.046 | 0.046 | 0.026 | 0.038 |
| $Fe_2O_3$ | 0.006 | 0.006 | 0.007 | 0.005 | 0.004 | 0.004 | 0.004 | 0.004 | 0.004 | 0.004 |
| $TiO_2$ | 0.886 | 0.886 | 0.188 | 0.474 | 0.549 | 0.549 | 0.549 | 0.549 | 0.587 | 0.562 |
| $CeO_2$ | 0.395 | 0.389 | 0.113 | 0.292 | 0.344 | 0.344 | 0.344 | 0.344 | 0.368 | 0.352 |
| $ZrO_2$ | 0.004 | 0.004 | 0.202 | 0.089 | 0.058 | 0.058 | 0.058 | 0.058 | 0.024 | 0.037 |
| $La_2O_3$ | | | | | | | | | | |
| $SO_3$ | | | | | | | | | | |
| $WO_3$ | | | | | | | | | | |
| $Nb_2O_5$ | | | | | | | | | | |
| $Bi_2O_3$ | | | | | | | | | | |
| $MoO_3$ | | | | | | | | | | |
| $CeO_2 + TiO_2$ | 1.281 | 1.275 | 0.301 | 0.766 | 0.893 | 0.893 | 0.893 | 0.893 | 0.955 | 0.914 |
| $R_2O$ | 11.192 | 11.193 | 13.533 | 12.383 | 11.572 | 11.572 | 11.572 | 11.572 | 11.429 | 11.476 |
| $Li_2O + Na_2O$ | 10.993 | 10.994 | 13.467 | 12.229 | 11.391 | 11.391 | 11.391 | 11.391 | 11.235 | 11.286 |
| $R_2O - Al_2O_3$ | -3.484 | -3.487 | -1.483 | -2.480 | -3.191 | -3.191 | -3.191 | -3.191 | -3.419 | -3.332 |
| R'O | 5.925 | 5.937 | 3.976 | 5.353 | 5.662 | 5.662 | 5.662 | 5.662 | 5.876 | 5.799 |
| Thickness (mm) | 2.400 | 2.400 | 4.127 | 4.024 | 4.354 | 3.967 | 4.238 | 4.057 | 4.025 | 4.010 |
| L* | 96.32 | 96.21 | 96.54 | 96.42 | 96.22 | 96.19 | 96.3 | 96.28 | 96.1 | 96.19 |
| a* | -1.06 | -1.03 | -0.14 | -0.39 | -0.71 | -0.69 | -0.7 | -0.71 | -0.95 | -0.76 |
| b* | 6.06 | 5.92 | 0.72 | 2.2 | 4.11 | 3.99 | 4.02 | 4.06 | 5.52 | 4.33 |
| Density (g/cm³) | | | 2.419 | | 2.429 | 2.429 | 2.429 | 2.429 | | |
| Liquidus Temp. (° C.) | | | | | | | | | | |

| | 141 | 142 | 143 | 144 | 145 | 146 | 147 | 148 | 149 | 150 |
|---|---|---|---|---|---|---|---|---|---|---|
| $SiO_2$ | 61.220 | 61.167 | 61.145 | 61.056 | 61.074 | 60.985 | 60.554 | 60.376 | 60.288 | 60.985 |
| $Al_2O_3$ | 14.708 | 14.714 | 14.714 | 14.757 | 14.730 | 14.689 | 14.728 | 14.704 | 14.690 | 14.689 |
| $B_2O_3$ | 5.980 | 5.975 | 5.975 | 5.975 | 5.976 | 6.003 | 6.012 | 6.012 | 6.051 | 6.003 |
| $P_2O_5$ | 0.000 | 0.000 | 0.000 | 0.000 | 0.000 | 0.000 | 0.000 | 0.000 | 0.000 | 0.000 |
| $Li_2O$ | 9.074 | 9.066 | 9.066 | 9.066 | 9.068 | 9.109 | 9.122 | 9.123 | 9.083 | 9.109 |
| $Na_2O$ | 2.136 | 2.017 | 1.988 | 1.976 | 1.979 | 2.005 | 2.003 | 1.985 | 1.983 | 2.005 |
| $K_2O$ | 0.186 | 0.196 | 0.200 | 0.200 | 0.200 | 0.201 | 0.202 | 0.200 | 0.202 | 0.201 |
| MgO | 1.368 | 1.457 | 1.459 | 1.488 | 1.496 | 1.516 | 1.500 | 1.497 | 1.504 | 1.516 |
| CaO | 4.357 | 4.436 | 4.443 | 4.467 | 4.450 | 4.471 | 4.491 | 4.492 | 4.493 | 4.471 |
| ZnO | 0.008 | 0.016 | 0.016 | 0.016 | 0.016 | 0.024 | 0.016 | 0.024 | 0.016 | 0.024 |
| $SnO_2$ | 0.043 | 0.012 | 0.013 | 0.012 | 0.023 | 0.025 | 0.015 | 0.016 | 0.017 | 0.025 |
| $Fe_2O_3$ | 0.004 | 0.004 | 0.004 | 0.004 | 0.003 | 0.004 | 0.003 | 0.003 | 0.003 | 0.004 |
| $TiO_2$ | 0.547 | 0.581 | 0.592 | 0.597 | 0.597 | 0.595 | 0.962 | 1.172 | 1.271 | 0.595 |
| $CeO_2$ | 0.329 | 0.341 | 0.367 | 0.368 | 0.366 | 0.368 | 0.385 | 0.391 | 0.390 | 0.368 |
| $ZrO_2$ | 0.041 | 0.014 | 0.014 | 0.014 | 0.019 | 0.005 | 0.002 | | | 0.005 |
| $CeO_2 + TiO_2$ | 0.876 | 0.922 | 0.960 | 0.966 | 0.963 | 0.963 | 1.347 | 1.563 | 1.661 | 0.963 |
| $R_2O$ | 11.396 | 11.279 | 11.254 | 11.242 | 11.247 | 11.316 | 11.327 | 11.308 | 11.267 | 11.316 |
| $Li_2O + Na_2O$ | 11.210 | 11.083 | 11.054 | 11.042 | 11.047 | 11.115 | 11.125 | 11.108 | 11.066 | 11.115 |
| $R_2O - Al_2O_3$ | -3.312 | -3.435 | -3.459 | -3.515 | -3.483 | -3.373 | -3.401 | -3.396 | -3.423 | -3.373 |
| R'O | 5.733 | 5.909 | 5.917 | 5.970 | 5.961 | 6.010 | 6.007 | 6.013 | 6.012 | 6.010 |
| Thickness (mm) | 4.063 | 4.071 | 4.177 | 4.123 | 4.387 | 4.114 | 4.191 | 4.286 | 3.986 | 2.441 |
| L* | 96.26 | 96.07 | 96.05 | 96.04 | 96.07 | 96.1 | 95.79 | 95.61 | 95.64 | 96.29 |
| a* | -0.71 | -0.92 | -1.02 | -1.02 | -0.99 | -1.01 | -1.5 | -1.81 | -1.92 | -0.63 |
| b* | 3.98 | 5.31 | 5.94 | 5.94 | 5.73 | 5.8 | 8.64 | 10.49 | 11.13 | 3.67 |
| Density (g/cm³) | 2.427 | 2.427 | | 2.429 | 2.430 | 2.430 | | 2.437 | 2.439 | 2.430 |

TABLE I-continued

| Example | 151 | 152 | 153 | 154 | 155 | 156 | 157 | 158 | 159 | 160 |
|---|---|---|---|---|---|---|---|---|---|---|
| $SiO_2$ | 60.554 | 60.376 | 60.288 | 60.152 | 60.135 | 60.130 | 60.007 | 60.152 | 60.135 | 60.130 |
| $Al_2O_3$ | 14.728 | 14.704 | 14.690 | 14.713 | 14.694 | 14.683 | 14.684 | 14.713 | 14.694 | 14.683 |
| $B_2O_3$ | 6.012 | 6.012 | 6.051 | 6.063 | 6.061 | 6.061 | 6.075 | 6.063 | 6.061 | 6.061 |
| $P_2O_5$ | 0.000 | 0.000 | 0.000 | 0.000 | 0.000 | 0.000 | 0.000 | 0.000 | 0.000 | 0.000 |
| $Li_2O$ | 9.122 | 9.123 | 9.083 | 9.101 | 9.097 | 9.098 | 9.199 | 9.101 | 9.097 | 9.098 |
| $Na_2O$ | 2.003 | 1.985 | 1.983 | 1.987 | 1.986 | 1.973 | 1.954 | 1.987 | 1.986 | 1.973 |
| $K_2O$ | 0.202 | 0.200 | 0.202 | 0.201 | 0.204 | 0.203 | 0.202 | 0.201 | 0.204 | 0.203 |
| MgO | 1.500 | 1.497 | 1.504 | 1.504 | 1.501 | 1.487 | 1.491 | 1.504 | 1.501 | 1.487 |
| CaO | 4.491 | 4.492 | 4.493 | 4.499 | 4.486 | 4.485 | 4.491 | 4.499 | 4.486 | 4.485 |
| ZnO | 0.016 | 0.024 | 0.016 | 0.024 | 0.024 | 0.024 | 0.016 | 0.024 | 0.024 | 0.024 |
| $SnO_2$ | 0.015 | 0.016 | 0.017 | 0.015 | 0.019 | 0.022 | 0.018 | 0.015 | 0.019 | 0.022 |
| $Fe_2O_3$ | 0.003 | 0.003 | 0.003 | 0.003 | 0.003 | 0.004 | 0.004 | 0.003 | 0.003 | 0.004 |
| $TiO_2$ | 0.962 | 1.172 | 1.271 | 1.343 | 1.399 | 1.433 | 1.462 | 1.343 | 1.399 | 1.433 |
| $CeO_2$ | 0.385 | 0.391 | 0.390 | 0.390 | 0.384 | 0.389 | 0.389 | 0.390 | 0.384 | 0.389 |
| $ZrO_2$ | 0.002 | | | | 0.003 | 0.004 | 0.003 | | 0.003 | 0.004 |
| $La_2O_3$ | | | | | | | | | | |
| $SO_3$ | | | | | | | | | | |
| $WO_3$ | | | | | | | | | | |
| $Nb_2O_5$ | | | | | | | | | | |
| $Bi_2O_3$ | | | | | | | | | | |
| $MoO_3$ | | | | | | | | | | |
| $CeO_2 + TiO_2$ | 1.347 | 1.563 | 1.661 | 1.733 | 1.783 | 1.822 | 1.852 | 1.733 | 1.783 | 1.822 |
| $R_2O$ | 11.327 | 11.308 | 11.267 | 11.289 | 11.287 | 11.273 | 11.355 | 11.289 | 11.287 | 11.273 |
| $Li_2O + Na_2O$ | 11.125 | 11.108 | 11.066 | 11.088 | 11.083 | 11.070 | 11.153 | 11.088 | 11.083 | 11.070 |
| $R_2O - Al_2O_3$ | −3.401 | 3.396 | −3.423 | −3.424 | −3.407 | −3.410 | −3.329 | −3.424 | −3.407 | −3.410 |
| R'O | 6.007 | 6.013 | 6.012 | 6.027 | 6.011 | 5.996 | 5.997 | 6.027 | 6.011 | 5.996 |
| Thickness (mm) | 2.453 | 2.444 | 2.451 | 4.294 | 4.203 | 4.375 | 4.076 | 2.400 | 2.421 | 2.420 |
| L* | 96.14 | 96.07 | 96.02 | 95.56 | 95.62 | 95.61 | 95.49 | 96.03 | 96.04 | 96.01 |
| a* | −0.99 | −1.16 | −1.26 | −2.08 | −2.06 | −2.16 | −2.25 | −1.32 | −1.37 | −1.41 |
| b* | 5.6 | 6.53 | 7.12 | 12.16 | 11.93 | 12.57 | 13.31 | 7.4 | 7.63 | 7.84 |
| Density (g/cm$^3$) | | 2.437 | 2.439 | 2.440 | | 2.440 | | 2.440 | | 2.440 |
| Liquidus Temp. (° C.) | | | | | | | | | | |

| Example | 161 | 162 | 163 | 164 | 165 | 166 | 167 | 168 | 169 | 170 |
|---|---|---|---|---|---|---|---|---|---|---|
| $SiO_2$ | 60.007 | 60.059 | 59.947 | 59.925 | 59.694 | 60.059 | 59.947 | 59.925 | 59.694 | 59.634 |
| $Al_2O_3$ | 14.684 | 14.657 | 14.686 | 14.672 | 14.706 | 14.657 | 14.686 | 14.672 | 14.706 | 14.690 |
| $B_2O_3$ | 6.075 | 6.064 | 6.079 | 6.070 | 6.078 | 6.064 | 6.079 | 6.070 | 6.078 | 6.082 |
| $P_2O_5$ | 0.000 | 0.000 | 0.000 | 0.000 | 0.000 | 0.000 | 0.000 | 0.000 | 0.000 | 0.000 |
| $Li_2O$ | 9.199 | 9.182 | 9.204 | 9.191 | 9.195 | 9.182 | 9.204 | 9.191 | 9.195 | 9.201 |
| $Na_2O$ | 1.954 | 1.959 | 1.981 | 1.980 | 1.967 | 1.959 | 1.981 | 1.980 | 1.967 | 1.964 |
| $K_2O$ | 0.202 | 0.201 | 0.203 | 0.206 | 0.205 | 0.201 | 0.203 | 0.206 | 0.205 | 0.203 |
| MgO | 1.491 | 1.491 | 1.495 | 1.493 | 1.502 | 1.491 | 1.495 | 1.493 | 1.502 | 1.483 |
| CaO | 4.491 | 4.464 | 4.492 | 4.481 | 4.496 | 4.464 | 4.492 | 4.481 | 4.496 | 4.485 |
| ZnO | 0.016 | 0.024 | 0.016 | 0.032 | 0.048 | 0.024 | 0.016 | 0.032 | 0.048 | 0.056 |
| $SnO_2$ | 0.018 | 0.022 | 0.019 | 0.012 | 0.014 | 0.022 | 0.019 | 0.012 | 0.014 | 0.015 |
| $Fe_2O_3$ | 0.004 | 0.003 | 0.003 | 0.003 | 0.002 | 0.003 | 0.003 | 0.003 | 0.002 | 0.002 |
| $TiO_2$ | 1.462 | 1.468 | 1.482 | 1.490 | 1.497 | 1.468 | 1.482 | 1.490 | 1.497 | 1.504 |
| $CeO_2$ | 0.389 | 0.394 | 0.391 | 0.439 | 0.586 | 0.394 | 0.391 | 0.439 | 0.586 | 0.681 |
| $ZrO_2$ | 0.003 | 0.006 | 0.001 | 0.001 | | 0.006 | 0.001 | 0.001 | | |
| $La_2O_3$ | | | | | | | | | | |
| $SO_3$ | | | | | | | | | | |
| $WO_3$ | | | | | | | | | | |
| $Nb_2O_5$ | | | | | | | | | | |
| $Bi_2O_3$ | | | | | | | | | | |
| $MoO_3$ | | | | | | | | | | |
| $CeO_2 + TiO_2$ | 1.852 | 1.862 | 1.873 | 1.929 | 2.083 | 1.862 | 1.873 | 1.929 | 2.083 | 2.184 |
| $R_2O$ | 11.355 | 11.342 | 11.388 | 11.378 | 11.367 | 11.342 | 11.388 | 11.378 | 11.367 | 11.368 |
| $Li_2O + Na_2O$ | 11.153 | 11.141 | 11.185 | 11.171 | 11.162 | 11.141 | 11.185 | 11.171 | 11.162 | 11.165 |
| $R_2O - Al_2O_3$ | −3.329 | −3.315 | −3.298 | 3.294 | −3.340 | −3.315 | −3.298 | −3.294 | −3.340 | −3.322 |
| R'O | 5.997 | 5.979 | 6.003 | 6.006 | 6.046 | 5.979 | 6.003 | 6.006 | 6.046 | 6.024 |
| Thickness (mm) | 2.423 | 4.163 | 4.353 | 4.547 | 4.077 | 2.444 | 2.459 | 2.448 | 2.425 | 4.414 |
| L* | 95.98 | 95.39 | 95.46 | 95.07 | 94.15 | 95.94 | 95.92 | 95.74 | 95.14 | 93.33 |
| a* | −1.46 | −2.28 | −2.27 | −2.59 | −3 | −1.49 | −1.53 | −1.73 | −2.17 | −3.15 |
| b* | 8.19 | 13.49 | 13.41 | 16.27 | 21.96 | 8.33 | 8.57 | 10.16 | 14.23 | 26.17 |
| Density (g/cm$^3$) | | 2.441 | | 2.443 | | 2.441 | | 2.443 | | 2.456 |
| Liquidus Temp. (° C.) | | | | | | | | | | |

TABLE I-continued

| Example | 171 | 172 | 173 | 174 | 175 | 176 | 177 | 178 | 179 | 180 |
|---|---|---|---|---|---|---|---|---|---|---|
| $SiO_2$ | 59.620 | 59.511 | 59.558 | 59.634 | 59.620 | 59.511 | 59.558 | 59.578 | 59.529 | 59.531 |
| $Al_2O_3$ | 14.682 | 14.725 | 14.762 | 14.690 | 14.682 | 14.725 | 14.762 | 14.727 | 14.766 | 14.745 |
| $B_2O_3$ | 6.083 | 6.086 | 6.072 | 6.082 | 6.083 | 6.086 | 6.072 | 6.084 | 6.073 | 6.078 |
| $P_2O_5$ | 0.000 | 0.000 | 0.000 | 0.000 | 0.000 | 0.000 | 0.000 | 0.000 | 0.000 | 0.000 |
| $Li_2O$ | 9.204 | 9.207 | 9.084 | 9.201 | 9.204 | 9.207 | 9.084 | 9.102 | 9.086 | 9.093 |
| $Na_2O$ | 1.986 | 1.974 | 1.974 | 1.964 | 1.986 | 1.974 | 1.974 | 1.971 | 1.970 | 1.986 |
| $K_2O$ | 0.202 | 0.200 | 0.201 | 0.203 | 0.202 | 0.200 | 0.201 | 0.204 | 0.205 | 0.207 |
| MgO | 1.469 | 1.497 | 1.482 | 1.483 | 1.469 | 1.497 | 1.482 | 1.490 | 1.510 | 1.490 |
| CaO | 4.470 | 4.496 | 4.507 | 4.485 | 4.470 | 4.496 | 4.507 | 4.503 | 4.504 | 4.507 |
| ZnO | 0.048 | 0.048 | 0.064 | 0.056 | 0.048 | 0.048 | 0.064 | 0.048 | 0.056 | 0.064 |
| $SnO_2$ | 0.023 | 0.015 | 0.021 | 0.015 | 0.023 | 0.015 | 0.021 | 0.022 | 0.021 | 0.019 |
| $Fe_2O_3$ | 0.002 | 0.002 | 0.002 | 0.002 | 0.002 | 0.002 | 0.002 | 0.002 | 0.001 | 0.001 |
| $TiO_2$ | 1.501 | 1.505 | 1.504 | 1.504 | 1.501 | 1.505 | 1.504 | 1.509 | 1.512 | 1.506 |
| $CeO_2$ | 0.704 | 0.729 | 0.757 | 0.681 | 0.704 | 0.729 | 0.757 | 0.756 | 0.763 | 0.769 |
| $ZrO_2$ | | | | | | | | | | |
| $La_2O_3$ | | | | | | | | | | |
| $SO_3$ | | | | | | | | | | |
| $WO_3$ | | | | | | | | | | |
| $Nb_2O_5$ | | | | | | | | | | |
| $Bi_2O_3$ | | | | | | | | | | |
| $MoO_3$ | | | | | | | | | | |
| $CeO_2 + TiO_2$ | 2.205 | 2.234 | 2.261 | 2.184 | 2.205 | 2.234 | 2.261 | 2.265 | 2.274 | 2.275 |
| $R_2O$ | 11.392 | 11.382 | 11.259 | 11.368 | 11.392 | 11.382 | 11.259 | 11.277 | 11.261 | 11.286 |
| $Li_2O + Na_2O$ | 11.190 | 11.181 | 11.058 | 11.165 | 11.190 | 11.181 | 11.058 | 11.073 | 11.056 | 11.079 |
| $R_2O - Al_2O_3$ | -3.289 | -3.343 | -3.503 | -3.322 | -3.289 | -3.343 | -3.503 | -3.450 | -3.504 | -3.459 |
| R'O | 5.987 | 6.041 | 6.053 | 6.024 | 5.987 | 6.041 | 6.053 | 6.041 | 6.070 | 6.061 |
| Thickness (mm) | 4.551 | 4.166 | 4.152 | 2.482 | 2.478 | 2.454 | 2.423 | 4.194 | 4.282 | 4.847 |
| L* | 93.19 | 92.97 | 92.74 | 94.62 | 94.58 | 94.36 | 94.27 | 92.73 | 92.66 | 92.63 |
| a* | -3.19 | -3.17 | -3.2 | -2.4 | -2.42 | -2.48 | -2.5 | -3.19 | -3.21 | -3.2 |
| b* | 27.13 | 28.08 | 29.2 | 17.11 | 17.47 | 18.53 | 18.96 | 29.21 | 29.67 | 29.65 |
| Density (g/cm³) | | 2.459 | 2.461 | 2.456 | | 2.459 | 2.461 | 2.461 | | 2.462 |
| Liquidus Temp. (° C.) | | | | | | | | | | |

| Example | 181 | 182 | 183 | 184 | 185 | 186 | 187 | 188 | 189 | 190 |
|---|---|---|---|---|---|---|---|---|---|---|
| $SiO_2$ | 59.645 | 59.578 | 59.529 | 59.531 | 59.645 | 59.759 | 59.810 | 60.264 | 60.495 | 60.007 |
| $Al_2O_3$ | 14.728 | 14.727 | 14.766 | 14.745 | 14.728 | 14.750 | 14.715 | 14.777 | 14.795 | 14.684 |
| $B_2O_3$ | 6.084 | 6.084 | 6.073 | 6.078 | 6.084 | 6.080 | 6.079 | 6.075 | 6.062 | 6.075 |
| $P_2O_g$ | 0.000 | 0.000 | 0.000 | 0.000 | 0.000 | 0.000 | 0.000 | 0.000 | 0.000 | 0.000 |
| $Li_2O$ | 9.037 | 9.102 | 9.086 | 9.093 | 9.037 | 9.031 | 9.029 | 9.024 | 9.047 | 9.199 |
| $Na_2O$ | 1.958 | 1.971 | 1.970 | 1.986 | 1.958 | 1.962 | 1.976 | 1.996 | 1.983 | 1.954 |
| $K_2O$ | 0.205 | 0.204 | 0.205 | 0.207 | 0.205 | 0.204 | 0.205 | 0.206 | 0.202 | 0.202 |
| MgO | 1.487 | 1.490 | 1.510 | 1.490 | 1.487 | 1.489 | 1.481 | 1.493 | 1.491 | 1.491 |
| CaO | 4.497 | 4.503 | 4.504 | 4.507 | 4.497 | 4.525 | 4.494 | 4.524 | 4.521 | 4.491 |
| ZnO | 0.064 | 0.048 | 0.056 | 0.064 | 0.064 | 0.064 | 0.056 | 0.056 | 0.056 | 0.016 |
| $SnO_2$ | 0.019 | 0.022 | 0.021 | 0.019 | 0.019 | 0.025 | 0.030 | 0.021 | 0.013 | 0.018 |
| $Fe_2O_3$ | 0.001 | 0.002 | 0.001 | 0.001 | 0.001 | 0.001 | 0.001 | 0.001 | 0.001 | 0.004 |
| $TiO_2$ | 1.501 | 1.509 | 1.512 | 1.506 | 1.501 | 1.358 | 1.358 | 0.793 | 0.558 | 1.462 |
| $CeO_2$ | 0.765 | 0.756 | 0.763 | 0.769 | 0.765 | 0.768 | 0.766 | 0.769 | 0.771 | 0.389 |
| $ZrO_2$ | | | | | | | | | | 0.003 |
| $La_2O_3$ | | | | | | | | | | |
| $SO_3$ | | | | | | | | | | |
| $WO_3$ | | | | | | | | | | |
| $Nb_2O_5$ | | | | | | | | | | |
| $Bi_2O_3$ | | | | | | | | | | |
| $MoO_3$ | | | | | | | | | | |
| $CeO_2 + TiO_2$ | 2.267 | 2.265 | 2.274 | 2.275 | 2.267 | 2.126 | 2.124 | 1.563 | 1.329 | 1.852 |
| $R_2O$ | 11.200 | 11.277 | 11.261 | 11.286 | 11.200 | 11.197 | 11.210 | 11.225 | 11.232 | 11.355 |
| $Li_2O + Na_2O$ | 10.994 | 11.073 | 11.056 | 11.079 | 10.994 | 10.993 | 11.005 | 11.020 | 11.030 | 11.153 |
| $R_2O - Al_2O_3$ | -3.528 | -3.450 | -3.504 | -3.459 | -3.528 | -3.553 | -3.505 | -3.552 | -3.562 | -3.329 |
| R'O | 6.048 | 6.041 | 6.070 | 6.061 | 6.048 | 6.058 | 6.031 | 6.073 | 6.068 | 5.997 |
| Thickness (mm) | 4.210 | 2.386 | 2.393 | 2.375 | 2.410 | 4.140 | 4.393 | 4.160 | 4.192 | 4.248 |
| L* | 92.66 | 94.28 | 94.27 | 94.27 | 94.28 | 92.93 | 93.19 | 93.99 | 94.22 | 94.67 |
| a* | -3.21 | -2.48 | -2.48 | -2.47 | -2.47 | -3.07 | -2.97 | -2.05 | -1.72 | -2.94 |
| b* | 29.76 | 18.74 | 18.77 | 18.73 | 18.72 | 27.63 | 25.82 | 17.53 | 15.2 | 20.12 |
| Density (g/cm³) | 2.461 | 2.461 | | 2.462 | 2.461 | 2.459 | | 2.453 | 2.449 | |
| Liquidus Temp. (° C.) | | | | | | | | | | |

TABLE I-continued

| Example | 191 | 192 | 193 | 194 | 195 | 196 | 197 | 198 | 199 | 200 |
|---|---|---|---|---|---|---|---|---|---|---|
| SiO$_2$ | 60.007 | 59.645 | 59.645 | 59.759 | 59.810 | 60.264 | 60.495 | 60.539 | 60.584 | 60.764 |
| Al$_2$O$_3$ | 14.684 | 14.728 | 14.728 | 14.750 | 14.715 | 14.777 | 14.795 | 14.803 | 14.774 | 14.751 |
| B$_2$O$_3$ | 6.075 | 6.084 | 6.084 | 6.080 | 6.079 | 6.075 | 6.062 | 6.047 | 6.048 | 6.030 |
| P$_2$O$_5$ | 0.000 | 0.000 | 0.000 | 0.000 | 0.000 | 0.000 | 0.000 | 0.000 | 0.000 | 0.000 |
| Li$_2$O | 9.199 | 9.037 | 9.037 | 9.031 | 9.029 | 9.024 | 9.047 | 9.025 | 9.027 | 8.941 |
| Na$_2$O | 1.954 | 1.958 | 1.958 | 1.962 | 1.976 | 1.996 | 1.983 | 1.992 | 2.004 | 1.980 |
| K$_2$O | 0.202 | 0.205 | 0.205 | 0.204 | 0.205 | 0.206 | 0.202 | 0.204 | 0.205 | 0.204 |
| MgO | 1.491 | 1.487 | 1.487 | 1.489 | 1.481 | 1.493 | 1.491 | 1.492 | 1.476 | 1.464 |
| CaO | 4.491 | 4.497 | 4.497 | 4.505 | 4.494 | 4.524 | 4.521 | 4.530 | 4.511 | 4.502 |
| ZnO | 0.016 | 0.064 | 0.064 | 0.064 | 0.056 | 0.056 | 0.056 | 0.056 | 0.051 | 0.055 |
| SnO$_2$ | 0.018 | 0.019 | 0.019 | 0.025 | 0.030 | 0.021 | 0.013 | 0.014 | 0.018 | 0.015 |
| Fe$_2$O$_3$ | 0.004 | 0.001 | 0.001 | 0.001 | 0.001 | 0.001 | 0.001 | 0.001 | 0.002 | 0.002 |
| TiO$_2$ | 1.462 | 1.501 | 1.501 | 1.358 | 1.358 | 0.793 | 0.558 | 0.526 | 0.526 | 0.518 |
| CeO$_2$ | 0.389 | 0.765 | 0.765 | 0.768 | 0.766 | 0.769 | 0.771 | 0.768 | 0.772 | 0.771 |
| ZrO$_2$ | 0.003 | | | | | | | | | |
| La$_2$O$_3$ | | | | | | | | | | |
| SO$_3$ | | | | | | | | | | |
| WO$_3$ | | | | | | | | | | |
| Nb$_2$O$_5$ | | | | | | | | | | |
| Bi$_2$O$_3$ | | | | | | | | | | |
| MoO$_3$ | | | | | | | | | | |
| CeO$_2$ + TiO$_2$ | 1.852 | 2.267 | 2.267 | 2.126 | 2.124 | 1.563 | 1.329 | 1.295 | 1.297 | 1.289 |
| R$_2$O | 11.355 | 11.200 | 11.200 | 11.197 | 11.210 | 11.225 | 11.232 | 11.220 | 11.235 | 11.125 |
| Li$_2$O + Na$_2$O | 11.153 | 10.994 | 10.994 | 10.993 | 11.005 | 11.020 | 11.030 | 11.016 | 11.030 | 10.921 |
| R$_2$O − Al$_2$O$_3$ | −3.329 | −3.528 | −3.528 | −3.553 | −3.505 | −3.552 | −3.562 | −3.582 | −3.539 | −3.626 |
| R'O | 5.997 | 6.048 | 6.048 | 6.058 | 6.031 | 6.073 | 6.068 | 6.077 | 6.038 | 6.021 |
| Thickness (mm) | 4.242 | 4.220 | 4.685 | 2.420 | 2.403 | 2.365 | 2.406 | 4.160 | 4.388 | 4.256 |
| L* | 94.23 | 88.92 | 86.3 | 94.38 | 94.5 | 95.05 | 95.18 | 94.17 | 94.21 | 94.28 |
| a* | −3.04 | −2.7 | −1.69 | −2.33 | −2.25 | −1.44 | −1.19 | −1.68 | −1.64 | −1.63 |
| b* | 22.54 | 45.61 | 53.12 | 17.56 | 16.74 | 11.04 | 9.5 | 15.04 | 14.7 | 14.59 |
| Density (g/cm$^3$) | | 2.461 | 2.461 | 2.459 | | 2.453 | 2.449 | | 2.449 | 2.448 |
| Liquidus Temp. (° C.) | | | | | | | | | | |

| Example | 201 | 202 | 203 | 204 | 205 | 206 | 207 | 208 | 209 | 210 |
|---|---|---|---|---|---|---|---|---|---|---|
| SiO$_2$ | 60.539 | 60.584 | 60.764 | 60.726 | 60.727 | 60.722 | 60.582 | 60.726 | 60.727 | 60.722 |
| Al$_2$O$_3$ | 14.803 | 14.774 | 14.751 | 14.753 | 14.741 | 14.746 | 14.729 | 14.753 | 14.741 | 14.746 |
| B$_2$O$_3$ | 6.047 | 6.048 | 6.030 | 6.034 | 6.034 | 6.033 | 6.085 | 6.034 | 6.034 | 6.033 |
| P$_2$O$_5$ | 0.000 | 0.000 | 0.000 | 0.000 | 0.000 | 0.000 | 0.000 | 0.000 | 0.000 | 0.000 |
| Li$_2$O | 9.025 | 9.027 | 8.941 | 8.947 | 8.947 | 8.946 | 9.005 | 8.947 | 8.947 | 8.946 |
| Na$_2$O | 1.992 | 2.004 | 1.980 | 1.993 | 2.014 | 2.003 | 2.023 | 1.993 | 2.014 | 2.003 |
| K$_2$O | 0.204 | 0.205 | 0.204 | 0.204 | 0.205 | 0.201 | 0.203 | 0.204 | 0.205 | 0.201 |
| MgO | 1.492 | 1.476 | 1.464 | 1.466 | 1.466 | 1.473 | 1.662 | 1.466 | 1.466 | 1.473 |
| CaO | 4.530 | 4.511 | 4.502 | 4.505 | 4.498 | 4.507 | 4.330 | 4.505 | 4.498 | 4.507 |
| ZnO | 0.056 | 0.051 | 0.055 | 0.054 | 0.056 | 0.058 | 0.065 | 0.054 | 0.056 | 0.058 |
| SnO$_2$ | 0.014 | 0.018 | 0.015 | 0.018 | 0.015 | 0.013 | 0.014 | 0.018 | 0.015 | 0.013 |
| Fe$_2$O$_3$ | 0.001 | 0.002 | 0.002 | 0.002 | 0.001 | 0.001 | 0.001 | 0.002 | 0.001 | 0.001 |
| TiO$_2$ | 0.526 | 0.526 | 0.518 | 0.519 | 0.514 | 0.513 | 0.513 | 0.519 | 0.514 | 0.513 |
| CeO$_2$ | 0.768 | 0.772 | 0.771 | 0.775 | 0.775 | 0.780 | 0.783 | 0.775 | 0.775 | 0.780 |
| ZrO$_2$ | | | | | | | | | | |
| La$_2$O$_3$ | | | | | | | | | | |
| SO$_3$ | | | | | | | | | | |
| WO$_3$ | | | | | | | | | | |
| Nb$_2$O$_5$ | | | | | | | | | | |
| Bi$_2$O$_3$ | | | | | | | | | | |
| MoO$_3$ | | | | | | | | | | |
| CeO$_2$ + TiO$_2$ | 1.295 | 1.297 | 1.289 | 1.293 | 1.289 | 1.293 | 1.295 | 1.293 | 1.289 | 1.293 |
| R$_2$O | 11.220 | 11.235 | 11.125 | 11.143 | 11.166 | 11.149 | 11.231 | 11.143 | 11.166 | 11.149 |
| Li$_2$O + Na$_2$O | 11.016 | 11.030 | 10.921 | 10.939 | 10.960 | 10.949 | 11.028 | 10.939 | 10.960 | 10.949 |
| R$_2$O − Al$_2$O$_3$ | −3.582 | −3.539 | −3.626 | −3.610 | −3.575 | −3.596 | −3.498 | 3.610 | −3.575 | −3.596 |
| R'O | 6.077 | 6.038 | 6.021 | 6.025 | 6.020 | 6.038 | 6.057 | 6.025 | 6.020 | 6.038 |
| Thickness (mm) | 2.417 | 2.418 | 2.444 | 4.380 | 4.072 | 4.378 | 4.870 | 2.426 | 2.421 | 2.347 |
| L* | 95.22 | 95.18 | 95.19 | 94.18 | 94.14 | 94.12 | 94.17 | 95.15 | 95.12 | 95.14 |
| a* | −1.16 | −1.15 | −1.16 | −1.65 | −1.67 | −1.67 | −1.67 | −1.16 | −1.15 | −1.13 |
| b* | 9.3 | 9.35 | 9.39 | 15.04 | 15.31 | 15.34 | 15.23 | 9.48 | 9.53 | 9.33 |
| Density (g/cm$^3$) | | 2.449 | 2.448 | 2.449 | | 2.449 | 2.448 | 2.449 | | 2.449 |
| Liquidus Temp. (° C.) | | | | | | | | | | |

TABLE I-continued

| Example | 211 | 212 | 213 | 214 | 215 | 216 | 217 | 218 | 219 | 220 |
|---|---|---|---|---|---|---|---|---|---|---|
| $SiO_2$ | 60.582 | 60.596 | 60.718 | 60.784 | 60.787 | 60.748 | 60.743 | 60.678 | 60.746 | 61.209 |
| $Al_2O_3$ | 14.729 | 14.743 | 14.739 | 14.704 | 14.740 | 14.736 | 14.755 | 14.736 | 14.767 | 14.903 |
| $B_2O_3$ | 6.085 | 6.072 | 6.052 | 5.995 | 5.981 | 5.992 | 5.989 | 6.019 | 6.029 | 6.048 |
| $P_2O_5$ | 0.000 | 0.000 | 0.000 | 0.000 | 0.000 | 0.000 | 0.000 | 0.000 | 0.000 | 0.000 |
| $Li_2O$ | 9.005 | 8.986 | 8.956 | 9.047 | 9.027 | 9.043 | 9.039 | 9.092 | 9.107 | 9.136 |
| $Na_2O$ | 2.023 | 2.005 | 1.996 | 1.989 | 1.991 | 1.995 | 1.980 | 1.985 | 1.995 | 2.007 |
| $K_2O$ | 0.203 | 0.205 | 0.201 | 0.200 | 0.195 | 0.198 | 0.200 | 0.201 | 0.200 | 0.200 |
| MgO | 1.662 | 2.519 | 3.593 | 3.986 | 4.249 | 4.247 | 4.344 | 4.313 | 4.194 | 3.537 |
| CaO | 4.330 | 3.495 | 2.393 | 1.943 | 1.685 | 1.672 | 1.600 | 1.613 | 1.595 | 1.580 |
| ZnO | 0.065 | 0.059 | 0.051 | 0.051 | 0.046 | 0.047 | 0.049 | 0.053 | 0.054 | 0.055 |
| $SnO_2$ | 0.014 | 0.019 | 0.011 | 0.013 | 0.012 | 0.020 | 0.011 | 0.016 | 0.023 | 0.019 |
| $Fe_2O_3$ | 0.001 | 0.001 | 0.002 | 0.001 | 0.002 | 0.002 | 0.002 | 0.002 | 0.002 | 0.001 |
| $TiO_2$ | 0.513 | 0.513 | 0.509 | 0.506 | 0.506 | 0.508 | 0.508 | 0.506 | 0.505 | 0.509 |
| $CeO_2$ | 0.783 | 0.781 | 0.779 | 0.770 | 0.775 | 0.782 | 0.775 | 0.777 | 0.776 | 0.790 |
| $ZrO_2$ | | | | | | | | | | |
| $La_2O_3$ | | | | | | | | | | |
| $SO_3$ | | | | | | | | | | |
| $WO_3$ | | | | | | | | | | |
| $Nb_2O_5$ | | | | | | | | | | |
| $Bi_2O_3$ | | | | | | | | | | |
| $MoO_3$ | | | | | | | | | | |
| $CeO_2 + TiO_2$ | 1.295 | 1.294 | 1.288 | 1.277 | 1.281 | 1.290 | 1.283 | 1.283 | 1.282 | 1.299 |
| $R_2O$ | 11.231 | 11.195 | 11.154 | 11.236 | 11.212 | 11.236 | 11.219 | 11.278 | 11.303 | 11.344 |
| $Li_2O + Na_2O$ | 11.028 | 10.991 | 10.952 | 11.036 | 11.017 | 11.038 | 11.019 | 11.077 | 11.103 | 11.143 |
| $R_2O - Al_2O_3$ | −3.498 | −3.548 | −3.585 | −3.469 | −3.529 | −3.500 | −3.535 | −3.459 | −3.464 | −3.559 |
| R'O | 6.057 | 6.073 | 6.037 | 5.980 | 5.980 | 5.966 | 5.993 | 5.979 | 5.844 | 5.171 |
| Thickness (mm) | 2.421 | 4.189 | 4.423 | 4.260 | 4.165 | 4.146 | 4.190 | 4.170 | 4.180 | 4.194 |
| L* | 95.13 | 94.35 | 94.58 | 94.8 | 94.76 | 94.78 | 94.75 | 94.75 | 94.71 | 94.51 |
| a* | −1.16 | −1.72 | −1.77 | −1.78 | −1.83 | −1.81 | −1.85 | −1.82 | −1.79 | −1.74 |
| b* | 9.58 | 14.79 | 14.19 | 13.48 | 13.89 | 13.69 | 14.02 | 13.79 | 13.72 | 14.37 |
| Density (g/cm$^3$) | 2.448 | | 2.439 | | 2.436 | | 2.436 | | 2.436 | |
| Liquidus Temp. (° C.) | | | | | | | | | | |

| Example | 221 | 222 | 223 | 224 | 225 | 226 | 227 | 228 | 229 | 230 |
|---|---|---|---|---|---|---|---|---|---|---|
| $SiO_2$ | 61.198 | 60.698 | 60.742 | 60.693 | 60.701 | 60.455 | 60.382 | 60.392 | 60.334 | 60.509 |
| $Al_2O_3$ | 14.923 | 14.833 | 14.825 | 14.844 | 14.835 | 14.859 | 14.835 | 14.829 | 14.841 | 14.837 |
| $B_2O_3$ | 6.064 | 5.985 | 5.976 | 5.986 | 5.990 | 6.176 | 6.201 | 6.198 | 6.203 | 6.048 |
| $P_2O_5$ | 0.000 | 0.000 | 0.000 | 0.000 | 0.000 | 0.000 | 0.000 | 0.000 | 0.000 | 0.000 |
| $Li_2O$ | 9.160 | 9.918 | 9.904 | 9.920 | 9.927 | 9.930 | 9.969 | 9.966 | 9.974 | 9.971 |
| $Na_2O$ | 2.012 | 1.985 | 1.982 | 1.983 | 1.979 | 1.978 | 1.994 | 1.980 | 1.975 | 1.973 |
| $K_2O$ | 0.206 | 0.201 | 0.203 | 0.199 | 0.200 | 0.203 | 0.206 | 0.201 | 0.206 | 0.203 |
| MgO | 3.493 | 3.468 | 3.454 | 3.461 | 3.090 | 2.719 | 1.422 | 1.269 | 0.981 | 0.909 |
| CaO | 1.577 | 1.552 | 1.547 | 1.546 | 1.910 | 2.307 | 3.613 | 3.782 | 4.101 | 4.149 |
| ZnO | 0.045 | 0.050 | 0.049 | 0.053 | 0.050 | 0.054 | 0.051 | 0.055 | 0.059 | 0.069 |
| $SnO_2$ | 0.020 | 0.022 | 0.017 | 0.017 | 0.014 | 0.018 | 0.018 | 0.020 | 0.020 | 0.018 |
| $Fe_2O_3$ | 0.001 | 0.001 | 0.001 | 0.001 | 0.001 | 0.001 | 0.001 | 0.001 | 0.001 | 0.001 |
| $TiO_2$ | 0.512 | 0.510 | 0.511 | 0.512 | 0.510 | 0.512 | 0.520 | 0.519 | 0.518 | 0.520 |
| $CeO_2$ | 0.783 | 0.772 | 0.784 | 0.779 | 0.786 | 0.782 | 0.784 | 0.782 | 0.785 | 0.788 |
| $ZrO_2$ | | | | | | | | | | |
| $La_2O_3$ | | | | | | | | | | |
| $SO_3$ | | | | | | | | | | |
| $WO_3$ | | | | | | | | | | |
| $Nb_2O_5$ | | | | | | | | | | |
| $Bi_2O_3$ | | | | | | | | | | |
| $MoO_3$ | | | | | | | | | | |
| $CeO_2 + TiO_2$ | 1.294 | 1.281 | 1.295 | 1.291 | 1.296 | 1.294 | 1.303 | 1.302 | 1.303 | 1.308 |
| $R_2O$ | 11.379 | 12.104 | 12.089 | 12.103 | 12.106 | 12.112 | 12.169 | 12.147 | 12.155 | 12.147 |
| $Li_2O + Na_2O$ | 11.173 | 11.903 | 11.886 | 11.904 | 11.906 | 11.908 | 11.963 | 11.946 | 11.949 | 11.943 |
| $R_2O - Al_2O_3$ | −3.544 | −2.730 | −2.736 | −2.741 | −2.728 | −2.747 | −2.666 | −2.682 | −2.686 | −2.691 |
| R'O | 5.116 | 5.070 | 5.049 | 5.061 | 5.051 | 5.081 | 5.087 | 5.106 | 5.141 | 5.127 |
| Thickness (mm) | 4.614 | 4.276 | 4.301 | 5.387 | 4.217 | 4.340 | 4.301 | 4.267 | 4.995 | 4.099 |
| L* | 94.55 | 94.54 | 94.45 | 94.45 | 94.36 | 94.19 | 93.92 | 93.74 | 93.84 | 93.72 |
| a* | −1.72 | −1.74 | −1.76 | −1.75 | −1.69 | −1.72 | −1.63 | −1.59 | −1.58 | −1.56 |
| b* | 14.15 | 14.3 | 14.68 | 14.51 | 14.61 | 15.38 | 15.74 | 16.03 | 16.09 | 16.23 |
| Density (g/cm$^3$) | 2.431 | 2.431 | 2.431 | | 2.433 | 2.436 | 2.442 | | 2.444 | 2.445 |
| Liquidus Temp. (° C.) | | | | | | | | | | |

TABLE I-continued

| Example | 231 | 232 | 233 | 234 | 235 | 236 | 237 | 238 | 239 | 240 |
|---|---|---|---|---|---|---|---|---|---|---|
| $SiO_2$ | 60.571 | 60.555 | 60.483 | 60.662 | 60.562 | 60.471 | 60.403 | 60.151 | 60.028 | 60.072 |
| $Al_2O_3$ | 14.776 | 14.799 | 14.849 | 14.790 | 14.811 | 14.820 | 14.761 | 14.736 | 14.724 | 14.661 |
| $B_2O_3$ | 6.049 | 6.051 | 6.053 | 5.923 | 5.924 | 5.920 | 5.917 | 6.009 | 5.998 | 5.993 |
| $P_2O_5$ | 0.000 | 0.000 | 0.000 | 0.000 | 0.000 | 0.000 | 0.000 | 0.000 | 0.000 | 0.000 |
| $Li_2O$ | 9.972 | 9.975 | 9.979 | 9.994 | 9.995 | 9.989 | 9.983 | 10.074 | 10.057 | 10.048 |
| $Na_2O$ | 2.004 | 1.986 | 1.988 | 2.000 | 1.991 | 1.995 | 1.997 | 1.985 | 2.043 | 2.026 |
| $K_2O$ | 0.203 | 0.203 | 0.203 | 0.203 | 0.205 | 0.204 | 0.203 | 0.205 | 0.205 | 0.205 |
| MgO | 0.824 | 0.701 | 0.626 | 0.597 | 0.593 | 0.559 | 0.524 | 0.517 | 0.510 | 0.516 |
| CaO | 4.212 | 4.348 | 4.433 | 4.443 | 4.476 | 4.517 | 4.549 | 4.555 | 4.564 | 4.527 |
| ZnO | 0.056 | 0.055 | 0.062 | 0.053 | 0.052 | 0.060 | 0.052 | 0.036 | 0.000 | 0.000 |
| $SnO_2$ | 0.022 | 0.019 | 0.018 | 0.022 | 0.021 | 0.020 | 0.015 | 0.014 | 0.015 | 0.009 |
| $Fe_2O_3$ | 0.001 | 0.002 | 0.002 | 0.001 | 0.001 | 0.002 | 0.002 | 0.002 | 0.006 | 0.006 |
| TiO | 0.518 | 0.517 | 0.520 | 0.519 | 0.605 | 0.715 | 0.955 | 1.148 | 1.342 | 1.510 |
| $CeO_2$ | 0.787 | 0.784 | 0.783 | 0.787 | 0.753 | 0.717 | 0.631 | 0.558 | 0.484 | 0.399 |
| $ZrO_2$ | | | | | | | | | 0.011 | 0.011 |
| $La_2O_3$ | | | | | | | | | | |
| $SO_3$ | | | | | | | | | | |
| $WO_3$ | | | | | | | | | | |
| $Nb_2O_5$ | | | | | | | | | | |
| $Bi_2O_3$ | | | | | | | | | | |
| $MoO_3$ | | | | | | | | | | |
| $CeO_2 + TiO_2$ | 1.305 | 1.301 | 1.303 | 1.306 | 1.359 | 1.432 | 1.585 | 1.705 | 1.826 | 1.910 |
| $R_2O$ | 12.179 | 12.164 | 12.170 | 12.197 | 12.191 | 12.188 | 12.183 | 12.264 | 12.305 | 12.280 |
| $Li_2O + Na_2O$ | 11.976 | 11.961 | 11.966 | 11.994 | 11.986 | 11.984 | 11.980 | 12.060 | 12.100 | 12.074 |
| $R_2O - Al_2O_3$ | -2.597 | -2.635 | -2.679 | -2.592 | -2.620 | -2.633 | -2.578 | -2.472 | -2.418 | -2.381 |
| R'O | 5.092 | 5.104 | 5.121 | 5.093 | 5.122 | 5.136 | 5.125 | 5.108 | 5.074 | 5.044 |
| Thickness (mm) | 4.197 | 4.298 | 4.167 | 4.363 | 4.125 | 4.122 | 4.158 | 4.281 | 4.159 | 3.964 |
| L* | 93.75 | 93.71 | 93.64 | 93.7 | 93.88 | 93.95 | 94.17 | 94.36 | 94.69 | 95.1 |
| a* | -1.56 | 1.55 | -1.56 | -1.54 | -1.69 | -1.85 | -2.2 | -2.45 | -2.6 | -2.52 |
| b* | 16.22 | 16.4 | 16.57 | 16.29 | 16.68 | 16.98 | 17.87 | 18.42 | 18.03 | 16.21 |
| Density ($g/cm^3$) | 2.444 | | 2.446 | 2.445 | 2.446 | | 2.443 | 2.442 | 2.441 | |
| Liquidus Temp. (° C.) | | | | | | | | | | |

| Example | 241 | 242 | 243 | 244 | 245 | 246 | 247 | 248 | 249 | 250 |
|---|---|---|---|---|---|---|---|---|---|---|
| $SiO_2$ | 60.087 | 60.055 | 60.095 | 60.116 | 60.153 | 60.168 | 60.145 | 60.118 | 60.140 | 60.190 |
| $Al_2O_3$ | 14.651 | 14.728 | 14.688 | 14.686 | 14.656 | 14.675 | 14.666 | 14.690 | 14.688 | 14.665 |
| $B_2O_3$ | 5.989 | 5.983 | 5.987 | 5.984 | 5.985 | 5.974 | 5.973 | 5.959 | 5.969 | 5.961 |
| $P_2O_5$ | 0.000 | 0.000 | 0.000 | 0.000 | 0.000 | 0.000 | 0.000 | 0.000 | 0.000 | 0.000 |
| $Li_2O$ | 10.042 | 9.961 | 9.968 | 9.963 | 9.963 | 9.933 | 9.931 | 9.909 | 9.925 | 9.926 |
| $Na_2O$ | 2.027 | 2.036 | 2.031 | 2.036 | 2.040 | 2.032 | 2.044 | 2.049 | 2.032 | 2.032 |
| $K_2O$ | 0.203 | 0.205 | 0.206 | 0.203 | 0.204 | 0.203 | 0.204 | 0.203 | 0.201 | 0.203 |
| MgO | 0.518 | 0.516 | 0.517 | 0.517 | 0.508 | 0.510 | 0.511 | 0.512 | 0.510 | 0.506 |
| CaO | 4.523 | 4.545 | 4.531 | 4.521 | 4.510 | 4.521 | 4.524 | 4.535 | 4.533 | 4.527 |
| ZnO | 0.000 | 0.000 | 0.000 | 0.000 | 0.001 | 0.001 | 0.001 | 0.000 | 0.000 | 0.000 |
| $SnO_2$ | 0.012 | 0.012 | 0.015 | 0.017 | 0.017 | 0.016 | 0.028 | 0.034 | 0.024 | 0.020 |
| $Fe_2O_3$ | 0.006 | 0.006 | 0.006 | 0.006 | 0.006 | 0.006 | 0.006 | 0.006 | 0.006 | 0.006 |
| $TiO_2$ | 1.512 | 1.525 | 1.531 | 1.526 | 1.526 | 1.536 | 1.535 | 1.540 | 1.539 | 1.537 |
| $CeO_2$ | 0.401 | 0.398 | 0.394 | 0.392 | 0.398 | 0.395 | 0.396 | 0.402 | 0.397 | 0.399 |
| $ZrO_2$ | 0.014 | 0.014 | 0.015 | 0.017 | 0.019 | 0.015 | 0.021 | 0.027 | 0.020 | 0.015 |
| $La_2O_3$ | | | | | | | | | | |
| $SO_3$ | | | | | | | | | | |
| $WO_3$ | | | | | | | | | | |
| $Nb_2O_5$ | | | | | | | | | | |
| $Bi_2O_3$ | | | | | | | | | | |
| $MoO_3$ | | | | | | | | | | |
| $CeO_2 + TiO_2$ | 1.913 | 1.923 | 1.925 | 1.918 | 1.924 | 1.932 | 1.931 | 1.943 | 1.937 | 1.936 |
| $R_2O$ | 12.272 | 12.202 | 12.205 | 12.202 | 12.207 | 12.168 | 12.180 | 12.161 | 12.159 | 12.161 |
| $Li_2O + Na_2O$ | 12.069 | 11.997 | 11.999 | 11.999 | 12.003 | 11.965 | 11.975 | 11.958 | 11.957 | 11.958 |
| $R_2O - Al_2O_3$ | -2.379 | -2.526 | -2.482 | -2.484 | -2.449 | -2.507 | -2.486 | -2.529 | -2.529 | -2.504 |
| R'O | 5.042 | 5.061 | 5.049 | 5.038 | 5.019 | 5.031 | 5.036 | 5.048 | 5.043 | 5.033 |
| Thickness (mm) | 3.999 | 4.433 | 4.017 | 4.131 | 4.050 | 3.900 | 3.906 | 3.979 | 3.972 | 4.132 |

TABLE I-continued

| | | | | | | | | | | |
|---|---|---|---|---|---|---|---|---|---|---|
| L* | 95.13 | 95.17 | 95.14 | 95.18 | 95.17 | 95.16 | 95.3 | 95.27 | 95.2 | 95.11 |
| a* | −2.51 | −2.5 | −2.51 | −2.49 | −2.46 | −2.49 | −2.44 | −2.49 | −2.46 | −2.5 |
| b* | 16.02 | 15.9 | 15.93 | 15.76 | 15.57 | 15.79 | 15.18 | 15.49 | 15.49 | 15.87 |
| Density (g/cm³) | 2.438 | | | | | | | | | 2.438 |
| Liquidus Temp. (° C.) | | | | | | | | | | |

| Example | 251 | 252 | 253 | 254 | 255 | 256 | 257 | 258 | 259 | 260 |
|---|---|---|---|---|---|---|---|---|---|---|
| SiO₂ | 58.199 | 58.058 | 58.609 | 58.469 | 58.775 | 58.630 | 58.676 | 59.307 | 58.477 | 58.759 |
| Al₂O₃ | 16.223 | 16.266 | 16.263 | 16.460 | 16.189 | 16.387 | 16.250 | 16.526 | 16.342 | 16.414 |
| B₂O₃ | 5.981 | 5.921 | 5.875 | 5.985 | 5.920 | 5.870 | 5.954 | 5.580 | 5.840 | 5.601 |
| P₂O₅ | 0.000 | 0.000 | 0.000 | 0.000 | 0.000 | 0.000 | 0.000 | 0.000 | 0.000 | 0.000 |
| Li₂O | 12.137 | 12.097 | 11.826 | 11.595 | 11.599 | 11.584 | 11.725 | 11.691 | 11.860 | 11.821 |
| Na₂O | 6.086 | 6.085 | 6.114 | 6.176 | 6.115 | 6.149 | 6.084 | 6.079 | 6.163 | 6.141 |
| K₂O | 0.189 | 0.187 | 0.194 | 0.189 | 0.195 | 0.194 | 0.194 | 0.186 | 0.198 | 0.193 |
| MgO | 0.014 | 0.011 | 0.013 | 0.014 | 0.014 | 0.014 | 0.016 | 0.014 | 0.016 | 0.014 |
| CaO | 0.009 | 0.009 | 0.005 | 0.010 | 0.009 | 0.009 | 0.010 | 0.009 | 0.013 | 0.013 |
| ZnO | 0.000 | 0.000 | 0.000 | 0.000 | 0.000 | 0.000 | 0.000 | 0.000 | 0.000 | 0.000 |
| SnO₂ | 0.000 | 0.000 | 0.000 | 0.000 | 0.000 | 0.000 | 0.000 | 0.000 | 0.000 | 0.000 |
| Fe₂O₃ | 0.002 | 0.001 | 0.003 | 0.003 | 0.002 | 0.003 | 0.003 | 0.003 | 0.003 | 0.004 |
| TiO₂ | 0.952 | 0.955 | 0.987 | 0.982 | 0.971 | 0.982 | 0.973 | 0.493 | 0.977 | 0.977 |
| CeO₂ | 0.200 | 0.400 | 0.103 | 0.106 | 0.199 | 0.161 | 0.103 | 0.102 | 0.100 | 0.054 |
| ZrO₂ | | | | | | | | | | |
| La₂O₃ | | | | | | | | | | |
| SO₃ | | | | | | | | | | |
| WO₃ | | | | | | | | | | |
| Nb₂O₅ | | | | | | | | | | |
| Bi₂O₃ | | | | | | | | | | |
| MoO₃ | | | | | | | | | | |
| CeO₂ + TiO₂ | 1.152 | 1.355 | 1.090 | 1.088 | 1.170 | 1.143 | 1.076 | 0.595 | 1.077 | 1.031 |
| R₂O | 18.412 | 18.369 | 18.134 | 17.960 | 17.908 | 17.927 | 18.003 | 17.956 | 18.221 | 18.155 |
| Li₂O + Na₂O | 18.223 | 18.182 | 17.940 | 17.771 | 17.714 | 17.733 | 17.809 | 17.770 | 18.022 | 17.962 |
| R₂O − Al₂O₃ | 2.190 | 2.104 | 1.871 | 1.500 | 1.719 | 1.540 | 1.753 | 1.429 | 1.879 | 1.742 |
| R'O | 0.023 | 0.020 | 0.017 | 0.025 | 0.024 | 0.024 | 0.026 | 0.024 | 0.029 | 0.027 |
| Thickness (mm) | 1.307 | | 1.336 | 1.318 | 1.307 | 1.336 | 1.342 | | 1.322 | 1.343 |
| L* | 95.05 | | 96.71 | 96.69 | 96.05 | 96.61 | 96.59 | | 96.74 | 96.66 |
| a* | −0.8 | | −0.26 | −0.28 | −0.73 | −0.44 | −0.33 | | −0.28 | −0.14 |
| b* | 8.89 | | 1.46 | 1.5 | 5.28 | 2.41 | 1.41 | | 1.51 | 1.16 |
| Density (g/cm³) | | | | | | | | | | |
| Liquidus Temp. (° C.) | | | | | | | | | | |

| Example | 261 | 262 | 263 | 264 | 265 | 266 | 267 | 268 | 269 | 270 |
|---|---|---|---|---|---|---|---|---|---|---|
| SiO₂ | 58.511 | 58.511 | 58.538 | 58.515 | 58.649 | 58.452 | 58.373 | 58.402 | 58.367 | 57.989 |
| Al₂O₃ | 16.356 | 16.330 | 16.277 | 16.326 | 16.377 | 16.319 | 16.322 | 16.363 | 16.369 | 16.383 |
| B₂O₃ | 5.827 | 5.914 | 6.003 | 5.950 | 5.818 | 5.878 | 5.951 | 5.933 | 5.998 | 6.042 |
| P₂O₅ | 0.000 | 0.000 | 0.000 | 0.000 | 0.000 | 0.000 | 0.000 | 0.000 | 0.000 | 0.000 |
| Li₂O | 11.808 | 11.823 | 11.749 | 11.818 | 11.767 | 11.840 | 11.791 | 11.210 | 10.681 | 10.423 |
| Na₂O | 6.093 | 6.113 | 6.125 | 6.137 | 6.125 | 6.101 | 6.142 | 5.696 | 5.193 | 4.738 |
| K₂O | 0.192 | 0.192 | 0.194 | 0.193 | 0.193 | 0.192 | 0.196 | 0.193 | 0.195 | 0.195 |
| MgO | 0.013 | 0.016 | 0.014 | 0.016 | 0.014 | 0.016 | 0.019 | 0.021 | 0.031 | 0.035 |
| CaO | 0.011 | 0.011 | 0.011 | 0.011 | 0.011 | 0.011 | 0.013 | 0.978 | 1.963 | 2.970 |
| ZnO | 0.000 | 0.000 | 0.000 | 0.000 | 0.000 | 0.000 | 0.000 | 0.016 | 0.016 | 0.032 |
| SnO₂ | 0.000 | 0.000 | 0.000 | 0.000 | 0.000 | 0.000 | 0.000 | 0.003 | 0.003 | 0.001 |
| Fe₂O₃ | 0.002 | 0.004 | 0.004 | 0.004 | 0.004 | 0.003 | 0.003 | 0.003 | 0.003 | 0.003 |
| TiO₂ | 0.976 | 0.977 | 0.973 | 0.972 | 0.981 | 0.978 | 0.978 | 0.973 | 0.974 | 0.975 |
| CeO₂ | 0.199 | 0.099 | 0.100 | 0.050 | 0.049 | 0.200 | 0.201 | 0.198 | 0.201 | 0.201 |
| ZrO₂ | | | | | | | | | | |
| La₂O₃ | | | | | | | | | | |
| SO₃ | | | | | | | | | | |
| WO₃ | | | | | | | | | | |
| Nb₂O₅ | | | | | | | | | | |
| Bi₂O₃ | | | | | | | | | | |
| MoO₃ | | | | | | | | | | |
| CeO₂ + TiO₂ | 1.176 | 1.076 | 1.073 | 1.022 | 1.030 | 1.177 | 1.179 | 1.171 | 1.174 | 1.176 |
| R₂O | 18.093 | 18.128 | 18.068 | 18.147 | 18.085 | 18.133 | 18.129 | 17.099 | 16.069 | 15.356 |
| Li₂O + Na₂O | 17.901 | 17.936 | 17.874 | 17.954 | 17.892 | 17.941 | 17.933 | 16.906 | 15.874 | 15.161 |

TABLE I-continued

| | | | | | | | | | | |
|---|---|---|---|---|---|---|---|---|---|---|
| $R_2O - Al_2O_3$ | 1.738 | 1.799 | 1.791 | 1.820 | 1.708 | 1.814 | 1.807 | 0.736 | -0.300 | -1.027 |
| R'O | 0.024 | 0.027 | 0.026 | 0.027 | 0.026 | 0.027 | 0.032 | 1.015 | 2.009 | 3.037 |
| Thickness (mm) | 1.347 | 1.272 | 1.336 | 1.274 | | | | 0.712 | 0.722 | 0.692 |
| L* | 95.59 | 96.76 | 96.77 | 96.5 | | | | 96.48 | 96.57 | 96.59 |
| a* | -0.76 | -0.27 | -0.29 | -0.59 | | | | -0.37 | -0.32 | -0.28 |
| b* | 7.04 | 1.42 | 1.52 | 3.58 | | | | 2.57 | 1.68 | 1.54 |
| Density (g/cm³) | | | | | | | | | | |
| Liquidus Temp. (° C.) | | | | | | | | | | |

| Example | 271 | 272 | 273 | 274 | 275 | 276 | 277 | 278 | 279 | 280 |
|---|---|---|---|---|---|---|---|---|---|---|
| $SiO_2$ | 57.677 | 59.209 | 59.955 | 58.314 | 60.377 | 59.543 | 60.528 | 60.314 | 61.472 | 60.280 |
| $Al_2O_3$ | 16.598 | 16.296 | 16.473 | 16.409 | 15.513 | 15.983 | 15.053 | 15.076 | 14.543 | 15.163 |
| $B_2O_3$ | 6.075 | 6.018 | 6.029 | 5.942 | 5.928 | 5.900 | 5.913 | 6.022 | 5.921 | 5.811 |
| $P_2O_5$ | 0.000 | 0.000 | 0.000 | 0.000 | 0.000 | 0.000 | 0.000 | 0.000 | 0.000 | 0.000 |
| $Li_2O$ | 9.908 | 10.380 | 9.937 | 9.702 | 8.653 | 8.692 | 10.037 | 10.078 | 9.924 | 9.955 |
| $Na_2O$ | 4.237 | 4.716 | 4.177 | 4.237 | 1.410 | 1.522 | 1.842 | 1.855 | 1.831 | 1.865 |
| $K_2O$ | 0.195 | 0.197 | 0.193 | 0.197 | 0.195 | 0.194 | 0.196 | 0.196 | 0.193 | 0.197 |
| MgO | 0.045 | 0.029 | 0.031 | 0.044 | 2.883 | 5.050 | 2.025 | 2.023 | 1.916 | 2.022 |
| CaO | 4.039 | 1.960 | 1.985 | 3.959 | 3.826 | 1.878 | 2.095 | 2.114 | 1.992 | 2.131 |
| ZnO | 0.016 | 0.016 | 0.024 | 0.000 | 0.000 | 0.000 | 1.065 | 1.073 | 1.005 | 1.102 |
| $SnO_2$ | 0.002 | 0.002 | 0.003 | 0.000 | 0.000 | 0.000 | 0.002 | 0.002 | 0.005 | 0.003 |
| $Fe_2O_3$ | 0.004 | 0.003 | 0.003 | 0.003 | 0.003 | 0.003 | 0.003 | 0.004 | 0.004 | 0.002 |
| $TiO_2$ | 0.987 | 0.969 | 0.978 | 0.976 | 0.993 | 1.015 | 1.015 | 1.015 | 0.986 | 1.024 |
| $CeO_2$ | 0.203 | 0.199 | 0.199 | 0.202 | 0.209 | 0.213 | 0.216 | 0.218 | 0.201 | 0.424 |
| $ZrO_2$ | | | | | | | | | | |
| $La_2O_3$ | | | | | | | | | | |
| $SO_3$ | | | | | | | | | | |
| $WO_3$ | | | | | | | | | | |
| $Nb_2O_5$ | | | | | | | | | | |
| $Bi_2O_3$ | | | | | | | | | | |
| $MoO_3$ | | | | | | | | | | |
| $CeO_2 + TiO_2$ | 1.191 | 1.168 | 1.177 | 1.178 | 1.202 | 1.228 | 1.230 | 1.233 | 1.187 | 1.448 |
| $R_2O$ | 14.339 | 15.292 | 14.307 | 14.137 | 10.258 | 10.407 | 12.075 | 12.130 | 11.948 | 12.017 |
| $Li_2O + Na_2O$ | 14.145 | 15.096 | 14.114 | 13.940 | 10.063 | 10.213 | 11.879 | 11.933 | 11.756 | 11.820 |
| $R_2O - Al_2O_3$ | -2.259 | -1.003 | -2.166 | -2.272 | -5.255 | -5.576 | -2.979 | -2.946 | -2.594 | -3.146 |
| R'O | 4.100 | 2.004 | 2.039 | 4.003 | 6.709 | 6.928 | 5.185 | 5.210 | 4.913 | 5.255 |
| Thickness (mm) | 0.675 | 0.627 | 1.378 | 0.675 | 1.322 | 1.332 | 1.349 | 1.333 | 1.343 | 1.349 |
| L* | 96.59 | 96.63 | 96.68 | 96.59 | 96.62 | 96.64 | 96.6 | 96.61 | 96.68 | 96.25 |
| a* | -0.25 | -0.23 | -0.35 | -0.25 | -0.33 | -0.32 | -0.38 | -0.38 | -0.28 | -0.83 |
| b* | 1.34 | 1.29 | 1.79 | 1.34 | 1.63 | 1.56 | 1.95 | 2 | 1.45 | 4.74 |
| Density (g/cm³) | | | | | | | | | | |
| Liquidus Temp. (° C.) | | | | | | | | | | |

| Example | 281 | 282 | 283 | 284 | 285 | 286 | 287 | 288 | 289 | 290 |
|---|---|---|---|---|---|---|---|---|---|---|
| $SiO_2$ | 61.125 | 60.995 | 60.539 | 60.743 | 59.214 | 59.453 | 61.006 | 61.358 | 60.911 | 60.803 |
| $Al_2O_3$ | 14.651 | 14.714 | 15.081 | 14.925 | 15.593 | 15.651 | 14.781 | 15.141 | 14.731 | 14.640 |
| $B_2O_3$ | 5.896 | 5.860 | 5.892 | 5.885 | 6.096 | 6.051 | 5.953 | 5.253 | 5.980 | 5.979 |
| $P_2O_5$ | 0.000 | 0.050 | 0.000 | 0.000 | 0.000 | 0.000 | 0.000 | 0.005 | 0.000 | 0.050 |
| $Li_2O$ | 10.003 | 9.977 | 9.977 | 9.982 | 10.145 | 9.941 | 9.813 | 9.591 | 9.903 | 9.987 |
| $Na_2O$ | 1.833 | 1.840 | 1.866 | 1.859 | 1.807 | 1.835 | 1.760 | 1.798 | 1.811 | 1.741 |
| $K_2O$ | 0.193 | 0.190 | 0.192 | 0.195 | 0.176 | 0.179 | 0.175 | 0.184 | 0.186 | 0.171 |
| MgO | 1.938 | 1.959 | 2.011 | 1.495 | 2.228 | 2.243 | 2.090 | 2.014 | 2.007 | 2.048 |
| CaO | 2.029 | 2.049 | 2.110 | 2.094 | 2.289 | 2.258 | 2.136 | 2.121 | 2.088 | 2.133 |
| ZnO | 1.017 | 1.034 | 1.068 | 1.591 | 1.189 | 1.113 | 1.072 | 1.067 | 1.055 | 1.133 |
| $SnO_2$ | 0.104 | 0.101 | 0.002 | 0.003 | 0.000 | 0.000 | 0.001 | 0.001 | 0.102 | 0.101 |
| $Fe_2O_3$ | 0.004 | 0.004 | 0.004 | 0.003 | 0.004 | 0.004 | 0.004 | 0.002 | 0.003 | 0.003 |
| $TiO_2$ | 0.994 | 1.002 | 1.016 | 1.007 | 1.034 | 1.041 | 0.995 | 1.031 | 1.005 | 0.993 |
| $CeO_2$ | 0.206 | 0.208 | 0.214 | 0.208 | 0.219 | 0.218 | 0.209 | 0.427 | 0.210 | 0.212 |
| $ZrO_2$ | | | | | | | | | | |
| $La_2O_3$ | | | | | | | | | | |
| $SO_3$ | | | | | | | | | | |
| $WO_3$ | | | | | | | | | | |
| $Nb_2O_5$ | | | | | | | | | | |
| $Bi_2O_3$ | | | | | | | | | | |
| $MoO_3$ | | | | | | | | | | |
| $CeO_2 + TiO_2$ | 1.201 | 1.210 | 1.230 | 1.215 | 1.253 | 1.259 | 1.203 | 1.458 | 1.214 | 1.204 |
| $R_2O$ | 12.028 | 12.007 | 12.035 | 12.036 | 12.128 | 11.954 | 11.748 | 11.573 | 11.900 | 11.899 |
| $Li_2O + Na_2O$ | 11.835 | 11.817 | 11.843 | 11.841 | 11.952 | 11.775 | 11.572 | 11.389 | 11.713 | 11.728 |

TABLE I-continued

| | | | | | | | | | | |
|---|---|---|---|---|---|---|---|---|---|---|
| R₂O − Al₂O₃ | −2.623 | −2.707 | −3.046 | −2.889 | −3.466 | −3.698 | −3.034 | −3.568 | −2.831 | −2.741 |
| R'O | 4.984 | 5.042 | 5.190 | 5.180 | 5.705 | 5.615 | 5.298 | 5.202 | 5.150 | 5.314 |
| Thickness (mm) | 1.339 | 1.371 | 1.381 | 1.369 | 1.354 | 1.375 | 1.414 | 1.411 | 1.401 | 1.404 |
| L* | 96.63 | 96.59 | 96.64 | 96.57 | 96.56 | 96.59 | 96.57 | 96.26 | 96.6 | 96.63 |
| a* | −0.27 | −0.31 | −0.29 | −0.41 | −0.42 | −0.41 | −0.32 | −0.87 | −0.32 | −0.31 |
| b* | 1.67 | 1.88 | 1.56 | 2.15 | 2.15 | 2.11 | 2.01 | 4.96 | 1.91 | 1.83 |
| Density (g/cm³) | | | | | | | | | | |
| Liquidus Temp. (° C.) | | | | | | | | | | |

| Example | 291 | 292 | 293 | 294 | 295 | 296 | 297 | 298 | 299 | 300 |
|---|---|---|---|---|---|---|---|---|---|---|
| SiO₂ | 59.468 | 60.460 | 64.701 | 64.666 | 64.271 | 64.556 | 64.764 | 64.074 | 63.986 | 63.749 |
| Al₂O₃ | 15.686 | 15.286 | 12.988 | 12.996 | 12.892 | 13.024 | 12.961 | 12.946 | 12.937 | 12.770 |
| B₂O₃ | 6.026 | 5.992 | 5.829 | 5.809 | 5.719 | 5.828 | 5.744 | 5.642 | 5.779 | 5.715 |
| P₂O₅ | 0.000 | 0.000 | 0.000 | 0.000 | 0.000 | 0.000 | 0.000 | 0.000 | 0.000 | 0.000 |
| Li₂O | 9.952 | 9.668 | 11.984 | 12.021 | 11.714 | 12.066 | 10.021 | 9.964 | 9.946 | 9.646 |
| Na₂O | 1.796 | 1.815 | 2.807 | 2.803 | 2.732 | 2.821 | 1.837 | 1.822 | 1.821 | 1.783 |
| K₂O | 0.178 | 0.185 | 0.195 | 0.196 | 0.186 | 0.198 | 0.196 | 0.198 | 0.197 | 0.188 |
| MgO | 2.212 | 1.561 | 0.009 | 0.009 | 0.008 | 0.009 | 0.034 | 0.030 | 0.033 | 0.030 |
| CaO | 2.233 | 2.157 | 0.009 | 0.012 | 0.010 | 0.010 | 2.935 | 2.978 | 2.964 | 2.915 |
| ZnO | 1.152 | 1.616 | 0.000 | 0.000 | 0.000 | 0.000 | 0.000 | 0.000 | 0.000 | 0.000 |
| SnO₂ | 0.001 | 0.000 | 0.050 | 0.052 | 0.044 | 0.051 | 0.047 | 0.049 | 0.048 | 0.040 |
| Fe₂O₃ | 0.004 | 0.003 | 0.002 | 0.002 | 0.002 | 0.002 | 0.003 | 0.003 | 0.003 | 0.003 |
| TiO₂ | 1.041 | 1.030 | 0.980 | 0.984 | 0.972 | 0.981 | 0.982 | 0.983 | 0.976 | 0.966 |
| CeO₂ | 0.223 | 0.219 | 0.201 | 0.205 | 0.200 | 0.207 | 0.200 | 0.203 | 0.206 | 0.195 |
| ZrO₂ | | | | | | | | | | |
| La₂O₃ | | | | | | | | | | |
| SO₃ | | | | | | | | | | |
| WO₃ | | | | | | | | | | |
| Nb₂O₅ | | | | | | | | | | |
| Bi₂O₃ | | | | | | | | | | |
| MoO₃ | | | | | | | | | | |
| CeO₂ + TiO₂ | 1.264 | 1.249 | 1.181 | 1.188 | 1.172 | 1.187 | 1.182 | 1.185 | 1.182 | 1.161 |
| R₂O | 11.926 | 11.669 | 14.985 | 15.020 | 14.632 | 15.085 | 12.053 | 11.984 | 11.964 | 11.617 |
| Li₂O + Na₂O | 11.748 | 11.484 | 14.791 | 14.824 | 14.446 | 14.887 | 11.857 | 11.786 | 11.767 | 11.429 |
| R₂O − Al₂O₃ | −3.760 | 3.617 | 1.997 | 2.024 | 1.740 | 2.061 | −0.908 | −0.962 | −0.974 | −1.153 |
| R'O | 5.597 | 5.333 | 0.018 | 0.022 | 0.018 | 0.019 | 2.969 | 3.008 | 2.997 | 2.945 |
| Thickness (mm) | 1.315 | 1.332 | 1.263 | 1.324 | 1.272 | 1.261 | 1.263 | 1.304 | 1.321 | 1.327 |
| L* | 96.66 | 96.61 | 96.73 | 96.77 | 96.79 | 96.8 | 96.77 | 96.77 | 96.77 | 96.78 |
| a* | −0.27 | −0.41 | −0.34 | −0.36 | −0.34 | −0.33 | −0.26 | −0.28 | −0.28 | −0.23 |
| b* | 1.44 | 2.11 | 1.83 | 1.89 | 1.81 | 1.75 | 1.43 | 1.51 | 1.56 | 1.4 |
| Density (g/cm³) | | | | | | | | | | |
| Liquidus Temp. (° C.) | | | | | | | | | | |

| Example | 301 | 302 | 303 | 304 | 305 | 306 | 307 | 308 | 309 | 310 |
|---|---|---|---|---|---|---|---|---|---|---|
| SiO₂ | 63.775 | 62.413 | 58.673 | 57.445 | 59.730 | 58.759 | 60.601 | 61.581 | 62.137 | 61.463 |
| Al₂O₃ | 12.781 | 14.797 | 17.014 | 16.961 | 16.736 | 16.344 | 14.931 | 14.390 | 14.227 | 14.564 |
| B₂O₃ | 5.553 | 5.933 | 5.551 | 6.208 | 5.451 | 6.259 | 5.818 | 5.932 | 5.692 | 5.707 |
| P₂O₅ | 0.000 | 0.000 | 0.000 | 0.000 | 0.000 | 0.000 | 0.000 | 0.000 | 0.000 | 0.000 |
| Li₂O | 9.666 | 8.872 | 8.827 | 9.475 | 8.846 | 9.693 | 10.043 | 9.657 | 9.644 | 9.999 |
| Na₂O | 1.784 | 1.356 | 1.414 | 1.390 | 1.407 | 1.399 | 1.862 | 1.852 | 1.855 | 1.837 |
| K₂O | 0.189 | 0.003 | 0.190 | 0.186 | 0.193 | 0.190 | 0.195 | 0.195 | 0.197 | 0.186 |
| MgO | 0.030 | 2.804 | 2.224 | 2.225 | 2.132 | 2.070 | 1.986 | 1.871 | 1.894 | 2.013 |
| CaO | 2.932 | 1.938 | 4.900 | 4.803 | 4.724 | 4.534 | 2.068 | 1.982 | 1.964 | 1.994 |
| ZnO | 0.000 | 0.984 | 0.000 | 0.000 | 0.000 | 0.000 | 1.044 | 1.001 | 0.996 | 1.022 |
| SnO₂ | 0.040 | 0.005 | 0.000 | 0.000 | 0.000 | 0.000 | 0.000 | 0.000 | 0.000 | 0.000 |
| Fe₂O₃ | 0.003 | 0.002 | 0.005 | 0.004 | 0.004 | 0.004 | 0.002 | 0.001 | 0.002 | 0.003 |
| TiO₂ | 0.964 | 0.587 | 1.079 | 1.066 | 0.543 | 0.518 | 1.015 | 0.980 | 0.983 | 0.999 |
| CeO₂ | 0.198 | 0.303 | 0.116 | 0.228 | 0.225 | 0.222 | 0.425 | 0.552 | 0.402 | 0.203 |
| ZrO₂ | | | | | | | | | | |
| La₂O₃ | | | | | | | | | | |
| SO₃ | | | | | | | | | | |
| WO₃ | | | | | | | | | | |
| Nb₂O₅ | | | | | | | | | | |
| Bi₂O₃ | | | | | | | | | | |
| MoO₃ | | | | | | | | | | |
| CeO₂ + TiO₂ | 1.162 | 0.890 | 1.195 | 1.294 | 0.768 | 0.740 | 1.441 | 1.531 | 1.384 | 1.202 |
| R₂O | 11.639 | 10.231 | 10.431 | 11.051 | 10.447 | 11.282 | 12.100 | 11.704 | 11.696 | 12.023 |

TABLE I-continued

| | | | | | | | | | | |
|---|---|---|---|---|---|---|---|---|---|---|
| $Li_2O + Na_2O$ | 11.450 | 10.228 | 10.241 | 10.865 | 10.253 | 11.092 | 11.905 | 11.509 | 11.499 | 11.837 |
| $R_2O - Al_2O_3$ | −1.142 | −4.566 | −6.583 | −5.910 | −6.289 | −5.062 | −2.831 | −2.686 | −2.530 | −2.541 |
| R'O | 2.961 | 5.726 | 7.124 | 7.028 | 6.856 | 6.604 | 5.099 | 4.853 | 4.854 | 5.029 |
| Thickness (mm) | 1.28 | 1.299 | | | | | 1.362 | | 1.335 | 1.322 |
| L* | 96.79 | 96.55 | | | | | 96.22 | | 96.11 | 96.44 |
| a* | −0.21 | −0.31 | | | | | −0.87 | | −0.91 | −0.38 |
| b* | 1.32 | 1.69 | | | | | 5.0 | | 5.37 | 2.02 |
| Density (g/cm³) | | | | | | | | | | 2.426 |
| Liquidus Temp. (° C.) | | | | | | | | | | 1140 |

| Example | 311 | 312 | 313 | 314 | 315 | 316 | 317 | 318 | 319 | 320 |
|---|---|---|---|---|---|---|---|---|---|---|
| $SiO_2$ | 60.804 | 60.576 | 60.231 | 61.469 | 62.340 | 61.703 | 60.724 | 61.098 | 62.294 | 61.677 |
| $Al_2O_3$ | 14.714 | 14.504 | 14.428 | 14.810 | 14.326 | 14.629 | 14.698 | 14.431 | 14.644 | 14.862 |
| $B_2O_3$ | 5.689 | 5.677 | 5.662 | 5.655 | 5.495 | 5.395 | 5.497 | 5.644 | 5.810 | 5.787 |
| $P_2O_5$ | 0.000 | 0.000 | 0.000 | 0.000 | 0.000 | 0.000 | 0.000 | 0.000 | 0.000 | 0.000 |
| $Li_2O$ | 10.162 | 10.324 | 10.089 | 10.236 | 10.071 | 9.945 | 9.983 | 10.156 | 10.125 | 10.095 |
| $Na_2O$ | 1.841 | 1.828 | 1.807 | 1.873 | 1.841 | 1.839 | 1.829 | 1.816 | 1.867 | 1.902 |
| $K_2O$ | 0.187 | 0.179 | 0.182 | 0.191 | 0.183 | 0.189 | 0.189 | 0.186 | 0.191 | 0.191 |
| MgO | 2.067 | 2.025 | 2.019 | 2.052 | 1.960 | 2.001 | 2.049 | 1.991 | 2.043 | 2.114 |
| CaO | 2.041 | 2.000 | 1.995 | 2.039 | 1.961 | 2.024 | 2.036 | 1.972 | 2.007 | 2.088 |
| ZnO | 1.057 | 1.074 | 1.083 | 1.040 | 1.018 | 1.043 | 1.053 | 1.005 | 0.994 | 1.047 |
| $SnO_2$ | 0.000 | 0.000 | 0.000 | 0.000 | 0.000 | 0.000 | 0.000 | 0.000 | 0.000 | 0.000 |
| $Fe_2O_3$ | 0.002 | 0.002 | 0.002 | 0.002 | 0.001 | 0.002 | 0.002 | 0.002 | 0.004 | 0.003 |
| $TiO_2$ | 1.011 | 0.991 | 0.988 | 0.206 | 0.394 | 0.806 | 1.514 | 1.490 | 0.008 | 0.008 |
| $CeO_2$ | 0.416 | 0.811 | 1.505 | 0.417 | 0.400 | 0.413 | 0.416 | 0.204 | 0.002 | 0.210 |
| $ZrO_2$ | | | | | | | | | | |
| $La_2O_3$ | | | | | | | | | | |
| $SO_3$ | | | | | 0.002 | | | | | 0.005 |
| $WO_3$ | | | | | | | | | | |
| $Nb_2O_5$ | | | | | | | | | | |
| $Bi_2O_3$ | | | | | | | | | | |
| $MoO_3$ | | | | | | | | | | |
| $CeO_2 + TiO_2$ | 1.427 | 1.802 | 2.493 | 0.623 | 0.794 | 1.219 | 1.930 | 1.694 | 0.010 | 0.218 |
| $R_2O$ | 12.190 | 12.332 | 12.078 | 12.299 | 12.096 | 11.973 | 12.001 | 12.158 | 12.184 | 12.189 |
| $Li_2O + Na_2O$ | 12.002 | 12.152 | 11.895 | 12.108 | 11.912 | 11.783 | 11.811 | 11.972 | 11.993 | 11.998 |
| $R_2O - Al_2O_3$ | −2.524 | −2.172 | −2.350 | −2.510 | −2.230 | −2.656 | −2.697 | −2.273 | −2.460 | −2.673 |
| R'O | 5.165 | 5.099 | 5.098 | 5.131 | 4.939 | 5.069 | 5.138 | 4.968 | 5.045 | 5.248 |
| Thickness (mm) | 1.317 | 1.3 | 1.302 | 1.317 | 1.306 | 1.297 | 1.294 | 1.306 | 1.303 | 1.305 |
| L* | 96.16 | 95.24 | 78.05 | 96.40 | 96.39 | 96.26 | 91.74 | 96.35 | 96.69 | 96.61 |
| a* | −0.76 | −1.27 | 1.20 | −0.28 | −0.34 | −0.59 | −1.67 | −0.67 | 0.00 | −0.11 |
| b* | 4.40 | 9.54 | 50.71 | 1.90 | 2.25 | 3.50 | 24.78 | 3.67 | 0.20 | 0.78 |
| Density (g/cm³) | 2.442 | 2.46 | 2.497 | 2.432 | 2.437 | 2.435 | 2.447 | 2.434 | | |
| Liquidus Temp. (° C.) | 1155 | 1165 | 1160 | 1155 | 1160 | 1150 | 1165 | 1155 | | |

| Example | 321 | 322 | 323 | 324 | 325 | 326 | 327 | 328 | 329 | 330 |
|---|---|---|---|---|---|---|---|---|---|---|
| $SiO_2$ | 61.698 | 61.353 | 61.076 | 61.998 | 61.764 | 61.536 | 61.663 | 61.249 | 60.429 | 61.303 |
| $Al_2O_3$ | 14.856 | 14.696 | 14.518 | 14.656 | 14.822 | 14.693 | 14.631 | 14.539 | 14.544 | 14.612 |
| $B_2O_3$ | 5.763 | 5.805 | 5.715 | 5.892 | 5.795 | 5.770 | 5.640 | 5.794 | 5.777 | 5.777 |
| $P_2O_5$ | 0.000 | 0.000 | 0.000 | 0.000 | 0.000 | 0.000 | 0.000 | 0.000 | 0.000 | 0.000 |
| $Li_2O$ | 9.914 | 10.046 | 9.942 | 10.168 | 9.987 | 9.985 | 9.823 | 9.855 | 9.910 | 9.933 |
| $Na_2O$ | 1.896 | 1.870 | 1.850 | 1.874 | 1.884 | 1.923 | 1.896 | 1.867 | 1.868 | 1.888 |
| $K_2O$ | 0.193 | 0.187 | 0.185 | 0.187 | 0.193 | 0.195 | 0.194 | 0.187 | 0.191 | 0.189 |
| MgO | 2.093 | 2.078 | 2.037 | 2.032 | 2.085 | 2.073 | 2.067 | 2.058 | 2.064 | 2.030 |
| CaO | 2.083 | 2.058 | 2.036 | 1.999 | 2.051 | 2.018 | 2.039 | 2.013 | 2.029 | 2.006 |
| ZnO | 1.060 | 1.063 | 1.094 | 0.978 | 0.999 | 0.998 | 1.021 | 1.012 | 1.021 | 1.006 |
| $SnO_2$ | 0.000 | 0.000 | 0.000 | 0.000 | 0.000 | 0.000 | 0.000 | 0.000 | 0.000 | 0.000 |
| $Fe_2O_3$ | 0.002 | 0.001 | 0.001 | 0.004 | 0.004 | 0.004 | 0.003 | 0.001 | 0.001 | 0.001 |
| $TiO_2$ | 0.007 | 0.008 | 0.007 | 0.199 | 0.405 | 0.593 | 0.593 | 0.583 | 0.588 | 0.198 |
| $CeO_2$ | 0.417 | 0.823 | 1.527 | 0.003 | 0.001 | 0.198 | 0.415 | 0.827 | 1.565 | 1.041 |
| $ZrO_2$ | | | | | | | | | | |
| $La_2O_3$ | | | | | | | | | | |
| $SO_3$ | 0.002 | | | | | | 0.001 | | | 0.001 |
| $WO_3$ | | | | | | | | | | |
| $Nb_2O_5$ | | | | | | 0.004 | 0.003 | | | |
| $Bi_2O_3$ | | | | | | | | | | |
| $MoO_3$ | | | | | | | | | | |
| $CeO_2 + TiO_2$ | 0.424 | 0.831 | 1.534 | 0.202 | 0.406 | 0.791 | 1.008 | 1.411 | 2.153 | 1.238 |
| $R_2O$ | 12.004 | 12.103 | 11.977 | 12.229 | 12.063 | 12.103 | 11.913 | 11.910 | 11.968 | 12.011 |
| $Li_2O + Na_2O$ | 11.811 | 11.916 | 11.792 | 12.042 | 11.870 | 11.908 | 11.719 | 11.722 | 11.778 | 11.821 |
| $R_2O - Al_2O_3$ | −2.852 | −2.593 | −2.540 | −2.428 | −2.759 | −2.590 | −2.718 | −2.629 | −2.576 | −2.601 |

TABLE I-continued

| | | | | | | | | | | |
|---|---|---|---|---|---|---|---|---|---|---|
| R'O | 5.237 | 5.199 | 5.167 | 5.010 | 5.135 | 5.089 | 5.126 | 5.083 | 5.113 | 5.042 |
| Thickness (mm) | 1.3 | 1.304 | 1.286 | 1.309 | 1.305 | 1.319 | 1.328 | 1.326 | 1.321 | 1.314 |
| L* | 96.45 | 95.83 | 94.16 | 96.67 | 96.73 | 96.53 | 96.30 | 95.50 | 88.89 | 95.31 |
| a* | −0.22 | −0.34 | −0.22 | −0.01 | 0.00 | −0.20 | −0.45 | −0.82 | −0.98 | −0.49 |
| b* | 1.63 | 4.04 | 8.95 | 0.21 | 0.21 | 1.27 | 2.86 | 6.82 | 21.58 | 6.20 |
| Density (g/cm$^3$) | | | | | | 2.423 | 2.432 | 2.457 | 2.489 | 2.462 |
| Liquidus Temp. (° C.) | | | | | | 1190 | 1170 | 1140 | 1155 | 1150 |

| Example | 331 | 332 | 333 | 334 | 335 | 336 | 337 | 338 | 339 | 340 |
|---|---|---|---|---|---|---|---|---|---|---|
| SiO$_2$ | 61.406 | 60.866 | 60.079 | 61.338 | 62.505 | 62.054 | 60.320 | 62.899 | 62.147 | 59.768 |
| Al$_2$O$_3$ | 14.507 | 14.529 | 14.559 | 14.593 | 14.503 | 14.478 | 14.321 | 14.494 | 14.610 | 14.583 |
| B$_2$O$_3$ | 5.685 | 5.727 | 5.761 | 5.850 | 5.737 | 5.791 | 5.779 | 5.725 | 5.652 | 5.703 |
| P$_2$O$_5$ | 0.000 | 0.000 | 0.000 | 0.000 | 0.000 | 0.000 | 0.000 | 0.000 | 0.000 | 0.000 |
| Li$_2$O | 9.875 | 9.927 | 9.953 | 9.969 | 8.673 | 9.182 | 11.182 | 9.853 | 9.914 | 9.943 |
| Na$_2$O | 1.878 | 1.870 | 1.869 | 1.877 | 1.855 | 1.849 | 1.829 | 0.390 | 0.975 | 3.299 |
| K$_2$O | 0.186 | 0.186 | 0.184 | 0.188 | 0.191 | 0.191 | 0.190 | 0.190 | 0.193 | 0.192 |
| MgO | 2.025 | 2.035 | 2.043 | 2.050 | 2.049 | 2.031 | 2.001 | 2.027 | 2.042 | 2.040 |
| CaO | 1.999 | 2.006 | 2.002 | 1.994 | 2.020 | 1.985 | 1.964 | 1.987 | 2.004 | 2.018 |
| ZnO | 0.993 | 1.009 | 1.004 | 1.002 | 1.048 | 1.029 | 1.011 | 1.019 | 1.037 | 1.029 |
| SnO$_2$ | 0.000 | 0.000 | 0.000 | 0.000 | 0.000 | 0.000 | 0.000 | 0.000 | 0.000 | 0.000 |
| Fe$_2$O$_3$ | 0.001 | 0.001 | 0.001 | 0.001 | 0.003 | 0.003 | 0.003 | 0.003 | 0.003 | 0.003 |
| TiO$_2$ | 0.387 | 0.781 | 1.468 | 0.294 | 0.999 | 0.993 | 0.991 | 0.996 | 1.000 | 0.999 |
| CeO$_2$ | 1.039 | 1.040 | 1.043 | 0.834 | 0.407 | 0.406 | 0.400 | 0.408 | 0.414 | 0.408 |
| ZrO$_2$ | | | | | | | | | | |
| La$_2$O$_3$ | | | | | | | | | | |
| SO$_3$ | 0.004 | 0.010 | 0.020 | | | | | | | |
| WO$_3$ | | | | | | | | | | |
| Nb$_2$O$_5$ | | | | | | | | | | |
| Bi$_2$O$_3$ | | | | | | | | | | |
| MoO$_3$ | | | | | | | | | | |
| CeO$_2$ + TiO$_2$ | 1.426 | 1.821 | 2.511 | 1.128 | 1.406 | 1.398 | 1.391 | 1.404 | 1.414 | 1.407 |
| R$_2$O | 11.939 | 11.982 | 12.006 | 12.034 | 10.719 | 11.221 | 13.200 | 10.433 | 11.082 | 13.434 |
| Li$_2$O + Na$_2$O | 11.754 | 11.796 | 11.822 | 11.846 | 10.528 | 11.031 | 13.011 | 10.243 | 10.889 | 13.243 |
| R$_2$O − Al$_2$O$_3$ | −2.567 | −2.547 | −2.553 | −2.559 | −3.784 | −3.257 | −1.121 | −4.061 | −3.528 | −1.148 |
| R'O | 5.017 | 5.050 | 5.050 | 5.045 | 5.118 | 5.044 | 4.976 | 5.033 | 5.083 | 5.088 |
| Thickness (mm) | 1.316 | 1.299 | 1.317 | 1.328 | 1.318 | 1.321 | 1.358 | 1.31 | 1.309 | 1.314 |
| L* | 94.98 | 93.05 | 78.73 | 95.79 | 96.36 | 96.27 | 96.05 | 96.35 | 96.26 | 95.50 |
| a* | −0.71 | −1.51 | 3.11 | −0.50 | −0.53 | 0.61 | 0.87 | −0.53 | −0.61 | −1.11 |
| b* | 8.07 | 15.87 | 66.05 | 4.71 | 2.96 | 3.51 | 5.36 | 2.86 | 3.37 | 7.62 |
| Density (g/cm$^3$) | 2.465 | 2.463 | 2.477 | 2.454 | 2.434 | 2.438 | 2.451 | 2.43 | 2.435 | 2.452 |
| Liquidus Temp. (° C.) | 1185 | 1145 | 1150 | 1150 | | | | | | |

| Example | 341 | 342 | 343 | 344 | 345 | 346 | 347 | 348 | 349 | 350 |
|---|---|---|---|---|---|---|---|---|---|---|
| SiO$_2$ | 62.861 | 63.118 | 63.125 | 61.304 | 61.305 | 61.386 | 60.739 | 60.354 | 60.167 | 60.820 |
| Al$_2$O$_3$ | 14.549 | 14.510 | 14.461 | 14.333 | 14.155 | 14.179 | 14.661 | 14.740 | 14.708 | 14.725 |
| B$_2$O$_3$ | 5.958 | 5.797 | 5.918 | 5.931 | 5.988 | 5.932 | 5.856 | 6.086 | 6.048 | 5.857 |
| P$_2$O$_5$ | 0.000 | 0.000 | 0.000 | 0.000 | 0.000 | 0.000 | 0.000 | 0.000 | 0.000 | 0.000 |
| Li$_2$O | 10.097 | 10.044 | 10.014 | 9.879 | 10.270 | 10.157 | 10.088 | 10.193 | 10.326 | 10.041 |
| Na$_2$O | 1.857 | 1.858 | 1.850 | 1.880 | 1.890 | 1.868 | 1.857 | 1.901 | 1.944 | 1.911 |
| K$_2$O | 0.193 | 0.192 | 0.190 | 0.193 | 0.192 | 0.194 | 0.375 | 0.191 | 0.197 | 0.192 |
| MgO | 0.030 | 2.051 | 1.523 | 1.999 | 1.869 | 1.938 | 1.988 | 2.034 | 2.067 | 1.972 |
| CaO | 2.014 | 0.023 | 1.501 | 2.066 | 1.968 | 1.970 | 2.009 | 2.066 | 2.087 | 2.042 |
| ZnO | 1.032 | 1.011 | 0.016 | 1.011 | 0.977 | 0.990 | 1.002 | 1.007 | 1.019 | 0.998 |
| SnO$_2$ | 0.000 | 0.000 | 0.000 | 0.000 | 0.000 | 0.000 | 0.000 | 0.000 | 0.000 | 0.000 |
| Fe$_2$O$_3$ | 0.003 | 0.002 | 0.003 | 0.003 | 0.003 | 0.003 | 0.003 | 0.003 | 0.003 | 0.003 |
| TiO$_2$ | 0.989 | 0.983 | 0.988 | 0.978 | 0.970 | 0.968 | 0.994 | 1.000 | 1.002 | 1.002 |
| CeO$_2$ | 0.406 | 0.404 | 0.401 | 0.406 | 0.397 | 0.398 | 0.410 | 0.410 | 0.417 | 0.411 |
| ZrO$_2$ | | | | | | | | | | |
| La$_2$O$_3$ | | | | | | | | | | |
| SO$_3$ | | | | | | | | | | | 0.007 |
| WO$_3$ | | | | | | | | | | |
| Nb$_2$O$_5$ | | | | | | | | | | |
| Bi$_2$O$_3$ | | | | | | | | | | |
| MoO$_3$ | | | | | | | | | | |
| CeO$_2$ + TiO$_2$ | 1.396 | 1.388 | 1.389 | 1.384 | 1.367 | 1.366 | 1.404 | 1.410 | 1.418 | 1.414 |
| R$_2$O | 12.147 | 12.094 | 12.055 | 11.953 | 12.352 | 12.218 | 12.319 | 12.285 | 12.467 | 12.144 |
| Li$_2$O + Na$_2$O | 11.954 | 11.902 | 11.864 | 11.759 | 12.160 | 12.024 | 11.945 | 12.094 | 12.269 | 11.952 |

TABLE I-continued

| | | | | | | | | | | |
|---|---|---|---|---|---|---|---|---|---|---|
| $R_2O - Al_2O_3$ | −2.401 | −2.416 | −2.406 | −2.380 | 1.802 | −1.961 | −2.342 | −2.455 | −2.241 | −2.582 |
| R'O | 3.076 | 3.084 | 3.040 | 5.076 | 4.814 | 4.898 | 4.999 | 5.107 | 5.173 | 5.013 |
| Thickness (mm) | 1.307 | 1.318 | 1.321 | 1.288 | 1.298 | 1.292 | 1.305 | 1.299 | 1.294 | 1.299 |
| L* | 96.47 | 96.44 | 96.39 | 96.21 | 96.09 | 96.06 | 96.06 | 96.04 | 96.11 | 96.12 |
| a* | −0.64 | −0.51 | −0.56 | −0.76 | −0.85 | −0.87 | −0.83 | −0.86 | −0.79 | −0.75 |
| b* | 3.59 | 2.75 | 3.15 | 4.47 | 5.11 | 5.18 | 4.90 | 5.09 | 4.70 | 4.50 |
| Density (g/cm³) | 2.419 | 2.408 | 2.402 | | | | | | | |
| Liquidus Temp. (° C.) | | | | | | | | | | |

| Example | 351 | 352 | 353 | 354 | 355 | 356 | 357 | 358 | 359 | 360 |
|---|---|---|---|---|---|---|---|---|---|---|
| $SiO_2$ | 60.732 | 60.871 | 62.547 | 61.554 | 63.613 | 61.314 | 61.240 | 61.373 | 62.031 | 60.955 |
| $Al_2O_3$ | 14.501 | 14.581 | 13.795 | 14.167 | 14.152 | 14.505 | 14.493 | 14.270 | 13.888 | 14.442 |
| $B_2O_3$ | 6.170 | 5.856 | 5.721 | 6.035 | 5.296 | 5.761 | 5.742 | 5.772 | 5.861 | 5.942 |
| $P_2O_5$ | 0.000 | 0.000 | 0.000 | 0.000 | 0.000 | 0.000 | 0.000 | 0.000 | 0.000 | 0.000 |
| $Li_2O$ | 10.077 | 10.205 | 10.024 | 10.419 | 9.319 | 9.960 | 10.022 | 10.060 | 10.080 | 10.205 |
| $Na_2O$ | 1.923 | 1.890 | 1.723 | 1.610 | 1.395 | 1.888 | 1.900 | 2.033 | 1.887 | 1.898 |
| $K_2O$ | 0.198 | 0.192 | 0.191 | 0.190 | 0.187 | 0.190 | 0.188 | 0.188 | 0.196 | 0.196 |
| MgO | 1.964 | 1.964 | 1.815 | 1.861 | 1.841 | 1.974 | 2.007 | 1.964 | 1.852 | 1.975 |
| CaO | 2.030 | 2.016 | 1.899 | 1.911 | 1.928 | 1.983 | 1.996 | 1.964 | 1.904 | 1.988 |
| ZnO | 0.977 | 1.008 | 0.944 | 0.865 | 0.905 | 0.986 | 0.980 | 0.976 | 0.937 | 0.983 |
| $SnO_2$ | 0.000 | 0.000 | 0.000 | 0.000 | 0.000 | 0.000 | 0.000 | 0.000 | 0.000 | 0.000 |
| $Fe_2O_3$ | 0.003 | 0.003 | 0.003 | 0.003 | 0.003 | 0.003 | 0.003 | 0.003 | 0.003 | 0.003 |
| $TiO_2$ | 0.993 | 0.986 | 0.936 | 0.955 | 0.949 | 0.986 | 0.985 | 0.966 | 0.951 | 0.986 |
| $CeO_2$ | 0.413 | 0.408 | 0.374 | 0.381 | 0.375 | 0.409 | 0.410 | 0.398 | 0.392 | 0.411 |
| $ZrO_2$ | | | | | | | | | | |
| $La_2O_3$ | | | | | | | | | | |
| $SO_3$ | | | 0.011 | 0.029 | 0.023 | 0.025 | 0.017 | 0.016 | | |
| $WO_3$ | | | | | | | | | | |
| $Nb_2O_5$ | | | | | | | | | | |
| $Bi_2O_3$ | | | | | | | | | | |
| $MoO_3$ | | | | | | | | | | |
| $CeO_2 + TiO_2$ | 1.406 | 1.394 | 1.310 | 1.336 | 1.323 | 1.394 | 1.395 | 1.364 | 1.343 | 1.396 |
| $R_2O$ | 12.198 | 12.288 | 11.938 | 12.218 | 10.901 | 12.037 | 12.110 | 12.281 | 12.163 | 12.299 |
| $Li_2O + Na_2O$ | 12.000 | 12.096 | 11.748 | 12.028 | 10.714 | 11.847 | 11.922 | 12.093 | 11.967 | 12.103 |
| $R_2O - Al_2O_3$ | −2.303 | −2.293 | −1.857 | −1.949 | −3.251 | −2.468 | −2.383 | −1.989 | −1.725 | −2.144 |
| R'O | 4.971 | 4.988 | 4.659 | 4.637 | 4.674 | 4.944 | 4.984 | 4.904 | 4.693 | 4.946 |
| Thickness (mm) | 1.295 | 1.258 | 1.266 | 1.241 | 1.263 | 1.275 | 1.268 | 1.265 | 1.275 | 1.287 |
| L* | 96.02 | 96.13 | 95.00 | 94.27 | 94.24 | 96.26 | 96.25 | 96.25 | 96.12 | 96.10 |
| a* | −0.76 | −0.79 | −0.34 | −0.15 | −0.14 | −0.67 | −0.69 | −0.69 | −0.81 | −0.80 |
| b* | 4.55 | 4.71 | 3.46 | 3.17 | 3.16 | 3.89 | 4.07 | 4.09 | 4.88 | 4.87 |
| Density (g/cm³) | | | | | | | | | | |
| Liquidus Temp. (° C.) | | | | | | | | | | |

| Example | 361 | 362 | 363 | 364 | 365 | 366 | 367 | 368 | 369 | 370 |
|---|---|---|---|---|---|---|---|---|---|---|
| $SiO_2$ | 61.158 | 61.060 | 60.634 | 61.106 | 61.744 | 61.589 | 61.061 | 61.621 | 61.673 | 61.634 |
| $Al_2O_3$ | 14.319 | 14.694 | 14.390 | 14.826 | 14.594 | 14.535 | 14.435 | 14.574 | 14.682 | 14.321 |
| $B_2O_3$ | 6.075 | 5.747 | 5.425 | 5.681 | 5.710 | 5.565 | 5.561 | 5.555 | 5.156 | 5.664 |
| $P_2O_5$ | 0.000 | 0.000 | 0.000 | 0.000 | 0.000 | 0.000 | 0.000 | 0.000 | 0.000 | 0.000 |
| $Li_2O$ | 10.166 | 9.815 | 9.929 | 10.187 | 10.079 | 10.078 | 9.998 | 9.954 | 9.968 | 10.075 |
| $Na_2O$ | 1.885 | 1.899 | 1.835 | 1.894 | 1.855 | 1.841 | 1.842 | 1.867 | 1.813 | 1.880 |
| $K_2O$ | 0.193 | 0.196 | 0.183 | 0.191 | 0.190 | 0.183 | 0.186 | 0.188 | 0.180 | 0.187 |
| MgO | 1.887 | 2.059 | 2.030 | 2.102 | 2.034 | 2.030 | 2.038 | 2.016 | 2.057 | 2.000 |
| CaO | 1.950 | 2.052 | 2.037 | 2.083 | 2.009 | 2.004 | 2.027 | 2.006 | 2.031 | 2.001 |
| ZnO | 0.962 | 1.028 | 1.059 | 1.080 | 0.972 | 0.966 | 1.046 | 1.002 | 1.004 | 1.035 |
| $SnO_2$ | 0.000 | 0.000 | 0.000 | 0.000 | 0.000 | 0.000 | 0.000 | 0.000 | 0.000 | 0.000 |
| $Fe_2O_3$ | 0.003 | 0.003 | 0.001 | 0.001 | 0.004 | 0.003 | 0.002 | 0.002 | 0.002 | 0.002 |
| TiO | 0.976 | 1.009 | 1.466 | 0.006 | 0.797 | 0.992 | 0.985 | 0.797 | 0.603 | 0.197 |
| $CeO_2$ | 0.410 | 0.422 | 1.004 | 0.833 | 0.001 | 0.207 | 0.806 | 0.409 | 0.826 | 1.001 |
| $ZrO_2$ | | | | | | | | | | |
| $La_2O_3$ | | | | | | | | | | |
| $SO_3$ | | | | 0.002 | | | 0.009 | | | |
| $WO_3$ | | | | | | | | | | |
| $Nb_2O_5$ | | | | | | | | | | |
| $Bi_2O_3$ | | | | | | | | | | |
| $MoO_3$ | | | | | | | | | | |
| $CeO_2 + TiO_2$ | 1.386 | 1.431 | 2.470 | 0.840 | 0.798 | 1.199 | 1.790 | 1.206 | 1.429 | 1.197 |
| $R_2O$ | 12.244 | 11.910 | 11.947 | 12.271 | 12.124 | 12.101 | 12.025 | 12.009 | 11.961 | 12.141 |
| $Li_2O + Na_2O$ | 12.051 | 11.714 | 11.764 | 12.080 | 11.934 | 11.919 | 11.839 | 11.821 | 11.781 | 11.954 |

TABLE I-continued

| | | | | | | | | | | |
|---|---|---|---|---|---|---|---|---|---|---|
| R₂O − Al₂O₃ | −2.075 | −2.785 | −2.443 | −2.554 | −2.470 | −2.433 | −2.410 | −2.565 | −2.721 | −2.180 |
| R'O | 4.799 | 5.139 | 5.125 | 5.265 | 5.016 | 5.001 | 5.112 | 5.025 | 5.092 | 5.036 |
| Thickness (mm) | 1.307 | 1.31 | 1.361 | 1.287 | 1.344 | 1.337 | 1.343 | 1.327 | 1.348 | 1.335 |
| L* | 96.08 | 96.06 | 76.71 | 96.21 | 96.60 | 96.56 | 91.80 | 96.44 | 96.06 | 95.80 |
| a* | −0.86 | −0.86 | 8.60 | −0.17 | −0.03 | −0.27 | −1.71 | −0.47 | −0.68 | −0.36 |
| b* | 5.17 | 5.19 | 86.33 | 2.30 | 0.48 | 1.43 | 23.03 | 2.69 | 4.71 | 4.28 |
| Density (g/cm³) | | | | | | | | | | |
| Liquidus Temp. (° C.) | | | | | | | | | | |

| Example | 371 | 372 | 373 | 374 | 375 | 376 | 377 | 378 | 379 | 380 |
|---|---|---|---|---|---|---|---|---|---|---|
| SiO₂ | 61.677 | 60.200 | 60.730 | 60.788 | 60.355 | 62.197 | 60.801 | 61.427 | 61.484 | 60.057 |
| Al₂O₃ | 14.558 | 14.755 | 14.881 | 15.062 | 15.208 | 14.409 | 15.150 | 14.397 | 14.684 | 15.049 |
| B₂O₃ | 5.047 | 6.116 | 6.167 | 6.152 | 5.901 | 5.743 | 6.238 | 6.058 | 6.037 | 6.175 |
| P₂O₅ | 0.000 | 0.000 | 0.000 | 0.000 | 0.000 | 0.000 | 0.000 | 0.000 | 0.000 | 0.000 |
| Li₂O | 9.853 | 10.333 | 10.417 | 10.130 | 10.624 | 9.987 | 10.105 | 10.383 | 10.303 | 10.407 |
| Na₂O | 1.799 | 1.918 | 1.973 | 1.951 | 1.981 | 1.899 | 1.989 | 1.886 | 1.928 | 1.945 |
| K₂O | 0.182 | 0.196 | 0.195 | 0.196 | 0.196 | 0.197 | 0.198 | 0.191 | 0.197 | 0.197 |
| MgO | 2.023 | 2.024 | 2.078 | 2.082 | 2.131 | 1.971 | 2.133 | 1.901 | 2.024 | 2.100 |
| CaO | 2.012 | 2.029 | 2.081 | 2.084 | 2.094 | 2.045 | 2.118 | 1.948 | 2.045 | 2.099 |
| ZnO | 1.026 | 0.994 | 1.022 | 1.034 | 1.029 | 1.022 | 1.013 | 0.958 | 0.997 | 1.028 |
| SnO₂ | 0.000 | 0.000 | 0.000 | 0.000 | 0.000 | 0.000 | 0.000 | 0.000 | 0.000 | 0.000 |
| Fe₂O₃ | 0.002 | 0.003 | 0.014 | 0.065 | 0.024 | 0.091 | 0.016 | 0.012 | 0.064 | 0.063 |
| TiO₂ | 0.796 | 0.998 | 0.008 | 0.007 | 0.007 | 0.008 | 0.007 | 0.007 | 0.007 | 0.007 |
| CeO₂ | 1.019 | 0.419 | 0.419 | 0.432 | 0.433 | 0.416 | 0.217 | 0.818 | 0.207 | 0.856 |
| ZrO₂ | | | | | | | | | | |
| La₂O₃ | | | | | | | | | | |
| SO₃ | | | | | | | | | | 0.008 |
| WO₃ | | | | | | | | | | |
| Nb₂O₅ | | | | | | | | | | |
| Bi₂O₃ | | | | | | | | | | |
| MoO₃ | | | | | | | | | | |
| CeO₂ + TiO₂ | 1.816 | 1.416 | 0.427 | 0.439 | 0.440 | 0.423 | 0.225 | 0.825 | 0.214 | 0.863 |
| R₂O | 11.834 | 12.447 | 12.584 | 12.277 | 12.801 | 12.082 | 12.292 | 12.460 | 12.428 | 12.549 |
| Li₂O + Na₂O | 11.652 | 12.251 | 12.389 | 12.081 | 12.605 | 11.885 | 12.094 | 12.269 | 12.231 | 12.352 |
| R₂O − Al₂O₃ | −2.725 | −2.309 | −2.297 | −2.785 | −2.407 | −2.326 | −2.858 | −1.936 | −2.256 | −2.499 |
| R'O | 5.061 | 5.047 | 5.181 | 5.201 | 5.255 | 5.038 | 5.264 | 4.806 | 5.065 | 5.227 |
| Thickness (mm) | 1.334 | 1.409 | 1.403 | 1.389 | 1.389 | 1.396 | 1.38 | 1.4 | 1.385 | 1.397 |
| L* | 95.32 | 96.15 | 96.35 | 96.36 | 96.17 | 95.77 | 96.55 | 95.64 | 96.15 | 95.61 |
| a* | −1.27 | −0.79 | −0.20 | −0.18 | −0.14 | −0.22 | −0.06 | −0.39 | −0.15 | −0.32 |
| b* | 9.58 | 4.64 | 1.71 | 1.67 | 1.91 | 2.31 | 0.61 | 4.71 | 1.14 | 4.83 |
| Density (g/cm³) | | | | | | | | | | |
| Liquidus Temp. (° C.) | | | | | | | | | | |

| Example | 381 | 382 | 383 | 384 | 385 | 386 | 387 | 388 | 389 | 390 |
|---|---|---|---|---|---|---|---|---|---|---|
| SiO₂ | 59.613 | 60.633 | 61.035 | 60.100 | 60.869 | 60.983 | 60.730 | 60.650 | 62.003 | 63.308 |
| Al₂O₃ | 14.360 | 14.719 | 14.773 | 14.452 | 14.701 | 14.630 | 14.721 | 14.573 | 13.538 | 12.544 |
| B₂O₃ | 5.628 | 5.754 | 5.457 | 5.752 | 5.759 | 5.730 | 5.869 | 5.768 | 5.719 | 5.557 |
| P₂O₅ | 0.000 | 0.000 | 0.000 | 0.000 | 0.000 | 0.000 | 0.000 | 0.000 | 0.000 | 0.000 |
| Li₂O | 9.937 | 9.964 | 10.013 | 10.067 | 9.839 | 9.975 | 10.077 | 9.971 | 10.095 | 10.014 |
| Na₂O | 1.876 | 1.913 | 1.925 | 1.887 | 1.921 | 1.867 | 1.889 | 1.842 | 1.902 | 1.914 |
| K₂O | 0.188 | 0.189 | 0.194 | 0.187 | 0.192 | 0.193 | 0.193 | 0.189 | 0.192 | 0.192 |
| MgO | 2.027 | 2.092 | 2.081 | 2.033 | 2.071 | 2.065 | 2.100 | 2.057 | 2.053 | 2.021 |
| CaO | 2.003 | 2.069 | 2.053 | 2.012 | 2.043 | 2.042 | 2.073 | 2.032 | 2.055 | 2.026 |
| ZnO | 1.002 | 1.026 | 1.009 | 0.989 | 1.010 | 1.072 | 1.106 | 1.074 | 1.019 | 1.000 |
| SnO₂ | 0.000 | 0.000 | 0.000 | 0.000 | 0.000 | 0.000 | 0.000 | 0.000 | | |
| Fe₂O₃ | 0.002 | 0.002 | 0.004 | 0.002 | 0.003 | 0.001 | 0.001 | 0.001 | 0.003 | 0.003 |
| TiO₂ | 1.447 | 0.006 | 0.990 | 0.971 | 0.790 | 0.606 | 0.202 | 0.799 | 0.989 | 0.991 |
| CeO₂ | 1.025 | 0.843 | 0.205 | 0.828 | 0.417 | 0.825 | 1.029 | 1.027 | 0.412 | 0.415 |
| ZrO₂ | | | | | | | | | | |
| La₂O₃ | | | | | | | | | | |
| SO₃ | | | 0.010 | | | 0.002 | | 0.007 | | |
| WO₃ | | | | | | | | | | |
| Nb₂O₅ | | | | | | | | | | |
| Bi₂O₃ | | | | | | | | | | |
| MoO₃ | | | | | | | | | | |
| CeO₂ + TiO₂ | 2.471 | 0.849 | 1.195 | 1.798 | 1.207 | 1.430 | 1.231 | 1.826 | 1.401 | 1.407 |
| R₂O | 12.001 | 12.066 | 12.131 | 12.141 | 11.952 | 12.035 | 12.159 | 12.003 | 12.190 | 12.120 |
| Li₂O + Na₂O | 11.813 | 11.877 | 11.938 | 11.954 | 11.760 | 11.842 | 11.966 | 11.814 | 11.998 | 11.927 |

TABLE I-continued

| | | | | | | | | | | |
|---|---|---|---|---|---|---|---|---|---|---|
| R₂O − Al₂O₃ | −2.359 | −2.653 | −2.642 | −2.311 | −2.749 | −2.594 | −2.562 | −2.570 | −1.349 | −0.424 |
| R'O | 5.032 | 5.188 | 5.143 | 5.034 | 5.124 | 5.179 | 5.279 | 5.163 | 5.128 | 5.046 |
| Thickness (mm) | 1.208 | 1.187 | 1.205 | 1.217 | 1.221 | 1.301 | 1.308 | 1.294 | 1.33 | 1.305 |
| L* | 75.42 | 95.92 | 96.39 | 90.40 | 96.13 | 95.26 | 95.24 | 93.27 | 95.86 | 94.41 |
| a* | 5.59 | −0.29 | −0.37 | 1.24 | −0.60 | −0.86 | −0.49 | −1.13 | −0.98 | −1.42 |
| b* | 71.57 | 3.76 | 2.56 | 24.31 | 4.30 | 8.13 | 6.74 | 15.33 | 6.22 | 12.10 |
| Density (g/cm³) | | | | | | | | | 2.439 | 2.431 |
| Liquidus Temp. (° C.) | | | | | | | | | 1160 | 1170 |

| Example | 391 | 392 | 393 | 394 | 395 | 396 | 397 | 398 | 399 | 400 |
|---|---|---|---|---|---|---|---|---|---|---|
| SiO₂ | 63.846 | 61.725 | 61.403 | 61.676 | 62.297 | 62.861 | 64.138 | 60.358 | 61.846 | 59.290 |
| Al₂O₃ | 11.995 | 13.120 | 12.434 | 11.536 | 14.470 | 14.471 | 14.495 | 14.603 | 13.810 | 15.265 |
| B₂O₃ | 5.535 | 5.839 | 5.796 | 5.627 | 4.743 | 3.915 | 2.828 | 6.123 | 6.166 | 5.972 |
| P₂O₅ | 0.000 | 0.000 | 0.000 | 0.000 | 0.000 | 0.000 | 0.000 | 0.000 | 0.000 | 0.000 |
| Li₂O | 10.169 | 10.534 | 11.632 | 12.150 | 10.019 | 10.236 | 10.024 | 10.395 | 10.165 | 10.420 |
| Na₂O | 1.960 | 2.056 | 2.169 | 2.375 | 1.894 | 1.891 | 1.886 | 1.896 | 1.876 | 1.990 |
| K₂O | 0.190 | 0.193 | 0.189 | 0.188 | 0.192 | 0.192 | 0.193 | 0.194 | 0.192 | 0.196 |
| MgO | 1.956 | 2.054 | 2.002 | 2.020 | 1.992 | 2.015 | 2.016 | 2.014 | 1.808 | 2.186 |
| CaO | 1.975 | 2.045 | 1.985 | 2.013 | 1.996 | 2.009 | 2.014 | 2.019 | 1.876 | 2.130 |
| ZnO | 0.969 | 1.004 | 0.978 | 0.992 | 0.986 | 0.995 | 0.991 | 0.984 | 0.908 | 1.047 |
| SnO₂ | | | | | | | | 0.000 | | |
| Fe₂O₃ | 0.003 | 0.003 | 0.003 | 0.003 | 0.003 | 0.003 | 0.003 | 0.003 | 0.013 | 0.040 |
| TiO₂ | 0.978 | 0.998 | 0.980 | 0.988 | 0.982 | 0.983 | 0.984 | 0.985 | 0.936 | 1.016 |
| CeO₂ | 0.407 | 0.410 | 0.409 | 0.416 | 0.410 | 0.412 | 0.411 | 0.412 | 0.391 | 0.434 |
| ZrO₂ | | | | | | | | | | |
| La₂O₃ | | | | | | | | | | |
| SO₃ | | | | | | 0.002 | | | | |
| WO₃ | | | | | | | | | | |
| Nb₂O₅ | | | | | | | | | | |
| Bi₂O₃ | | | | | | | | | | |
| MoO₃ | | | | | | | | | | |
| CeO₂ + TiO₂ | 1.385 | 1.408 | 1.389 | 1.404 | 1.392 | 1.395 | 1.395 | 1.398 | 1.327 | 1.450 |
| R₂O | 12.320 | 12.783 | 13.991 | 14.713 | 12.104 | 12.320 | 12.103 | 12.486 | 12.233 | 12.606 |
| Li₂O + Na₂O | 12.130 | 12.590 | 13.802 | 14.525 | 11.912 | 12.128 | 11.910 | 12.292 | 12.042 | 12.410 |
| R₂O − Al₂O₃ | 0.325 | −0.337 | 1.556 | 3.177 | −2.366 | −2.151 | −2.391 | −2.117 | −1.577 | −2.660 |
| R'O | 4.900 | 5.103 | 4.966 | 5.025 | 4.974 | 5.019 | 5.021 | 5.017 | 4.591 | 5.364 |
| Thickness (mm) | 1.334 | 1.325 | 1.336 | 1.329 | 1.343 | 1.336 | 1.334 | 1.287 | 1.282 | 1.293 |
| L* | 94.98 | 95.45 | 95.91 | 96.06 | 95.96 | 95.97 | 95.97 | 96.09 | 96.11 | 95.96 |
| a* | −1.33 | −1.15 | 1.00 | −0.81 | −0.87 | −0.84 | −0.91 | −0.79 | −0.74 | −0.73 |
| b* | 10.46 | 8.02 | 6.34 | 4.98 | 5.43 | 5.27 | 5.73 | 4.71 | 4.51 | 4.83 |
| Density (g/cm³) | 2.432 | 2.44 | 2.448 | 2.455 | 2.442 | 2.445 | 2.45 | | | |
| Liquidus Temp. (° C.) | 1135 | 1160 | 1165 | 1135 | 1195 | 1215 | 1245 | | | |

| Example | 401 | 402 | 403 | 404 | 405 | 406 | 407 | 408 | 409 | 410 |
|---|---|---|---|---|---|---|---|---|---|---|
| SiO₂ | 59.744 | 59.186 | 60.509 | 60.421 | 60.579 | 60.333 | 61.608 | 63.053 | 61.230 | 61.869 |
| Al₂O₃ | 15.020 | 15.187 | 14.713 | 14.848 | 14.672 | 15.126 | 14.624 | 13.534 | 14.809 | 14.514 |
| B₂O₃ | 6.099 | 6.202 | 5.894 | 5.827 | 6.032 | 6.294 | 5.872 | 6.222 | 5.827 | 5.947 |
| P₂O₅ | 0.000 | 0.000 | 0.000 | 0.000 | 0.000 | 0.000 | 0.000 | 0.000 | 0.000 | 0.000 |
| Li₂O | 10.340 | 10.557 | 10.257 | 10.063 | 10.197 | 10.361 | 9.941 | 10.267 | 10.019 | 10.253 |
| Na₂O | 1.911 | 1.926 | 1.879 | 1.919 | 1.842 | 1.858 | 1.868 | 1.772 | 1.863 | 1.825 |
| K₂O | 0.194 | 0.194 | 0.191 | 0.192 | 0.193 | 0.192 | 0.196 | 0.196 | 0.198 | 0.191 |
| MgO | 2.099 | 2.166 | 2.033 | 2.090 | 2.000 | 2.176 | 2.046 | 1.735 | 2.036 | 1.937 |
| CaO | 2.060 | 2.086 | 2.043 | 2.081 | 2.018 | 2.085 | 1.995 | 1.816 | 2.051 | 1.965 |
| ZnO | 1.021 | 1.010 | 1.003 | 1.026 | 1.046 | 1.069 | 1.024 | 0.950 | 1.051 | 1.024 |
| SnO₂ | 0.000 | 0.000 | 0.000 | 0.000 | 0.000 | 0.000 | 0.000 | 0.000 | 0.000 | 0.000 |
| Fe₂O₃ | 0.064 | 0.023 | 0.056 | 0.090 | 0.003 | 0.002 | 0.002 | 0.002 | 0.002 | 0.002 |
| TiO₂ | 1.009 | 1.012 | 0.991 | 1.000 | 1.006 | 0.012 | 0.011 | 0.011 | 0.011 | 0.011 |
| CeO₂ | 0.425 | 0.433 | 0.417 | 0.423 | 0.407 | 0.426 | 0.410 | 0.379 | 0.421 | 0.396 |
| ZrO₂ | | | | | | | | | | |
| La₂O₃ | | | | | | | | | | |
| SO₃ | | 0.004 | | 0.006 | | 0.009 | | 0.007 | 0.049 | |
| WO₃ | | | | | | 0.052 | 0.396 | | | |
| Nb₂O₅ | | | | | | | | 0.049 | 0.423 | |
| Bi₂O₃ | | | | | | | | | 0.001 | 0.059 |
| MoO₃ | | | | | | | | | | |
| CeO₂ + TiO₂ | 1.434 | 1.446 | 1.408 | 1.423 | 1.413 | 0.438 | 0.421 | 0.390 | 0.433 | 0.407 |
| R₂O | 12.445 | 12.677 | 12.327 | 12.174 | 12.232 | 12.410 | 12.006 | 12.235 | 12.081 | 12.268 |

TABLE I-continued

| | | | | | | | | | | |
|---|---|---|---|---|---|---|---|---|---|---|
| Li$_2$O + Na$_2$O | 12.252 | 12.483 | 12.136 | 11.982 | 12.039 | 12.219 | 11.810 | 12.039 | 11.883 | 12.078 |
| R$_2$O − Al$_2$O$_3$ | −2.575 | −2.510 | −2.386 | −2.674 | −2.441 | −2.716 | −2.619 | −1.299 | −2.728 | −2.246 |
| R'O | 5.180 | 5.263 | 5.079 | 5.196 | 5.064 | 5.330 | 5.064 | 4.501 | 5.138 | 4.925 |
| Thickness (mm) | 1.287 | 1.342 | 1.37 | 1.345 | 1.31 | 1.301 | 1.293 | 1.307 | 1.284 | 1.277 |
| L* | 95.79 | 95.98 | 95.92 | 95.15 | 96.09 | 96.36 | 96.41 | 96.33 | 96.20 | 96.38 |
| a* | −0.72 | −0.81 | −0.70 | −0.79 | −0.80 | −0.23 | −0.27 | −0.25 | −0.41 | −0.22 |
| b* | 5.53 | 5.05 | 5.12 | 7.39 | 4.80 | 1.80 | 1.84 | 1.90 | 2.50 | 1.74 |
| Density (g/cm$^3$) | | | | | | | | | | |
| Liquidus Temp. (° C.) | | | | | | | | | | |

| Example | 411 | 412 | 413 | 414 | 415 | 416 | 417 | 418 | 419 | 420 |
|---|---|---|---|---|---|---|---|---|---|---|
| SiO$_2$ | 59.713 | 61.525 | 61.538 | 58.525 | 60.939 | 60.714 | 60.727 | 61.761 | 61.367 | 60.720 |
| Al$_2$O$_3$ | 15.337 | 14.475 | 14.604 | 16.084 | 14.420 | 14.467 | 15.292 | 14.234 | 14.109 | 14.621 |
| B$_2$O$_3$ | 6.242 | 6.186 | 5.924 | 5.610 | 6.037 | 6.081 | 5.891 | 6.159 | 5.959 | 5.925 |
| P$_2$O$_5$ | 0.000 | 0.000 | 0.000 | 0.002 | 0.026 | 0.050 | 0.027 | 0.049 | 0.002 | 0.002 |
| Li$_2$O | 10.607 | 10.347 | 10.039 | 10.018 | 10.108 | 10.056 | 10.045 | 10.377 | 10.291 | 10.116 |
| Na$_2$O | 1.892 | 1.864 | 1.877 | 2.003 | 1.879 | 1.898 | 1.965 | 1.900 | 1.877 | 1.915 |
| K$_2$O | 0.179 | 0.195 | 0.192 | 0.199 | 0.192 | 0.193 | 0.194 | 0.190 | 0.191 | 0.195 |
| MgO | 2.128 | 1.943 | 2.024 | 2.554 | 1.958 | 1.997 | 2.152 | 1.909 | 1.876 | 1.994 |
| CaO | 1.961 | 1.975 | 1.978 | 2.298 | 1.999 | 2.037 | 2.141 | 1.940 | 1.931 | 2.048 |
| ZnO | 1.038 | 1.016 | 0.987 | 1.168 | 0.978 | 0.985 | 1.046 | 0.949 | 0.955 | 0.987 |
| SnO$_2$ | 0.000 | 0.000 | 0.000 | 0.002 | 0.048 | 0.097 | 0.051 | 0.097 | 0.053 | 0.053 |
| Fe$_2$O$_3$ | 0.003 | 0.002 | 0.002 | 0.003 | 0.003 | 0.003 | 0.003 | 0.003 | 0.003 | 0.003 |
| TiO$_2$ | 0.010 | 0.011 | 0.012 | 1.060 | 0.983 | 0.988 | 0.007 | 0.006 | 0.968 | 0.993 |
| CeO$_2$ | 0.387 | 0.408 | 0.411 | 0.458 | 0.413 | 0.416 | 0.441 | 0.407 | 0.402 | 0.412 |
| ZrO$_2$ | | | | | | | | | | |
| La$_2$O$_3$ | | | | | | | | | | |
| SO$_3$ | | 0.002 | 0.017 | | | | | | | |
| WO$_3$ | | | | | | | | | | |
| Nb$_2$O$_5$ | | | | | | | | | | |
| Bi$_2$O$_3$ | 0.500 | | | | | | | | | |
| MoO$_3$ | | 0.045 | 0.381 | | | | | | | |
| CeO$_2$ + TiO$_2$ | 0.397 | 0.420 | 0.423 | 1.518 | 1.396 | 1.403 | 0.448 | 0.413 | 1.370 | 1.405 |
| R$_2$O | 12.678 | 12.405 | 12.108 | 12.219 | 12.178 | 12.147 | 12.205 | 12.468 | 12.359 | 12.226 |
| Li$_2$O + Na$_2$O | 12.499 | 12.211 | 11.916 | 12.020 | 11.987 | 11.954 | 12.011 | 12.278 | 12.168 | 12.031 |
| R$_2$O − Al$_2$O$_3$ | −2.659 | −2.070 | −2.496 | −3.865 | −2.242 | −2.320 | −3.088 | −1.766 | −1.750 | −2.395 |
| R'O | 5.126 | 4.934 | 4.989 | 6.020 | 4.935 | 5.019 | 5.339 | 4.799 | 4.763 | 5.029 |
| Thickness (mm) | 1.297 | 1.328 | 1.333 | 1.348 | 1.335 | 1.341 | 1.355 | 1.346 | 1.354 | 1.35 |
| L* | 96.30 | 96.38 | 96.41 | 96.11 | 96.19 | 96.39 | 96.46 | 96.52 | 96.19 | 96.20 |
| a* | −0.28 | −0.23 | −0.28 | −0.80 | −0.74 | −0.57 | −0.11 | −0.06 | −0.69 | −0.72 |
| b* | 1.96 | 1.78 | 2.02 | 4.64 | 4.25 | 3.12 | 1.06 | 0.71 | 4.05 | 4.18 |
| Density (g/cm$^3$) | | | | | | | | | | |
| Liquidus Temp. (° C.) | | | | | | | | | | |

| Example | 421 | 422 | 423 | 424 | 425 | 426 | 427 | 428 | 429 | 430 |
|---|---|---|---|---|---|---|---|---|---|---|
| SiO$_2$ | 59.486 | 60.630 | 60.210 | 60.621 | 60.457 | 61.483 | 60.402 | 62.960 | 61.721 | 64.109 |
| Al$_2$O$_3$ | 15.281 | 14.950 | 15.185 | 14.934 | 15.052 | 14.394 | 15.135 | 13.779 | 14.375 | 13.328 |
| B$_2$O$_3$ | 6.085 | 5.820 | 5.908 | 5.873 | 5.911 | 5.920 | 5.788 | 5.728 | 5.972 | 5.796 |
| P$_2$O$_5$ | 0.000 | 0.000 | 0.000 | 0.000 | 0.000 | 0.000 | 0.000 | 0.000 | 0.000 | 0.000 |
| Li$_2$O | 9.288 | 9.005 | 9.134 | 9.094 | 9.147 | 9.097 | 9.535 | 9.781 | 9.879 | 10.038 |
| Na$_2$O | 1.521 | 1.367 | 1.359 | 1.842 | 1.841 | 1.828 | 1.358 | 1.647 | 1.367 | 1.455 |
| K$_2$O | 0.194 | 0.166 | 0.165 | 0.165 | 0.162 | 0.167 | 0.168 | 0.165 | 0.166 | 0.166 |
| MgO | 5.002 | 4.692 | 4.755 | 4.560 | 4.693 | 4.289 | 3.108 | 3.321 | 3.897 | 2.914 |
| CaO | 1.759 | 1.936 | 1.840 | 1.487 | 1.511 | 1.420 | 3.059 | 1.196 | 1.204 | 0.790 |
| ZnO | 0.000 | 0.008 | 0.008 | 0.008 | 0.008 | 0.000 | 0.016 | 0.016 | 0.008 | 0.008 |
| SnO$_2$ | 0.000 | 0.000 | 0.000 | 0.000 | 0.000 | 0.000 | 0.000 | 0.000 | 0.000 | 0.000 |
| Fe$_2$O$_3$ | 0.001 | 0.002 | 0.002 | 0.002 | 0.002 | 0.002 | 0.002 | 0.002 | 0.002 | 0.002 |
| TiO$_2$ | 0.976 | 1.011 | 1.016 | 0.997 | 0.803 | 1.080 | 1.012 | 0.999 | 0.998 | 0.990 |
| CeO$_2$ | 0.398 | 0.413 | 0.419 | 0.418 | 0.413 | 0.320 | 0.418 | 0.408 | 0.411 | 0.405 |
| ZrO$_2$ | | | | | | | | | | |
| La$_2$O$_3$ | | | | | | | | | | |
| SO$_3$ | | | | | | | | | | |
| WO$_3$ | | | | | | | | | | |
| Nb$_2$O$_5$ | | | | | | | | | | |
| Bi$_2$O$_3$ | | | | | | | | | | |
| MoO$_3$ | | | | | | | | | | |
| CeO$_2$ + TiO$_2$ | 1.374 | 1.424 | 1.434 | 1.414 | 1.216 | 1.400 | 1.429 | 1.406 | 1.408 | 1.395 |
| R$_2$O | 11.004 | 10.538 | 10.658 | 11.102 | 11.150 | 11.091 | 11.061 | 11.593 | 11.413 | 11.659 |
| Li$_2$O + Na$_2$O | 10.809 | 10.372 | 10.494 | 10.937 | 10.988 | 10.925 | 10.893 | 11.428 | 11.246 | 11.493 |
| R$_2$O − Al$_2$O$_3$ | −4.277 | −4.411 | −4.527 | −3.832 | −3.902 | −3.303 | −4.074 | −2.186 | −2.963 | −1.669 |

TABLE I-continued

| | | | | | | | | | | |
|---|---|---|---|---|---|---|---|---|---|---|
| R'O | 6.761 | 6.636 | 6.602 | 6.054 | 6.212 | 5.709 | 6.182 | 4.532 | 5.109 | 3.712 |
| Thickness (mm) | 0.57 | 1.295 | 1.282 | 1.309 | 1.305 | 1.301 | 1.277 | 1.289 | 1.287 | 1.286 |
| L* | 96.38 | 96.34 | 96.35 | 96.38 | 96.37 | 96.39 | 96.34 | 96.28 | 96.35 | 96.29 |
| a* | −0.29 | −0.57 | −0.53 | −0.52 | −0.47 | −0.52 | −0.52 | −0.65 | −0.58 | −0.68 |
| b* | 1.68 | 3.13 | 2.92 | 2.88 | 2.63 | 2.80 | 2.98 | 3.83 | 3.28 | 3.91 |
| Density (g/cm³) | | | | | | | | | | |
| Liquidus Temp. (° C.) | 1140 | | | | | | | | | |

| Example | 431 | 432 | 433 | 434 | 435 | 436 | 437 | 438 | 439 | 440 |
|---|---|---|---|---|---|---|---|---|---|---|
| $SiO_2$ | 59.283 | 59.636 | 59.706 | 59.455 | 59.392 | 59.737 | 59.476 | 59.673 | 59.593 | 60.312 |
| $Al_2O_3$ | 14.546 | 14.386 | 14.531 | 14.696 | 14.568 | 14.718 | 14.658 | 14.710 | 14.781 | 14.488 |
| $B_2O_3$ | 4.841 | 4.902 | 4.734 | 4.835 | 4.826 | 4.789 | 4.812 | 4.734 | 4.864 | 5.668 |
| $P_2O_5$ | 0.000 | 0.000 | 0.000 | 0.000 | 0.000 | 0.000 | 0.000 | 0.000 | 0.000 | 0.000 |
| $Li_2O$ | 13.885 | 13.143 | 11.778 | 12.419 | 8.785 | 10.985 | 13.119 | 11.672 | 12.316 | 9.953 |
| $Na_2O$ | 0.879 | 0.864 | 2.169 | 0.872 | 5.816 | 0.858 | 0.870 | 2.187 | 0.870 | 1.822 |
| $K_2O$ | 0.171 | 0.814 | 0.765 | 1.309 | 0.166 | 2.465 | 0.811 | 0.775 | 1.286 | 0.166 |
| MgO | 2.026 | 1.939 | 1.998 | 2.030 | 2.064 | 2.040 | 2.060 | 2.044 | 2.062 | 2.000 |
| CaO | 1.987 | 1.958 | 1.970 | 2.002 | 2.002 | 2.010 | 2.015 | 2.010 | 2.031 | 1.999 |
| ZnO | 0.972 | 0.951 | 0.940 | 0.958 | 0.975 | 0.971 | 0.965 | 0.973 | 0.972 | 1.083 |
| $SnO_2$ | 0.000 | 0.000 | 0.000 | 0.000 | 0.000 | 0.000 | 0.000 | 0.000 | 0.000 | 0.000 |
| $Fe_2O_3$ | 0.002 | 0.002 | 0.002 | 0.002 | 0.002 | 0.002 | 0.003 | 0.003 | 0.003 | 0.002 |
| $TiO_2$ | 0.997 | 0.994 | 0.997 | 1.010 | 0.997 | 1.015 | 1.008 | 1.012 | 1.014 | 1.485 |
| $CeO_2$ | 0.411 | 0.410 | 0.410 | 0.412 | 0.407 | 0.410 | 0.205 | 0.206 | 0.206 | 1.014 |
| $ZrO_2$ | | | | | | | | | | |
| $La_2O_3$ | | | | | | | | | | |
| $SO_3$ | | | | | | | | | | |
| $WO_3$ | | | | | | | | | | |
| $Nb_2O_5$ | | | | | | | | | | |
| $Bi_2O_3$ | | | | | | | | | | |
| $MoO_3$ | | | | | | | | | | |
| $CeO_2 + TiO_2$ | 1.408 | 1.404 | 1.407 | 1.422 | 1.404 | 1.425 | 1.213 | 1.218 | 1.221 | 2.499 |
| $R_2O$ | 14.935 | 14.821 | 14.712 | 14.600 | 14.767 | 14.308 | 14.799 | 14.634 | 14.472 | 11.940 |
| $Li_2O + Na_2O$ | 14.764 | 14.007 | 13.947 | 13.291 | 14.601 | 11.843 | 13.989 | 13.859 | 13.186 | 11.775 |
| $R_2O − Al_2O_3$ | 0.388 | 0.435 | 0.181 | −0.096 | 0.199 | −0.411 | 0.142 | −0.075 | −0.310 | −2.548 |
| R'O | 4.985 | 4.849 | 4.908 | 4.990 | 5.041 | 5.021 | 5.039 | 5.028 | 5.065 | 5.081 |
| Thickness (mm) | 1.221 | 1.223 | 1.217 | 1.17 | 1.227 | 1.237 | 1.281 | 1.253 | 1.24 | 1.352 |
| L* | 96.03 | 96.00 | 95.41 | 95.90 | 94.89 | 92.22 | 96.32 | 96.29 | 96.34 | 70.36 |
| a* | −0.78 | −0.83 | −1.06 | −0.92 | −1.28 | −1.52 | −0.47 | −0.55 | −0.46 | 8.58 |
| b* | 4.89 | 5.26 | 7.73 | 5.69 | 10.18 | 19.29 | 2.37 | 2.51 | 2.52 | 76.71 |
| Density (g/cm³) | 2.447 | 2.448 | 2.453 | 2.447 | 2.46 | 2.447 | 2.436 | 2.444 | 2.437 | |
| Liquidus Temp. (° C.) | | | | | | | | | | |

| Example | 441 | 442 | 443 | 444 | 445 | 446 | 447 | 448 | 449 | 450 |
|---|---|---|---|---|---|---|---|---|---|---|
| $SiO_2$ | 61.349 | 62.180 | 61.549 | 60.736 | 61.636 | 61.225 | 61.051 | 60.582 | 59.100 | 59.100 |
| $Al_2O_3$ | 14.663 | 14.334 | 14.333 | 14.526 | 14.206 | 14.525 | 14.611 | 14.511 | 14.500 | 14.500 |
| $B_2O_3$ | 5.943 | 5.761 | 5.893 | 5.760 | 5.984 | 5.717 | 5.837 | 5.949 | 5.000 | 5.000 |
| $P_2O_5$ | 0.000 | 0.000 | 0.000 | 0.000 | 0.000 | 0.000 | 0.000 | 0.000 | | |
| $Li_2O$ | 10.028 | 10.030 | 10.084 | 10.028 | 10.114 | 10.038 | 10.118 | 10.011 | 13.800 | 12.396 |
| $Na_2O$ | 1.861 | 1.868 | 1.850 | 1.837 | 1.858 | 1.841 | 1.860 | 1.819 | 1.000 | 2.404 |
| $K_2O$ | 0.168 | 0.168 | 0.165 | 0.165 | 0.168 | 0.167 | 0.165 | 0.160 | 0.200 | 0.200 |
| MgO | 2.051 | 1.965 | 1.982 | 2.028 | 1.945 | 2.018 | 2.031 | 2.052 | 3.000 | 2.579 |
| CaO | 2.029 | 1.943 | 1.954 | 2.013 | 1.929 | 2.003 | 2.023 | 2.009 | 0.500 | 1.202 |
| ZnO | 1.061 | 0.948 | 0.994 | 1.071 | 0.973 | 1.046 | 1.072 | 1.095 | 1.500 | 1.219 |
| $SnO_2$ | 0.000 | 0.000 | 0.000 | 0.000 | 0.000 | 0.000 | 0.000 | 0.000 | | |
| $Fe_2O_3$ | 0.002 | 0.002 | 0.002 | 0.002 | 0.002 | 0.002 | 0.002 | 0.002 | | |
| $TiO_2$ | 0.010 | 0.790 | 0.978 | 0.995 | 0.778 | 0.598 | 0.199 | 0.788 | 1.000 | 1.000 |
| $CeO_2$ | 0.826 | 0.001 | 0.206 | 0.815 | 0.395 | 0.813 | 1.024 | 1.013 | 0.400 | 0.400 |
| $ZrO_2$ | | | | | | | | | | |
| $La_2O_3$ | | | | | | | | | | |
| $SO_3$ | | | | | | | | | | |
| $WO_3$ | | | | | | | | | | |
| $Nb_2O_5$ | | | | | | | | | | |
| $Bi_2O_3$ | | | | | | | | | | |
| $MoO_3$ | | | | | | | | | | |
| $CeO_2 + TiO_2$ | 0.837 | 0.791 | 1.184 | 1.810 | 1.173 | 1.412 | 1.223 | 1.801 | 1.400 | 1.400 |
| $R_2O$ | 12.057 | 12.066 | 12.099 | 12.030 | 12.140 | 12.046 | 12.143 | 11.990 | 15.000 | 15.000 |

TABLE I-continued

| | | | | | | | | | | |
|---|---|---|---|---|---|---|---|---|---|---|
| Li₂O + Na₂O | 11.889 | 11.898 | 11.934 | 11.865 | 11.972 | 11.879 | 11.978 | 11.830 | 14.800 | 14.800 |
| R₂O − Al₂O₃ | −2.606 | −2.268 | −2.234 | −2.506 | −2.066 | −2.479 | −2.468 | −2.520 | 0.500 | 0.500 |
| R'O | 5.142 | 4.856 | 4.930 | 5.113 | 4.848 | 5.067 | 5.125 | 5.157 | 5.000 | 5.000 |
| Thickness (mm) | 1.372 | 1.367 | 1.383 | 1.358 | 1.388 | 1.377 | 1.364 | 1.159 | | |
| L* | 95.90 | 96.57 | 96.46 | 89.22 | 96.26 | 95.55 | 95.29 | 94.42 | | |
| a* | −0.31 | −0.01 | −0.33 | −1.81 | −0.57 | −0.83 | −0.52 | −1.22 | | |
| b* | 3.62 | 0.35 | 1.84 | 28.72 | 3.37 | 6.58 | 6.23 | 11.32 | | |
| Density (g/cm³) | | | | | | | | | | |
| Liquidus Temp. (° C.) | | | | | | | | | | |

| Example | 451 | 452 | 453 | 454 | 455 | 456 | 457 | 458 | 459 | 460 |
|---|---|---|---|---|---|---|---|---|---|---|
| SiO₂ | 59.100 | 59.100 | 59.100 | 59.100 | 59.100 | 59.100 | 59.100 | 59.100 | 59.100 | 59.100 |
| Al₂O₃ | 14.500 | 14.500 | 14.500 | 14.500 | 14.500 | 14.500 | 14.500 | 14.500 | 14.500 | 14.500 |
| B₂O₃ | 5.000 | 5.000 | 5.000 | 5.000 | 5.000 | 5.000 | 5.000 | 5.000 | 5.000 | 5.000 |
| P₂O₅ | | | | | | | | | | |
| Li₂O | 13.026 | 11.341 | 11.765 | 12.437 | 10.270 | 10.737 | 11.184 | 11.835 | 8.800 | 9.423 |
| Na₂O | 1.000 | 3.459 | 2.314 | 1.000 | 4.530 | 3.338 | 2.328 | 1.000 | 6.000 | 4.585 |
| K₂O | 0.974 | 0.200 | 0.921 | 1.563 | 0.200 | 0.926 | 1.488 | 2.165 | 0.200 | 0.993 |
| MgO | 2.309 | 2.262 | 1.962 | 1.783 | 1.941 | 1.651 | 1.452 | 1.246 | 1.500 | 1.217 |
| CaO | 0.777 | 1.730 | 1.414 | 0.987 | 2.265 | 1.928 | 1.624 | 1.202 | 3.000 | 2.575 |
| ZnO | 1.915 | 1.008 | 1.623 | 2.230 | 0.794 | 1.421 | 1.924 | 2.552 | 0.500 | 1.208 |
| SnO₂ | | | | | | | | | | |
| Fe₂O₃ | | | | | | | | | | |
| TiO₂ | 1.000 | 1.000 | 1.000 | 1.000 | 1.000 | 1.000 | 1.000 | 1.000 | 1.000 | 1.000 |
| CeO₂ | 0.400 | 0.400 | 0.400 | 0.400 | 0.400 | 0.400 | 0.400 | 0.400 | 0.400 | 0.400 |
| ZrO₂ | | | | | | | | | | |
| La₂O₃ | | | | | | | | | | |
| SO₃ | | | | | | | | | | |
| WO₃ | | | | | | | | | | |
| Nb₂O₅ | | | | | | | | | | |
| Bi₂O₃ | | | | | | | | | | |
| MoO₃ | | | | | | | | | | |
| CeO₂ + TiO₂ | 1.400 | 1.400 | 1.400 | 1.400 | 1.400 | 1.400 | 1.400 | 1.400 | 1.400 | 1.400 |
| R₂O | 15.000 | 15.000 | 15.000 | 15.000 | 15.000 | 15.000 | 15.000 | 15.000 | 15.000 | 15.000 |
| Li₂O + Na₂O | 14.026 | 14.800 | 14.079 | 13.437 | 14.800 | 14.074 | 13.512 | 12.835 | 14.800 | 14.007 |
| R₂O − Al₂O₃ | 0.500 | 0.500 | 0.500 | 0.500 | 0.500 | 0.500 | 0.500 | 0.500 | 0.500 | 0.500 |
| R'O | 5.000 | 5.000 | 5.000 | 5.000 | 5.000 | 5.000 | 5.000 | 5.000 | 5.000 | 5.000 |
| Thickness (mm) | | | | | | | | | | |
| L* | | | | | | | | | | |
| a* | | | | | | | | | | |
| b* | | | | | | | | | | |
| Density (g/cm³) | | | | | | | | | | |
| Liquidus Temp. (° C.) | | | | | | | | | | |

| Example | 461 | 462 | 463 | 464 | 465 | 466 | 467 | 468 | 469 | 470 |
|---|---|---|---|---|---|---|---|---|---|---|
| SiO₂ | 59.100 | 59.100 | 59.100 | 61.100 | 61.100 | 61.100 | 61.100 | 61.100 | 61.100 | 61.100 |
| Al₂O₃ | 14.500 | 14.500 | 14.500 | 14.500 | 14.500 | 14.500 | 14.500 | 14.500 | 14.500 | 14.500 |
| B₂O₃ | 5.000 | 5.000 | 5.000 | 5.000 | 5.000 | 5.000 | 5.000 | 5.000 | 5.000 | 5.000 |
| P₂O₅ | | | | | | | | | | |
| Li₂O | 9.889 | 10.358 | 11.000 | 11.960 | 10.749 | 11.277 | 9.835 | 10.196 | 10.764 | 8.907 |
| Na₂O | 3.526 | 2.458 | 1.000 | 0.870 | 2.081 | 0.870 | 2.995 | 1.997 | 0.870 | 3.923 |
| K₂O | 1.585 | 2.184 | 3.000 | 0.170 | 0.170 | 0.853 | 0.170 | 0.807 | 1.366 | 0.170 |
| MgO | 1.005 | 0.792 | 0.500 | 2.000 | 2.000 | 2.000 | 2.000 | 2.000 | 2.000 | 2.000 |
| CaO | 2.258 | 1.937 | 1.500 | 2.000 | 2.000 | 2.000 | 2.000 | 2.000 | 2.000 | 2.000 |
| ZnO | 1.737 | 2.271 | 3.000 | 1.000 | 1.000 | 1.000 | 1.000 | 1.000 | 1.000 | 1.000 |
| SnO₂ | | | | | | | | | | |
| Fe₂O₃ | | | | | | | | | | |
| TiO₂ | 1.000 | 1.000 | 1.000 | 1.000 | 1.000 | 1.000 | 1.000 | 1.000 | 1.000 | 1.000 |
| CeO₂ | 0.400 | 0.400 | 0.400 | 0.400 | 0.400 | 0.400 | 0.400 | 0.400 | 0.400 | 0.400 |
| ZrO₂ | | | | | | | | | | |
| La₂O₃ | | | | | | | | | | |
| SO₃ | | | | | | | | | | |
| WO₃ | | | | | | | | | | |
| Nb₂O₅ | | | | | | | | | | |
| Bi₂O₃ | | | | | | | | | | |
| MoO₃ | | | | | | | | | | |
| CeO₂ + TiO₂ | 1.400 | 1.400 | 1.400 | 1.400 | 1.400 | 1.400 | 1.400 | 1.400 | 1.400 | 1.400 |
| R₂O | 15.000 | 15.000 | 15.000 | 13.000 | 13.000 | 13.000 | 13.000 | 13.000 | 13.000 | 13.000 |

TABLE I-continued

| | | | | | | | | | | |
|---|---|---|---|---|---|---|---|---|---|---|
| Li₂O + Na₂O | 13.415 | 12.816 | 12.000 | 12.830 | 12.830 | 12.147 | 12.830 | 12.193 | 11.634 | 12.830 |
| R₂O − Al₂O₃ | 0.500 | 0.500 | 0.500 | −1.500 | −1.500 | −1.500 | −1.500 | −1.500 | −1.500 | −1.500 |
| R'O | 5.000 | 5.000 | 5.000 | 5.000 | 5.000 | 5.000 | 5.000 | 5.000 | 5.000 | 5.000 |
| Thickness (mm) | | | | | | | | | | |
| L* | | | | | | | | | | |
| a* | | | | | | | | | | |
| b* | | | | | | | | | | |
| Density (g/cm³) | | | | | | | | | | |
| Liquidus Temp. (° C.) | | | | | | | | | | |

| Example | 471 | 472 | 473 | 474 | 475 | 476 | 477 | 478 | 479 | 480 |
|---|---|---|---|---|---|---|---|---|---|---|
| SiO₂ | 61.100 | 61.100 | 61.100 | 61.100 | 61.100 | 61.100 | 61.100 | 61.100 | 63.100 | 63.100 |
| Al₂O₃ | 14.500 | 14.500 | 14.500 | 14.500 | 14.500 | 14.500 | 14.500 | 14.500 | 14.500 | 14.500 |
| B₂O₃ | 5.000 | 5.000 | 5.000 | 5.000 | 5.000 | 5.000 | 5.000 | 5.000 | 5.000 | 5.000 |
| P₂O₅ | | | | | | | | | | |
| Li₂O | 9.311 | 9.693 | 10.243 | 7.630 | 8.178 | 8.583 | 8.987 | 9.530 | 10.120 | 9.072 |
| Na₂O | 2.878 | 2.004 | 0.870 | 5.200 | 3.950 | 3.028 | 2.108 | 0.870 | 0.730 | 1.778 |
| K₂O | 0.812 | 1.303 | 1.887 | 0.170 | 0.871 | 1.389 | 1.905 | 2.600 | 0.150 | 0.150 |
| MgO | 2.000 | 2.000 | 2.000 | 2.000 | 2.000 | 2.000 | 2.000 | 2.000 | 2.000 | 2.000 |
| CaO | 2.000 | 2.000 | 2.000 | 2.000 | 2.000 | 2.000 | 2.000 | 2.000 | 2.000 | 2.000 |
| ZnO | 1.000 | 1.000 | 1.000 | 1.000 | 1.000 | 1.000 | 1.000 | 1.000 | 1.000 | 1.000 |
| SnO₂ | | | | | | | | | | |
| Fe₂O₃ | | | | | | | | | | |
| TiO₂ | 1.000 | 1.000 | 1.000 | 1.000 | 1.000 | 1.000 | 1.000 | 1.000 | 1.000 | 1.000 |
| CeO₂ | 0.400 | 0.400 | 0.400 | 0.400 | 0.400 | 0.400 | 0.400 | 0.400 | 0.400 | 0.400 |
| ZrO₂ | | | | | | | | | | |
| La₂O₃ | | | | | | | | | | |
| SO₃ | | | | | | | | | | |
| WO₃ | | | | | | | | | | |
| Nb₂O₅ | | | | | | | | | | |
| Bi₂O₃ | | | | | | | | | | |
| MoO₃ | | | | | | | | | | |
| CeO₂ + TiO₂ | 1.400 | 1.400 | 1.400 | 1.400 | 1.400 | 1.400 | 1.400 | 1.400 | 1.400 | 1.400 |
| R₂O | 13.000 | 13.000 | 13.000 | 13.000 | 13.000 | 13.000 | 13.000 | 13.000 | 11.000 | 11.000 |
| Li₂O + Na₂O | 12.188 | 11.697 | 11.113 | 12.830 | 12.129 | 11.611 | 11.095 | 10.400 | 10.850 | 10.850 |
| R₂O − Al₂O₃ | −1.500 | −1.500 | −1.500 | −1.500 | −1.500 | −1.500 | −1.500 | −1.500 | −3.500 | −3.500 |
| R'O | 5.000 | 5.000 | 5.000 | 5.000 | 5.000 | 5.000 | 5.000 | 5.000 | 5.000 | 5.000 |
| Thickness (mm) | | | | | | | | | | |
| L* | | | | | | | | | | |
| a* | | | | | | | | | | |
| b* | | | | | | | | | | |
| Density (g/cm³) | | | | | | | | | | |
| Liquidus Temp. (° C.) | | | | | | | | | | |

| Example | 481 | 482 | 483 | 484 | 485 | 486 | 487 | 488 | 489 | 490 |
|---|---|---|---|---|---|---|---|---|---|---|
| Al₂O₃ | 14.500 | 14.500 | 14.500 | 14.500 | 14.500 | 14.500 | 14.500 | 14.500 | 14.500 | 14.500 |
| B₂O₃ | 5.000 | 5.000 | 5.000 | 5.000 | 5.000 | 5.000 | 5.000 | 5.000 | 5.000 | 5.000 |
| P₂O₅ | | | | | | | | | | |
| Li₂O | 9.537 | 8.293 | 8.609 | 9.102 | 7.511 | 7.859 | 8.189 | 8.665 | 6.450 | 6.914 |
| Na₂O | 0.730 | 2.557 | 1.701 | 0.730 | 3.339 | 2.450 | 1.704 | 0.730 | 4.400 | 3.350 |
| K₂O | 0.733 | 0.150 | 0.690 | 1.168 | 0.150 | 0.691 | 1.107 | 1.605 | 0.150 | 0.737 |
| MgO | 2.000 | 2.000 | 2.000 | 2.000 | 2.000 | 2.000 | 2.000 | 2.000 | 2.000 | 2.000 |
| CaO | 2.000 | 2.000 | 2.000 | 2.000 | 2.000 | 2.000 | 2.000 | 2.000 | 2.000 | 2.000 |
| ZnO | 1.000 | 1.000 | 1.000 | 1.000 | 1.000 | 1.000 | 1.000 | 1.000 | 1.000 | 1.000 |
| SnO₂ | | | | | | | | | | |
| Fe₂O₃ | | | | | | | | | | |
| TiO₂ | 1.000 | 1.000 | 1.000 | 1.000 | 1.000 | 1.000 | 1.000 | 1.000 | 1.000 | 1.000 |
| CeO₂ | 0.400 | 0.400 | 0.400 | 0.400 | 0.400 | 0.400 | 0.400 | 0.400 | 0.400 | 0.400 |
| ZrO₂ | | | | | | | | | | |
| La₂O₃ | | | | | | | | | | |
| SO₃ | | | | | | | | | | |
| WO₃ | | | | | | | | | | |
| Nb₂O₅ | | | | | | | | | | |
| Bi₂O₃ | | | | | | | | | | |
| MoO₃ | | | | | | | | | | |
| CeO₂ + TiO₂ | 1.400 | 1.400 | 1.400 | 1.400 | 1.400 | 1.400 | 1.400 | 1.400 | 1.400 | 1.400 |
| R₂O | 11.000 | 11.000 | 11.000 | 11.000 | 11.000 | 11.000 | 11.000 | 11.000 | 11.000 | 11.000 |
| Li₂O + Na₂O | 10.267 | 10.850 | 10.310 | 9.832 | 10.850 | 10.309 | 9.893 | 9.395 | 10.850 | 10.263 |

TABLE I-continued

| | | | | | | | | | | |
|---|---|---|---|---|---|---|---|---|---|---|
| R₂O − Al₂O₃ | −3.500 | −3.500 | −3.500 | −3.500 | −3.500 | −3.500 | −3.500 | −3.500 | −3.500 | −3.500 |
| R'O | 5.000 | 5.000 | 5.000 | 5.000 | 5.000 | 5.000 | 5.000 | 5.000 | 5.000 | 5.000 |
| Thickness (mm) | | | | | | | | | | |
| L* | | | | | | | | | | |
| a* | | | | | | | | | | |
| b* | | | | | | | | | | |
| Density (g/cm³) | | | | | | | | | | |
| Liquidus Temp. (° C.) | | | | | | | | | | |

| Example | 491 | 492 | 493 | 494 | 495 | 496 | 497 | 498 | 499 | 500 |
|---|---|---|---|---|---|---|---|---|---|---|
| SiO₂ | 63.100 | 63.100 | 63.100 | 61.100 | 61.100 | 61.100 | 61.100 | 61.100 | 61.100 | 61.100 |
| Al₂O₃ | 14.500 | 14.500 | 14.500 | 12.500 | 12.500 | 12.500 | 12.500 | 12.500 | 12.500 | 12.500 |
| B₂O₃ | 5.000 | 5.000 | 5.000 | 5.000 | 5.000 | 5.000 | 5.000 | 5.000 | 5.000 | 5.000 |
| P₂O₅ | | | | | | | | | | |
| Li₂O | 7.258 | 7.603 | 8.070 | 13.800 | 12.383 | 13.009 | 11.324 | 11.749 | 12.417 | 10.256 |
| Na₂O | 2.570 | 1.788 | 0.730 | 1.000 | 2.417 | 1.000 | 3.476 | 2.317 | 1.000 | 4.544 |
| K₂O | 1.172 | 1.609 | 2.200 | 0.200 | 0.200 | 0.991 | 0.200 | 0.934 | 1.583 | 0.200 |
| MgO | 2.000 | 2.000 | 2.000 | 2.000 | 2.000 | 2.000 | 2.000 | 2.000 | 2.000 | 2.000 |
| CaO | 2.000 | 2.000 | 2.000 | 2.000 | 2.000 | 2.000 | 2.000 | 2.000 | 2.000 | 2.000 |
| ZnO | 1.000 | 1.000 | 1.000 | 1.000 | 1.000 | 1.000 | 1.000 | 1.000 | 1.000 | 1.000 |
| SnO₂ | | | | | | | | | | |
| Fe₂O₃ | | | | | | | | | | |
| TiO₂ | 1.000 | 1.000 | 1.000 | 1.000 | 1.000 | 1.000 | 1.000 | 1.000 | 1.000 | 1.000 |
| CeO₂ | 0.400 | 0.400 | 0.400 | 0.400 | 0.400 | 0.400 | 0.400 | 0.400 | 0.400 | 0.400 |
| ZrO₂ | | | | | | | | | | |
| La₂O₃ | | | | | | | | | | |
| SO₃ | | | | | | | | | | |
| WO₃ | | | | | | | | | | |
| Nb₂O₅ | | | | | | | | | | |
| Bi₂O₃ | | | | | | | | | | |
| MoO₃ | | | | | | | | | | |
| CeO₂ + TiO₂ | 1.400 | 1.400 | 1.400 | 1.400 | 1.400 | 1.400 | 1.400 | 1.400 | 1.400 | 1.400 |
| R₂O | 11.000 | 11.000 | 11.000 | 15.000 | 15.000 | 15.000 | 15.000 | 15.000 | 15.000 | 15.000 |
| Li₂O + Na₂O | 9.828 | 9.391 | 8.800 | 14.800 | 14.800 | 14.009 | 14.800 | 14.066 | 13.417 | 14.800 |
| R₂O − Al₂O₃ | −3.500 | −3.500 | −3.500 | 2.500 | 2.500 | 2.500 | 2.500 | 2.500 | 2.500 | 2.500 |
| R'O | 5.000 | 5.000 | 5.000 | 5.000 | 5.000 | 5.000 | 5.000 | 5.000 | 5.000 | 5.000 |
| Thickness (mm) | | | | | | | | | | |
| L* | | | | | | | | | | |
| a* | | | | | | | | | | |
| b* | | | | | | | | | | |
| Density (g/cm³) | | | | | | | | | | |
| Liquidus Temp. (° C.) | | | | | | | | | | |

| Example | 501 | 502 | 503 | 504 | 505 | 506 | 507 | 508 | 509 | 510 |
|---|---|---|---|---|---|---|---|---|---|---|
| SiO₂ | 61.100 | 61.100 | 61.100 | 61.100 | 61.100 | 61.100 | 61.100 | 61.100 | 61.100 | 61.100 |
| Al₂O₃ | 12.500 | 12.500 | 12.500 | 12.500 | 12.500 | 12.500 | 12.500 | 12.500 | 14.500 | 14.500 |
| B₂O₃ | 5.000 | 5.000 | 5.000 | 5.000 | 5.000 | 5.000 | 5.000 | 5.000 | 5.000 | 5.000 |
| P₂O₅ | | | | | | | | | | |
| Li₂O | 10.727 | 11.173 | 11.818 | 8.800 | 9.430 | 9.897 | 10.366 | 11.000 | 13.800 | 12.394 |
| Na₂O | 3.336 | 2.323 | 1.000 | 6.000 | 4.568 | 3.506 | 2.441 | 1.000 | 1.000 | 2.406 |
| K₂O | 0.937 | 1.504 | 2.182 | 0.200 | 1.002 | 1.597 | 2.193 | 3.000 | 0.200 | 0.200 |
| MgO | 2.000 | 2.000 | 2.000 | 2.000 | 2.000 | 2.000 | 2.000 | 2.000 | 1.800 | 1.547 |
| CaO | 2.000 | 2.000 | 2.000 | 2.000 | 2.000 | 2.000 | 2.000 | 2.000 | 0.300 | 0.722 |
| ZnO | 1.000 | 1.000 | 1.000 | 1.000 | 1.000 | 1.000 | 1.000 | 1.000 | 0.900 | 0.731 |
| SnO₂ | | | | | | | | | | |
| Fe₂O₃ | | | | | | | | | | |
| TiO₂ | 1.000 | 1.000 | 1.000 | 1.000 | 1.000 | 1.000 | 1.000 | 1.000 | 1.000 | 1.000 |
| CeO₂ | 0.400 | 0.400 | 0.400 | 0.400 | 0.400 | 0.400 | 0.400 | 0.400 | 0.400 | 0.400 |
| ZrO₂ | | | | | | | | | | |
| La₂O₃ | | | | | | | | | | |
| SO₃ | | | | | | | | | | |
| WO₃ | | | | | | | | | | |
| Nb₂O₅ | | | | | | | | | | |
| Bi₂O₃ | | | | | | | | | | |
| MoO₃ | | | | | | | | | | |
| CeO₂ + TiO₂ | 1.400 | 1.400 | 1.400 | 1.400 | 1.400 | 1.400 | 1.400 | 1.400 | 1.400 | 1.400 |
| R₂O | 15.000 | 15.000 | 15.000 | 15.000 | 15.000 | 15.000 | 15.000 | 15.000 | 15.000 | 15.000 |

TABLE I-continued

| | | | | | | | | | | |
|---|---|---|---|---|---|---|---|---|---|---|
| $Li_2O + Na_2O$ | 14.063 | 13.496 | 12.818 | 14.800 | 13.998 | 13.403 | 12.807 | 12.000 | 14.800 | 14.800 |
| $R_2O - Al_2O_3$ | 2.500 | 2.500 | 2.500 | 2.500 | 2.500 | 2.500 | 2.500 | 2.500 | 0.500 | 0.500 |
| R'O | 5.000 | 5.000 | 5.000 | 5.000 | 5.000 | 5.000 | 5.000 | 5.000 | 3.000 | 3.000 |
| Thickness (mm) | | | | | | | | | | |
| L* | | | | | | | | | | |
| a* | | | | | | | | | | |
| b* | | | | | | | | | | |
| Density (g/cm³) | | | | | | | | | | |
| Liquidus Temp. (° C.) | | | | | | | | | | |

| Example | 511 | 512 | 513 | 514 | 515 | 516 | 517 | 518 | 519 | 520 |
|---|---|---|---|---|---|---|---|---|---|---|
| $SiO_2$ | 61.100 | 61.100 | 61.100 | 61.100 | 61.100 | 61.100 | 61.100 | 61.100 | 61.100 | 61.100 |
| $Al_2O_3$ | 14.500 | 14.500 | 14.500 | 14.500 | 14.500 | 14.500 | 14.500 | 14.500 | 14.500 | 14.500 |
| $B_2O_3$ | 5.000 | 5.000 | 5.000 | 5.000 | 5.000 | 5.000 | 5.000 | 5.000 | 5.000 | 5.000 |
| $P_2O_5$ | | | | | | | | | | |
| $Li_2O$ | 13.013 | 11.337 | 11.759 | 12.421 | 10.267 | 10.736 | 11.180 | 11.822 | 8.800 | 9.432 |
| $Na_2O$ | 1.000 | 3.463 | 2.309 | 1.000 | 4.533 | 3.328 | 2.317 | 1.000 | 6.000 | 4.564 |
| $K_2O$ | 0.987 | 0.200 | 0.932 | 1.579 | 0.200 | 0.937 | 1.502 | 2.178 | 0.200 | 1.004 |
| MgO | 1.378 | 1.357 | 1.172 | 1.061 | 1.164 | 0.986 | 0.865 | 0.740 | 0.900 | 0.728 |
| CaO | 0.469 | 1.039 | 0.850 | 0.595 | 1.360 | 1.156 | 0.974 | 0.724 | 1.800 | 1.542 |
| ZnO | 1.153 | 0.604 | 0.978 | 1.343 | 0.476 | 0.858 | 1.161 | 1.536 | 0.300 | 0.731 |
| $SnO_2$ | | | | | | | | | | |
| $Fe_2O_3$ | | | | | | | | | | |
| $TiO_2$ | 1.000 | 1.000 | 1.000 | 1.000 | 1.000 | 1.000 | 1.000 | 1.000 | 1.000 | 1.000 |
| $CeO_2$ | 0.400 | 0.400 | 0.400 | 0.400 | 0.400 | 0.400 | 0.400 | 0.400 | 0.400 | 0.400 |
| $ZrO_2$ | | | | | | | | | | |
| $La_2O_3$ | | | | | | | | | | |
| $SO_3$ | | | | | | | | | | |
| $WO_3$ | | | | | | | | | | |
| $Nb_2O_5$ | | | | | | | | | | |
| $Bi_2O_3$ | | | | | | | | | | |
| $MoO_3$ | | | | | | | | | | |
| $CeO_2 + TiO_2$ | 1.400 | 1.400 | 1.400 | 1.400 | 1.400 | 1.400 | 1.400 | 1.400 | 1.400 | 1.400 |
| $R_2O$ | 15.000 | 15.000 | 15.000 | 15.000 | 15.000 | 15.000 | 15.000 | 15.000 | 15.000 | 15.000 |
| $Li_2O + Na_2O$ | 14.013 | 14.800 | 14.068 | 13.421 | 14.800 | 14.063 | 13.498 | 12.822 | 14.800 | 13.996 |
| $R_2O - Al_2O_3$ | 0.500 | 0.500 | 0.500 | 0.500 | 0.500 | 0.500 | 0.500 | 0.500 | 0.500 | 0.500 |
| R'O | 3.000 | 3.000 | 3.000 | 3.000 | 3.000 | 3.000 | 3.000 | 3.000 | 3.000 | 3.000 |
| Thickness (mm) | | | | | | | | | | |
| L* | | | | | | | | | | |
| a* | | | | | | | | | | |
| b* | | | | | | | | | | |
| Density (g/cm³) | | | | | | | | | | |
| Liquidus Temp. (° C.) | | | | | | | | | | |

| Example | 521 | 522 | 523 | 524 | 525 | 526 | 527 | 528 | 529 | 530 |
|---|---|---|---|---|---|---|---|---|---|---|
| $SiO_2$ | 61.100 | 61.100 | 61.100 | 63.100 | 63.100 | 63.100 | 63.100 | 63.100 | 63.100 | 63.100 |
| $Al_2O_3$ | 14.500 | 14.500 | 14.500 | 14.500 | 14.500 | 14.500 | 14.500 | 14.500 | 14.500 | 14.500 |
| $B_2O_3$ | 5.000 | 5.000 | 5.000 | 1.000 | 1.000 | 1.000 | 1.000 | 1.000 | 1.000 | 1.000 |
| $P_2O_5$ | | | | | | | | | | |
| $Li_2O$ | 9.899 | 10.368 | 11.000 | 13.800 | 12.391 | 13.015 | 11.334 | 11.757 | 12.424 | 10.264 |
| $Na_2O$ | 3.501 | 2.437 | 1.000 | 1.000 | 2.409 | 1.000 | 3.466 | 2.313 | 1.000 | 4.536 |
| $K_2O$ | 1.599 | 2.195 | 3.000 | 0.200 | 0.200 | 0.985 | 0.200 | 0.930 | 1.576 | 0.200 |
| MgO | 0.600 | 0.472 | 0.300 | 2.000 | 2.000 | 2.000 | 2.000 | 2.000 | 2.000 | 2.000 |
| CaO | 1.350 | 1.159 | 0.900 | 2.000 | 2.000 | 2.000 | 2.000 | 2.000 | 2.000 | 2.000 |
| ZnO | 1.050 | 1.369 | 1.800 | 1.000 | 1.000 | 1.000 | 1.000 | 1.000 | 1.000 | 1.000 |
| $SnO_2$ | | | | | | | | | | |
| $Fe_2O_3$ | | | | | | | | | | |
| $TiO_2$ | 1.000 | 1.000 | 1.000 | 1.000 | 1.000 | 1.000 | 1.000 | 1.000 | 1.000 | 1.000 |
| $CeO_2$ | 0.400 | 0.400 | 0.400 | 0.400 | 0.400 | 0.400 | 0.400 | 0.400 | 0.400 | 0.400 |
| $ZrO_2$ | | | | | | | | | | |
| $La_2O_3$ | | | | | | | | | | |
| $SO_3$ | | | | | | | | | | |
| $WO_3$ | | | | | | | | | | |
| $Nb_2O_5$ | | | | | | | | | | |
| $Bi_2O_3$ | | | | | | | | | | |
| $MoO_3$ | | | | | | | | | | |
| $CeO_2 + TiO_2$ | 1.400 | 1.400 | 1.400 | 1.400 | 1.400 | 1.400 | 1.400 | 1.400 | 1.400 | 1.400 |
| $R_2O$ | 15.000 | 15.000 | 15.000 | 15.000 | 15.000 | 15.000 | 15.000 | 15.000 | 15.000 | 15.000 |

TABLE I-continued

| | | | | | | | | | | |
|---|---|---|---|---|---|---|---|---|---|---|
| Li₂O + Na₂O | 13.401 | 12.805 | 12.000 | 14.800 | 14.800 | 14.015 | 14.800 | 14.070 | 13.424 | 14.800 |
| R₂O − Al₂O₃ | 0.500 | 0.500 | 0.500 | 0.500 | 0.500 | 0.500 | 0.500 | 0.500 | 0.500 | 0.500 |
| R'O | 3.000 | 3.000 | 3.000 | 5.000 | 5.000 | 5.000 | 5.000 | 5.000 | 5.000 | 5.000 |
| Thickness (mm) | | | | | | | | | | |
| L* | | | | | | | | | | |
| a* | | | | | | | | | | |
| b* | | | | | | | | | | |
| Density (g/cm³) | | | | | | | | | | |
| Liquidus Temp. (° C.) | | | | | | | | | | |

| Example | 531 | 532 | 533 | 534 | 535 | 536 | 537 | 538 | 539 | 540 |
|---|---|---|---|---|---|---|---|---|---|---|
| SiO₂ | 63.100 | 63.100 | 63.100 | 63.100 | 63.100 | 63.100 | 63.100 | 63.100 | 55.100 | 55.100 |
| Al₂O₃ | 14.500 | 14.500 | 14.500 | 14.500 | 14.500 | 14.500 | 14.500 | 14.500 | 14.500 | 14.500 |
| B₂O₃ | 1.000 | 1.000 | 1.000 | 1.000 | 1.000 | 1.000 | 1.000 | 1.000 | 9.000 | 9.000 |
| P₂O₅ | | | | | | | | | | |
| Li₂O | 10.733 | 11.179 | 11.824 | 8.800 | 9.429 | 9.896 | 10.364 | 11.000 | 13.800 | 12.391 |
| Na₂O | 3.333 | 2.322 | 1.000 | 6.000 | 4.571 | 3.510 | 2.444 | 1.000 | 1.000 | 2.409 |
| K₂O | 0.934 | 1.499 | 2.176 | 0.200 | 1.000 | 1.595 | 2.191 | 3.000 | 0.200 | 0.200 |
| MgO | 2.000 | 2.000 | 2.000 | 2.000 | 2.000 | 2.000 | 2.000 | 2.000 | 2.000 | 2.000 |
| CaO | 2.000 | 2.000 | 2.000 | 2.000 | 2.000 | 2.000 | 2.000 | 2.000 | 2.000 | 2.000 |
| ZnO | 1.000 | 1.000 | 1.000 | 1.000 | 1.000 | 1.000 | 1.000 | 1.000 | 1.000 | 1.000 |
| SnO₂ | | | | | | | | | | |
| Fe₂O₃ | | | | | | | | | | |
| TiO₂ | 1.000 | 1.000 | 1.000 | 1.000 | 1.000 | 1.000 | 1.000 | 1.000 | 1.000 | 1.000 |
| CeO₂ | 0.400 | 0.400 | 0.400 | 0.400 | 0.400 | 0.400 | 0.400 | 0.400 | 0.400 | 0.400 |
| ZrO₂ | | | | | | | | | | |
| La₂O₃ | | | | | | | | | | |
| SO₃ | | | | | | | | | | |
| WO₃ | | | | | | | | | | |
| Nb₂O₅ | | | | | | | | | | |
| Bi₂O₃ | | | | | | | | | | |
| MoO₃ | | | | | | | | | | |
| CeO₂ + TiO₂ | 1.400 | 1.400 | 1.400 | 1.400 | 1.400 | 1.400 | 1.400 | 1.400 | 1.400 | 1.400 |
| R₂O | 15.000 | 15.000 | 15.000 | 15.000 | 15.000 | 15.000 | 15.000 | 15.000 | 15.000 | 15.000 |
| Li₂O + Na₂O | 14.066 | 13.501 | 12.824 | 14.800 | 14.000 | 13.405 | 12.809 | 12.000 | 14.800 | 14.800 |
| R₂O − Al₂O₃ | 0.500 | 0.500 | 0.500 | 0.500 | 0.500 | 0.500 | 0.500 | 0.500 | 0.500 | 0.500 |
| R'O | 5.000 | 5.000 | 5.000 | 5.000 | 5.000 | 5.000 | 5.000 | 5.000 | 5.000 | 5.000 |
| Thickness (mm) | | | | | | | | | | |
| L* | | | | | | | | | | |
| a* | | | | | | | | | | |
| b* | | | | | | | | | | |
| Density (g/cm³) | | | | | | | | | | |
| Liquidus Temp. (° C.) | | | | | | | | | | |

| Example | 541 | 542 | 543 | 544 | 545 | 546 | 547 | 548 | 549 | 550 |
|---|---|---|---|---|---|---|---|---|---|---|
| SiO₂ | 55.100 | 55.100 | 55.100 | 55.100 | 55.100 | 55.100 | 55.100 | 55.100 | 55.100 | 55.100 |
| Al₂O₃ | 14.500 | 14.500 | 14.500 | 14.500 | 14.500 | 14.500 | 14.500 | 14.500 | 14.500 | 14.500 |
| B₂O₃ | 9.000 | 9.000 | 9.000 | 9.000 | 9.000 | 9.000 | 9.000 | 9.000 | 9.000 | 9.000 |
| P₂O₅ | | | | | | | | | | |
| Li₂O | 13.016 | 11.333 | 11.757 | 12.425 | 10.264 | 10.732 | 11.179 | 11.825 | 8.800 | 9.428 |
| Na₂O | 1.000 | 3.467 | 2.314 | 1.000 | 4.536 | 3.335 | 2.323 | 1.000 | 6.000 | 4.573 |
| K₂O | 0.984 | 0.200 | 0.929 | 1.575 | 0.200 | 0.933 | 1.498 | 2.175 | 0.200 | 0.999 |
| MgO | 2.000 | 2.000 | 2.000 | 2.000 | 2.000 | 2.000 | 2.000 | 2.000 | 2.000 | 2.000 |
| CaO | 2.000 | 2.000 | 2.000 | 2.000 | 2.000 | 2.000 | 2.000 | 2.000 | 2.000 | 2.000 |
| ZnO | 1.000 | 1.000 | 1.000 | 1.000 | 1.000 | 1.000 | 1.000 | 1.000 | 1.000 | 1.000 |
| SnO₂ | | | | | | | | | | |
| Fe₂O₃ | | | | | | | | | | |
| TiO₂ | 1.000 | 1.000 | 1.000 | 1.000 | 1.000 | 1.000 | 1.000 | 1.000 | 1.000 | 1.000 |
| CeO₂ | 0.400 | 0.400 | 0.400 | 0.400 | 0.400 | 0.400 | 0.400 | 0.400 | 0.400 | 0.400 |
| ZrO₂ | | | | | | | | | | |
| La₂O₃ | | | | | | | | | | |
| SO₃ | | | | | | | | | | |
| WO₃ | | | | | | | | | | |
| Nb₂O₅ | | | | | | | | | | |
| Bi₂O₃ | | | | | | | | | | |
| MoO₃ | | | | | | | | | | |
| CeO₂ + TiO₂ | 1.400 | 1.400 | 1.400 | 1.400 | 1.400 | 1.400 | 1.400 | 1.400 | 1.400 | 1.400 |
| R₂O | 15.000 | 15.000 | 15.000 | 15.000 | 15.000 | 15.000 | 15.000 | 15.000 | 15.000 | 15.000 |

TABLE I-continued

| | | | | | | | | | | |
|---|---|---|---|---|---|---|---|---|---|---|
| Li₂O + Na₂O | 14.016 | 14.800 | 14.071 | 13.425 | 14.800 | 14.067 | 13.502 | 12.825 | 14.800 | 14.001 |
| R₂O − Al₂O₃ | 0.500 | 0.500 | 0.500 | 0.500 | 0.500 | 0.500 | 0.500 | 0.500 | 0.500 | 0.500 |
| R'O | 5.000 | 5.000 | 5.000 | 5.000 | 5.000 | 5.000 | 5.000 | 5.000 | 5.000 | 5.000 |
| Thickness (mm) | | | | | | | | | | |
| L* | | | | | | | | | | |
| a* | | | | | | | | | | |
| b* | | | | | | | | | | |
| Density (g/cm³) | | | | | | | | | | |
| Liquidus Temp. (° C.) | | | | | | | | | | |

| Example | 551 | 552 | 553 | 554 | 555 | 556 | 557 | 558 | 559 | 560 |
|---|---|---|---|---|---|---|---|---|---|---|
| SiO₂ | 55.100 | 55.100 | 55.100 | 60.700 | 60.700 | 60.700 | 60.700 | 60.700 | 60.700 | 60.700 |
| Al₂O₃ | 14.500 | 14.500 | 14.500 | 14.700 | 14.700 | 14.700 | 14.700 | 14.700 | 14.700 | 14.700 |
| B₂O₃ | 9.000 | 9.000 | 9.000 | 6.000 | 6.000 | 6.000 | 6.000 | 6.000 | 6.000 | 6.000 |
| P₂O₅ | | | | | | | | | | |
| Li₂O | 9.895 | 10.364 | 11.000 | 9.000 | 9.000 | 9.000 | 9.000 | 9.000 | 9.000 | 9.000 |
| Na₂O | 3.511 | 2.446 | 1.000 | 2.000 | 2.000 | 2.000 | 2.000 | 2.000 | 2.000 | 2.000 |
| K₂O | 1.594 | 2.190 | 3.000 | 0.200 | 0.200 | 0.200 | 0.200 | 0.200 | 0.200 | 0.200 |
| MgO | 2.000 | 2.000 | 2.000 | 5.500 | 4.060 | 4.357 | 2.996 | 3.112 | 3.508 | 1.933 |
| CaO | 2.000 | 2.000 | 2.000 | 0.500 | 1.940 | 0.786 | 3.004 | 2.097 | 0.998 | 4.067 |
| ZnO | 1.000 | 1.000 | 1.000 | 0.000 | 0.000 | 0.857 | 0.000 | 0.791 | 1.494 | 0.000 |
| SnO₂ | | | | | | | | | | |
| Fe₂O₃ | | | | | | | | | | |
| TiO₂ | 1.000 | 1.000 | 1.000 | 1.000 | 1.000 | 1.000 | 1.000 | 1.000 | 1.000 | 1.000 |
| CeO₂ | 0.400 | 0.400 | 0.400 | 0.400 | 0.400 | 0.400 | 0.400 | 0.400 | 0.400 | 0.400 |
| ZrO₂ | | | | | | | | | | |
| La₂O₃ | | | | | | | | | | |
| SO₃ | | | | | | | | | | |
| WO₃ | | | | | | | | | | |
| Nb₂O₅ | | | | | | | | | | |
| Bi₂O₃ | | | | | | | | | | |
| MoO₃ | | | | | | | | | | |
| CeO₂ + TiO₂ | 1.400 | 1.400 | 1.400 | 1.400 | 1.400 | 1.400 | 1.400 | 1.400 | 1.400 | 1.400 |
| R₂O | 15.000 | 15.000 | 15.000 | 11.200 | 11.200 | 11.200 | 11.200 | 11.200 | 11.200 | 11.200 |
| Li₂O + Na₂O | 13.406 | 12.810 | 12.000 | 11.000 | 11.000 | 11.000 | 11.000 | 11.000 | 11.000 | 11.000 |
| R₂O − Al₂O₃ | 0.500 | 0.500 | 0.500 | −3.500 | −3.500 | −3.500 | −3.500 | −3.500 | −3.500 | −3.500 |
| R'O | 5.000 | 5.000 | 5.000 | 6.000 | 6.000 | 6.000 | 6.000 | 6.000 | 6.000 | 6.000 |
| Thickness (mm) | | | | | | | | | | |
| L* | | | | | | | | | | |
| a* | | | | | | | | | | |
| b* | | | | | | | | | | |
| Density (g/cm³) | | | | | | | | | | |
| Liquidus Temp. (° C.) | | | | | | | | | | |

| Example | 561 | 562 | 563 | 564 | 565 | 566 | 567 | 568 | 569 | 570 |
|---|---|---|---|---|---|---|---|---|---|---|
| SiO₂ | 60.700 | 60.700 | 60.700 | 60.700 | 60.700 | 60.700 | 60.700 | 60.700 | 60.700 | 60.804 |
| Al₂O₃ | 14.700 | 14.700 | 14.700 | 14.700 | 14.700 | 14.700 | 14.700 | 14.700 | 14.700 | 14.704 |
| B₂O₃ | 6.000 | 6.000 | 6.000 | 6.000 | 6.000 | 6.000 | 6.000 | 6.000 | 6.000 | 6.002 |
| P₂O₅ | | | | | | | | | | |
| Li₂O | 9.000 | 9.000 | 9.000 | 9.000 | 9.000 | 9.000 | 9.000 | 9.000 | 9.000 | 9.003 |
| Na₂O | 2.000 | 2.000 | 2.000 | 2.000 | 2.000 | 2.000 | 2.000 | 2.000 | 2.000 | 2.001 |
| K₂O | 0.200 | 0.200 | 0.200 | 0.200 | 0.200 | 0.200 | 0.200 | 0.200 | 0.200 | 0.200 |
| MgO | 2.091 | 2.298 | 2.655 | 0.500 | 0.785 | 0.997 | 1.210 | 1.500 | 4.500 | 3.634 |
| CaO | 3.118 | 2.302 | 1.211 | 5.500 | 4.360 | 3.511 | 2.658 | 1.500 | 1.500 | 2.368 |
| ZnO | 0.791 | 1.400 | 2.133 | 0.000 | 0.855 | 1.492 | 2.131 | 3.000 | | |
| SnO₂ | | | | | | | | | | |
| Fe₂O₃ | | | | | | | | | | |
| TiO₂ | 1.000 | 1.000 | 1.000 | 1.000 | 1.000 | 1.000 | 1.000 | 1.000 | 1.000 | 0.885 |
| CeO₂ | 0.400 | 0.400 | 0.400 | 0.400 | 0.400 | 0.400 | 0.400 | 0.400 | 0.400 | 0.400 |
| ZrO₂ | | | | | | | | | | |
| La₂O₃ | | | | | | | | | | |
| SO₃ | | | | | | | | | | |
| WO₃ | | | | | | | | | | |
| Nb₂O₅ | | | | | | | | | | |
| Bi₂O₃ | | | | | | | | | | |
| MoO₃ | | | | | | | | | | |
| CeO₂ + TiO₂ | 1.400 | 1.400 | 1.400 | 1.400 | 1.400 | 1.400 | 1.400 | 1.400 | 1.400 | 1.285 |
| R₂O | 11.200 | 11.200 | 11.200 | 11.200 | 11.200 | 11.200 | 11.200 | 11.200 | 11.200 | 11.203 |

TABLE I-continued

| | | | | | | | | | | |
|---|---|---|---|---|---|---|---|---|---|---|
| Li$_2$O + Na$_2$O | 11.000 | 11.000 | 11.000 | 11.000 | 11.000 | 11.000 | 11.000 | 11.000 | 11.000 | 11.003 |
| R$_2$O − Al$_2$O$_3$ | −3.500 | −3.500 | −3.500 | 3.500 | −3.500 | −3.500 | −3.500 | −3.500 | −3.500 | −3.501 |
| R'O | 6.000 | 6.000 | 6.000 | 6.000 | 6.000 | 6.000 | 6.000 | 6.000 | 6.000 | 6.002 |
| Thickness (mm) | | | | | | | | | | |
| L* | | | | | | | | | | |
| a* | | | | | | | | | | |
| b* | | | | | | | | | | |
| Density (g/cm$^3$) | | | | | | | | | | |
| Liquidus Temp. (° C.) | | | | | | | | | | |

| Example | 571 | 572 | 573 | 574 | 575 | 576 | 577 | 578 | 579 | 580 |
|---|---|---|---|---|---|---|---|---|---|---|
| SiO$_2$ | 62.143 | 60.881 | 62.128 | 63.193 | 60.958 | 62.199 | 63.132 | 64.227 | 61.061 | 62.392 |
| Al$_2$O$_3$ | 13.463 | 14.707 | 13.562 | 12.563 | 14.711 | 13.567 | 12.700 | 11.677 | 14.715 | 13.479 |
| B$_2$O$_3$ | 6.000 | 6.003 | 6.002 | 6.000 | 6.004 | 6.003 | 6.002 | 6.000 | 6.006 | 6.004 |
| P$_2$O$_5$ | | | | | | | | | | |
| Li$_2$O | 9.589 | 9.005 | 9.546 | 10.018 | 9.006 | 9.547 | 9.956 | 10.440 | 9.009 | 9.593 |
| Na$_2$O | 1.853 | 2.001 | 1.865 | 1.746 | 2.001 | 1.865 | 1.762 | 1.640 | 2.002 | 1.855 |
| K$_2$O | 0.200 | 0.200 | 0.200 | 0.200 | 0.200 | 0.200 | 0.200 | 0.200 | 0.200 | 0.200 |
| MgO | 3.174 | 2.996 | 2.484 | 2.210 | 2.359 | 1.880 | 1.567 | 1.261 | 1.502 | 1.061 |
| CaO | 2.236 | 3.008 | 2.974 | 2.772 | 3.646 | 3.580 | 3.481 | 3.300 | 4.505 | 4.357 |
| ZnO | | | | | | | | | | |
| SnO$_2$ | | | | | | | | | | |
| Fe$_2$O$_3$ | | | | | | | | | | |
| TiO$_2$ | 1.000 | 0.800 | 0.894 | 1.000 | 0.715 | 0.814 | 0.895 | 1.000 | 0.601 | 0.718 |
| CeO$_2$ | 0.341 | 0.400 | 0.346 | 0.298 | 0.400 | 0.346 | 0.305 | 0.256 | 0.400 | 0.342 |
| ZrO$_2$ | | | | | | | | | | |
| La$_2$O$_3$ | | | | | | | | | | |
| SO$_3$ | | | | | | | | | | |
| WO$_3$ | | | | | | | | | | |
| Nb$_2$O$_5$ | | | | | | | | | | |
| Bi$_2$O$_3$ | | | | | | | | | | |
| MoO$_3$ | | | | | | | | | | |
| CeO$_2$ + TiO$_2$ | 1.341 | 1.200 | 1.240 | 1.298 | 1.115 | 1.160 | 1.200 | 1.256 | 1.001 | 1.059 |
| R$_2$O | 11.642 | 11.206 | 11.611 | 11.963 | 11.208 | 11.612 | 11.919 | 12.280 | 11.211 | 11.648 |
| Li$_2$O + Na$_2$O | 11.442 | 11.006 | 11.411 | 11.763 | 11.008 | 11.412 | 11.718 | 12.080 | 11.011 | 11.447 |
| R$_2$O − Al$_2$O$_3$ | −1.821 | −3.502 | −1.951 | −0.600 | −3.502 | −1.954 | −0.782 | 0.603 | −3.503 | −1.832 |
| R'O | 5.411 | 6.003 | 5.458 | 4.982 | 6.004 | 5.460 | 5.047 | 4.560 | 6.006 | 5.418 |
| Thickness (mm) | | | | | | | | | | |
| L* | | | | | | | | | | |
| a* | | | | | | | | | | |
| b* | | | | | | | | | | |
| Density (g/cm$^3$) | | | | | | | | | | |
| Liquidus Temp. (° C.) | | | | | | | | | | |

| Example | 581 | 582 | 583 | 584 | 585 | 586 | 587 | 588 | 589 | 590 |
|---|---|---|---|---|---|---|---|---|---|---|
| SiO$_2$ | 63.363 | 64.322 | 65.600 | 60.700 | 60.817 | 61.571 | 60.902 | 61.607 | 62.195 | 60.987 |
| Al$_2$O$_3$ | 12.578 | 11.687 | 10.500 | 14.700 | 13.823 | 13.139 | 13.182 | 12.468 | 12.019 | 12.547 |
| B$_2$O$_3$ | 6.003 | 6.002 | 6.000 | 6.000 | 6.877 | 6.901 | 7.518 | 7.625 | 7.547 | 8.153 |
| P$_2$O$_5$ | | | | | | | | | | |
| Li$_2$O | 10.019 | 10.439 | 11.000 | 9.000 | 9.000 | 9.600 | 9.000 | 9.552 | 10.031 | 9.000 |
| Na$_2$O | 1.747 | 1.641 | 1.500 | 2.000 | 2.000 | 1.850 | 2.000 | 1.862 | 1.742 | 2.000 |
| K$_2$O | 0.200 | 0.200 | 0.200 | 0.200 | 0.200 | 0.200 | 0.200 | 0.200 | 0.200 | 0.200 |
| MgO | 0.740 | 0.423 | 0.000 | 4.500 | 3.623 | 4.050 | 2.982 | 3.289 | 3.727 | 2.347 |
| CaO | 4.249 | 4.142 | 4.000 | 1.500 | 2.377 | 1.350 | 3.018 | 2.159 | 1.242 | 3.653 |
| ZnO | | | | | | | | | | |
| SnO$_2$ | | | | | | | | | | |
| Fe$_2$O$_3$ | | | | | | | | | | |
| TiO$_2$ | 0.803 | 0.888 | 1.000 | 1.000 | 0.883 | 1.000 | 0.798 | 0.894 | 1.000 | 0.713 |
| CeO$_2$ | 0.299 | 0.256 | 0.200 | 0.400 | 0.400 | 0.340 | 0.400 | 0.345 | 0.297 | 0.400 |
| ZrO$_2$ | | | | | | | | | | |
| La$_2$O$_3$ | | | | | | | | | | |
| SO$_3$ | | | | | | | | | | |
| WO$_3$ | | | | | | | | | | |
| Nb$_2$O$_5$ | | | | | | | | | | |
| Bi$_2$O$_3$ | | | | | | | | | | |
| MoO$_3$ | | | | | | | | | | |
| CeO$_2$ + TiO$_2$ | 1.102 | 1.144 | 1.200 | 1.400 | 1.283 | 1.340 | 1.198 | 1.239 | 1.297 | 1.113 |
| R$_2$O | 11.966 | 12.281 | 12.700 | 11.200 | 11.200 | 11.650 | 11.200 | 11.614 | 11.973 | 11.200 |

TABLE I-continued

| | | | | | | | | | | |
|---|---|---|---|---|---|---|---|---|---|---|
| Li₂O + Na₂O | 11.766 | 12.081 | 12.500 | 11.000 | 11.000 | 11.450 | 11.000 | 11.414 | 11.773 | 11.000 |
| R₂O − Al₂O₃ | −0.611 | 0.594 | 2.200 | −3.500 | −2.623 | −1.489 | −1.982 | −0.854 | −0.046 | −1.347 |
| R'O | 4.989 | 4.565 | 4.000 | 6.000 | 6.000 | 5.400 | 6.000 | 5.448 | 4.969 | 6.000 |
| Thickness (mm) | | | | | | | | | | |
| L* | | | | | | | | | | |
| a* | | | | | | | | | | |
| b* | | | | | | | | | | |
| Density (g/cm³) | | | | | | | | | | |
| Liquidus Temp. (° C.) | | | | | | | | | | |

| Example | 591 | 592 | 593 | 594 | 595 | 596 | 597 | 598 | 599 | 600 |
|---|---|---|---|---|---|---|---|---|---|---|
| SiO₂ | 61.683 | 62.202 | 62.803 | 61.100 | 61.838 | 62.374 | 62.901 | 63.600 | 60.661 | 62.068 |
| Al₂O₃ | 11.870 | 11.409 | 10.929 | 11.700 | 11.051 | 10.579 | 10.115 | 9.500 | 14.715 | 13.849 |
| B₂O₃ | 8.226 | 8.232 | 8.176 | 9.000 | 9.000 | 9.000 | 9.000 | 9.000 | 6.006 | 5.113 |
| P₂O₅ | | | | | | | | | | |
| Li₂O | 9.549 | 9.963 | 10.451 | 9.000 | 9.590 | 10.019 | 10.441 | 11.000 | 9.009 | 9.600 |
| Na₂O | 1.863 | 1.759 | 1.637 | 2.000 | 1.852 | 1.745 | 1.640 | 1.500 | 2.002 | 2.001 |
| K₂O | 0.200 | 0.200 | 0.200 | 0.200 | 0.200 | 0.200 | 0.200 | 0.200 | 0.200 | 0.200 |
| MgO | 2.686 | 2.991 | 3.412 | 1.500 | 1.943 | 2.264 | 2.581 | 3.000 | 4.505 | 4.503 |
| CaO | 2.764 | 2.046 | 1.137 | 4.500 | 3.467 | 2.717 | 1.978 | 1.000 | 1.502 | 1.501 |
| ZnO | | | | | | | | | | |
| SnO₂ | | | | | | | | | | |
| Fe₂O₃ | | | | | | | | | | |
| TiO₂ | 0.813 | 0.895 | 1.000 | 0.600 | 0.718 | 0.804 | 0.888 | 1.000 | 1.001 | 0.852 |
| CeO₂ | 0.345 | 0.304 | 0.255 | 0.400 | 0.341 | 0.298 | 0.256 | 0.200 | 0.400 | 0.311 |
| ZrO₂ | | | | | | | | | | |
| La₂O₃ | | | | | | | | | | |
| SO₃ | | | | | | | | | | |
| WO₃ | | | | | | | | | | |
| Nb₂O₅ | | | | | | | | | | |
| Bi₂O₃ | | | | | | | | | | |
| MoO₃ | | | | | | | | | | |
| CeO₂ + TiO₂ | 1.158 | 1.199 | 1.255 | 1.000 | 1.059 | 1.102 | 1.144 | 1.200 | 1.401 | 1.163 |
| R₂O | 11.612 | 11.922 | 12.288 | 11.200 | 11.643 | 11.964 | 12.281 | 12.700 | 11.211 | 11.802 |
| Li₂O + Na₂O | 11.412 | 11.722 | 12.088 | 11.000 | 11.443 | 11.764 | 12.081 | 12.500 | 11.011 | 11.602 |
| R₂O − Al₂O₃ | −0.258 | 0.514 | 1.359 | −0.500 | 0.592 | 1.385 | 2.166 | 3.200 | −3.503 | −2.047 |
| R'O | 5.451 | 5.037 | 4.549 | 6.000 | 5.410 | 4.981 | 4.559 | 4.000 | 6.006 | 6.004 |
| Thickness (mm) | | | | | | | | | | |
| L* | | | | | | | | | | |
| a* | | | | | | | | | | |
| b* | | | | | | | | | | |
| Density (g/cm³) | | | | | | | | | | |
| Liquidus Temp. (° C.) | | | | | | | | | | |

| Example | 601 | 602 | 603 | 604 | 605 | 606 | 607 | 608 | 609 | 610 |
|---|---|---|---|---|---|---|---|---|---|---|
| SiO₂ | 62.777 | 63.086 | 63.874 | 64.293 | 64.083 | 64.816 | 65.297 | 65.769 | 65.400 | 66.069 |
| Al₂O₃ | 13.448 | 13.223 | 12.770 | 12.540 | 12.610 | 12.190 | 11.918 | 11.656 | 11.800 | 11.422 |
| B₂O₃ | 5.102 | 4.468 | 4.369 | 4.455 | 3.835 | 3.767 | 3.764 | 3.825 | 3.000 | 3.000 |
| P₂O₅ | | | | | | | | | | |
| Li₂O | 9.908 | 10.028 | 10.368 | 10.553 | 10.447 | 10.764 | 10.973 | 11.179 | 11.000 | 11.291 |
| Na₂O | 2.001 | 2.001 | 2.001 | 2.001 | 2.001 | 2.001 | 2.001 | 2.001 | 2.000 | 2.000 |
| K₂O | 0.200 | 0.200 | 0.200 | 0.200 | 0.200 | 0.200 | 0.200 | 0.200 | 0.200 | 0.200 |
| MgO | 4.052 | 4.502 | 4.090 | 3.728 | 4.501 | 4.093 | 3.782 | 3.413 | 4.500 | 4.064 |
| CaO | 1.351 | 1.501 | 1.363 | 1.243 | 1.500 | 1.364 | 1.261 | 1.138 | 1.500 | 1.355 |
| ZnO | | | | | | | | | | |
| SnO₂ | | | | | | | | | | |
| Fe₂O₃ | | | | | | | | | | |
| TiO₂ | 0.850 | 0.745 | 0.728 | 0.742 | 0.639 | 0.628 | 0.627 | 0.637 | 0.500 | 0.500 |
| CeO₂ | 0.310 | 0.247 | 0.237 | 0.245 | 0.183 | 0.177 | 0.176 | 0.182 | 0.100 | 0.100 |
| ZrO₂ | | | | | | | | | | |
| La₂O₃ | | | | | | | | | | |
| SO₃ | | | | | | | | | | |
| WO₃ | | | | | | | | | | |
| Nb₂O₅ | | | | | | | | | | |
| Bi₂O₃ | | | | | | | | | | |
| MoO₃ | | | | | | | | | | |
| CeO₂ + TiO₂ | 1.160 | 0.991 | 0.965 | 0.988 | 0.823 | 0.805 | 0.804 | 0.820 | 0.600 | 0.600 |
| R₂O | 12.110 | 12.229 | 12.569 | 12.754 | 12.647 | 12.965 | 13.173 | 13.380 | 13.200 | 13.491 |
| Li₂O + Na₂O | 11.910 | 12.029 | 12.369 | 12.553 | 12.447 | 12.765 | 12.973 | 13.180 | 13.000 | 13.291 |

TABLE I-continued

| | | | | | | | | | | |
|---|---|---|---|---|---|---|---|---|---|---|
| $R_2O - Al_2O_3$ | -1.338 | -0.995 | -0.201 | 0.214 | 0.038 | 0.774 | 1.255 | 1.724 | 1.400 | 2.069 |
| R'O | 5.403 | 6.003 | 5.453 | 4.971 | 6.002 | 5.457 | 5.043 | 4.550 | 6.000 | 5.418 |
| Thickness (mm) | | | | | | | | | | |
| L* | | | | | | | | | | |
| a* | | | | | | | | | | |
| b* | | | | | | | | | | |
| Density (g/cm³) | | | | | | | | | | |
| Liquidus Temp. (° C.) | | | | | | | | | | |

| Example | 611 | 612 | 613 |
|---|---|---|---|
| $SiO_2$ | 66.560 | 67.047 | 67.700 |
| $Al_2O_3$ | 11.144 | 10.869 | 10.500 |
| $B_2O_3$ | 3.000 | 3.000 | 3.000 |
| $P_2O_5$ | | | |
| $Li_2O$ | 11.504 | 11.716 | 12.000 |
| $Na_2O$ | 2.000 | 2.000 | 2.000 |
| $K_2O$ | 0.200 | 0.200 | 0.200 |
| MgO | 3.743 | 3.426 | 3.000 |
| CaO | 1.248 | 1.142 | 1.000 |
| ZnO | | | |
| $SnO_2$ | | | |
| $Fe_2O_3$ | | | |
| $TiO_2$ | 0.500 | 0.500 | 0.500 |
| $CeO_2$ | 0.100 | 0.100 | 0.100 |
| $ZrO_2$ | | | |
| $La_2O_3$ | | | |
| $SO_3$ | | | |
| $WO_3$ | | | |
| $Nb_2O_5$ | | | |
| $Bi_2O_3$ | | | |
| $MoO_3$ | | | |
| $CeO_2 + TiO_2$ | 0.600 | 0.600 | 0.600 |
| $R_2O$ | 13.704 | 13.916 | 14.200 |
| $Li_2O + Na_2O$ | 13.504 | 13.716 | 14.000 |
| $R_2O - Al_2O_3$ | 2.560 | 3.047 | 3.700 |
| R'O | 4.991 | 4.567 | 4.000 |
| Thickness (mm) | | | |
| L* | | | |
| a* | | | |
| b* | | | |
| Density (g/cm³) | | | |
| Liquidus Temp. (° C.) | | | |

The change in b* value experienced as a result of the annealing process for Examples 422-448 was calculated, and is reported in Table II below.

TABLE II

| Example | Delta b* |
|---|---|
| 422 | 0.28 |
| 423 | 0.20 |
| 424 | 0.30 |
| 425 | 0.39 |
| 426 | 0.62 |
| 427 | 0.11 |
| 428 | 0.92 |
| 429 | 0.45 |
| 430 | 1.22 |
| 431 | 1.26 |
| 432 | 1.41 |
| 433 | 4.01 |
| 434 | 2.00 |
| 435 | 6.06 |
| 436 | 15.85 |
| 437 | 0.42 |
| 438 | 0.19 |
| 439 | 0.56 |
| 440 | 58.97 |
| 441 | -0.07 |
| 442 | 0.05 |
| 443 | 0.22 |
| 444 | 20.43 |
| 445 | 0.46 |
| 446 | 1.39 |
| 447 | -0.07 |
| 448 | 4.78 |

Figure 3:
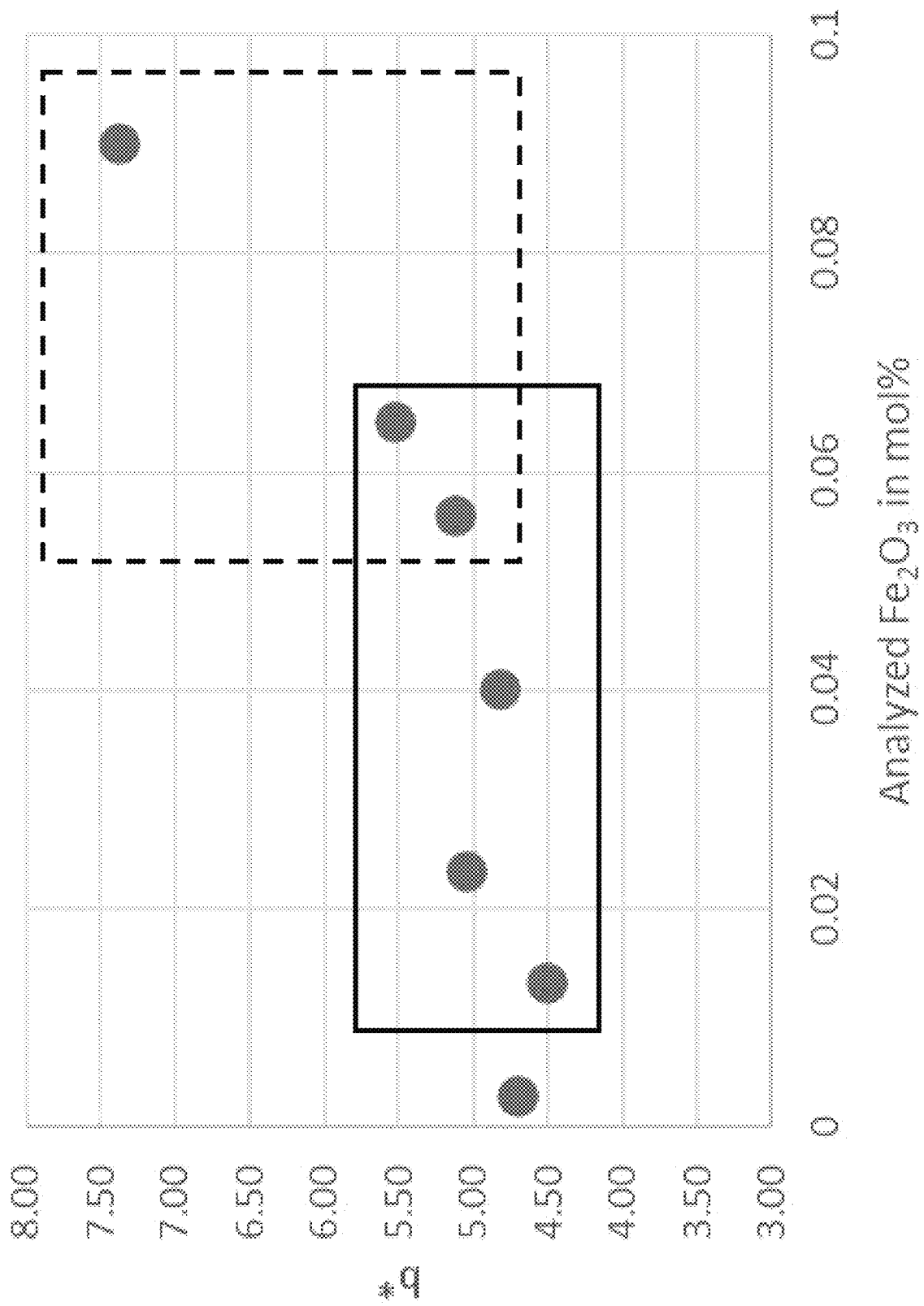
FIG. 3 is a plot of b* as a function of $Fe_2O_3$ content for a variety of glass compositions, according to embodiments.

To investigate the impact of $Fe_2O_3$ content in the glass composition on the color and color stability of the colored glass articles, the b* value was plotted for a number of glass compositions with different $Fe_2O_3$ contents, as shown in FIG. 3. The solid box in FIG. 3 identifies a $Fe_2O_3$ content regime that minimizes the color sensitivity of the colored glass article while not significantly affecting the b* value.

The dashed box in FIG. 3 identifies $Fe_2O_3$ contents that produced stable colors after 20 hours at a temperature of 600° C.

Figure 4:
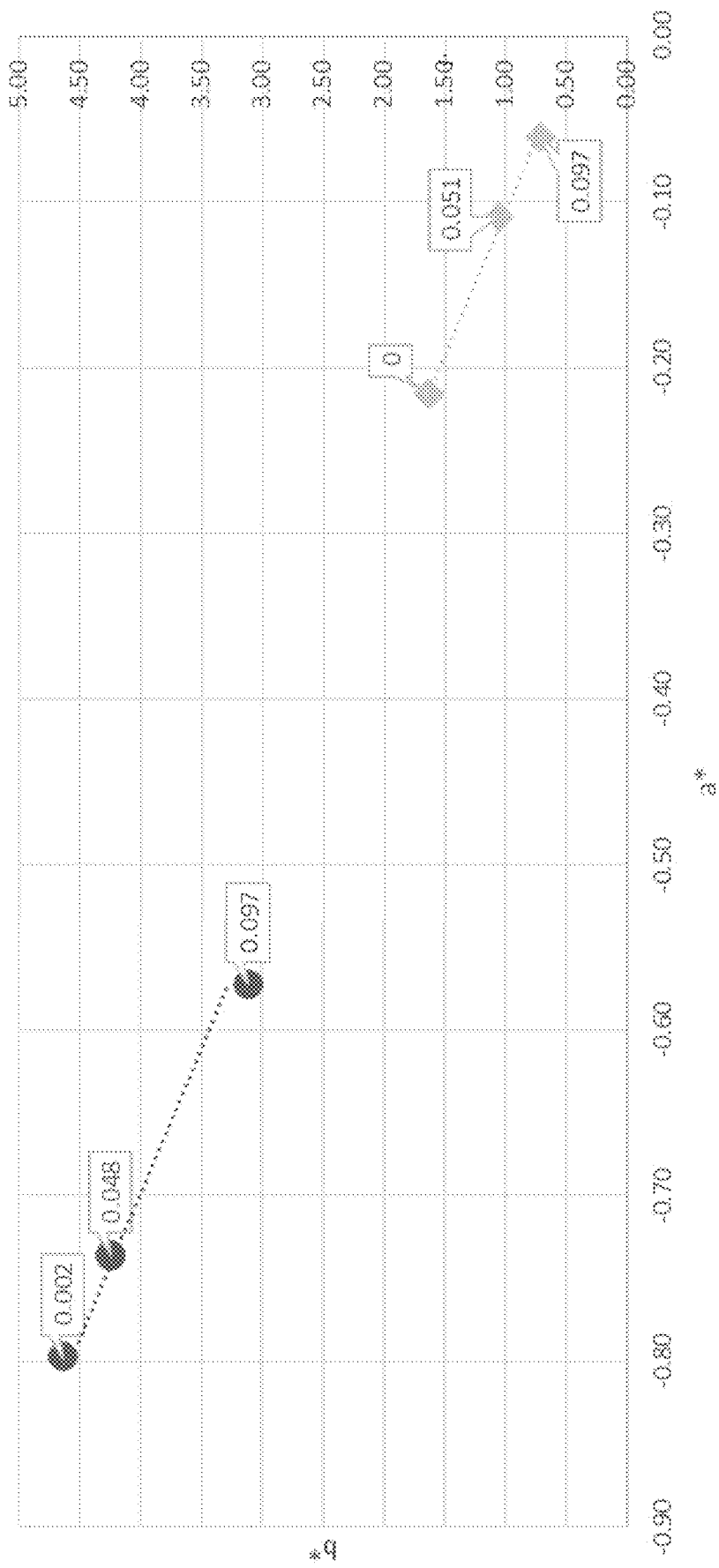
FIG. 4 is a plot of b* as a function of a* for glass compositions with various $SnO_2$ contents as labelled, according to embodiments.

The effect of $SnO_2$ content on b* was investigated by plotting the a* and b* values for glass compositions with various analyzed $SnO_2$ contents, as shown in FIG. 4. In FIG. 4 the data points are labeled with the analyzed $SnO_2$ content. As shown in FIG. 4, increasing $SnO_2$ content decreases the b* value and increases the a* value of the colored glass article.

Figure 5:
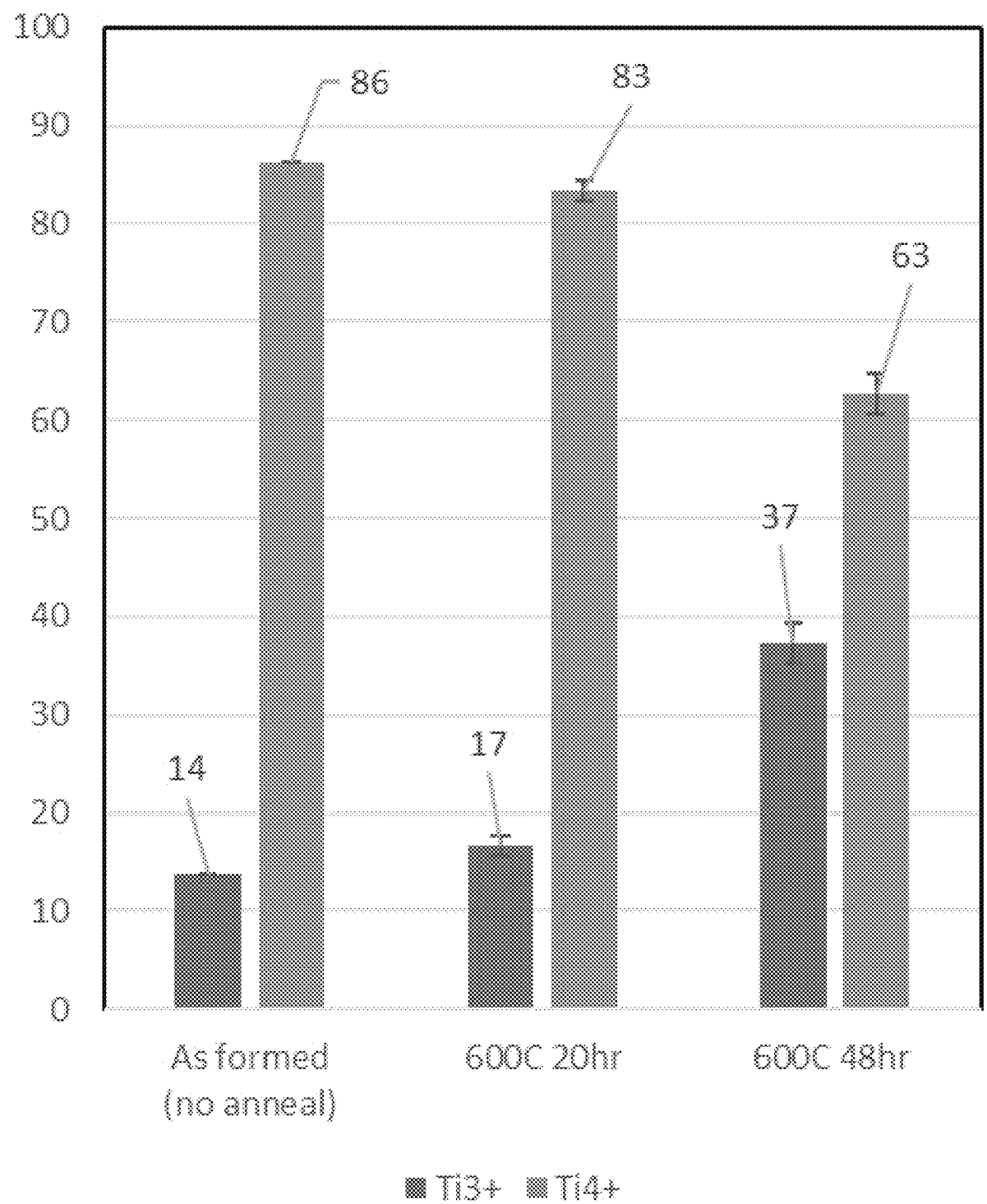
FIG. 5 is a plot of titanium oxidation state content as measured by XPS for glass articles subjected to various heat treatments.
Figure 6:
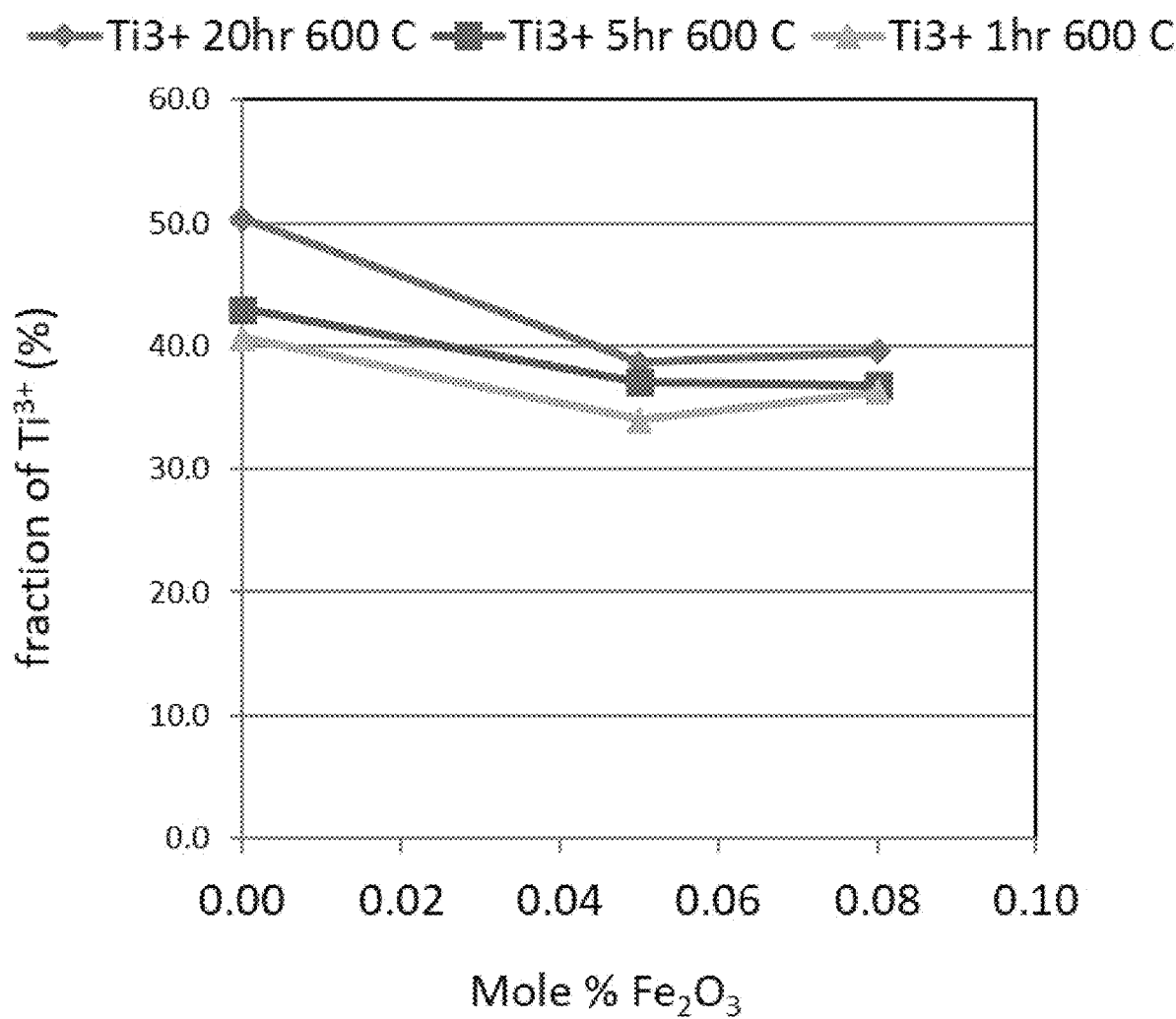
FIG. 6 is a plot of $Ti^{3+}$ oxidation state fraction as detected by XPS as a function of function of $Fe_2O_3$ content for a variety of glass compositions and annealing treatments, according to embodiments.

To investigate the impact of $CeO_2$ on the stability of titanium oxidation states in the colored glass articles, and the associated color stability of the colored glass articles, XPS analysis was performed. Glass bars with a size of 3 mm×3 mm×10 mm were formed from the glass composition of Example 307 that includes $CeO_2$ and $TiO_2$, and a comparative composition that contains $TiO_2$ in the absence of $CeO_2$ was formed into bars of the same dimensions. The comparative composition as analyzed included 61.5 mol % $SiO_2$, 14.5 mol % $Al_2O_3$, 5.7 mol % $B_2O_3$, 9.8 mol % $Li_2O$, 1.8 mol % $Na_2O$, 0.2 mol % $K_2O$, 2.0 mol % MgO, 2.0 mol % CaO, 1.0 mol % ZnO, 1.5 mol % $TiO_2$, and 0.004 mol % $Fe_2O_3$. The Example 307 glass bars were fractured under ultra-high vacuum in as formed condition, after annealing at 600° C. for 24 hours, and after annealing at 600° C. for 48 hours. The oxidation state of titanium and cerium was determined by XPS analysis at the fracture site, with the predominant oxidation state for titanium being $Ti^{4+}$ and for cerium being $Ce^{3+}$. The results indicated that the content of $Ti^{3+}$ increased with increasing annealing time as shown in FIG. 5, and suggests that an observed color change may be due to the change of titanium oxidation state. In contrast, the XPS results for the comparative composition indicated that the titanium oxidation state did not change as a function of anneal time. XPS results also indicated that the presence of $Fe_2O_3$ in the glass compositions inhibits the transition of $Ti^{4+}$ to $Ti^{3+}$ when heat treated, as shown in FIG. 6, improving color stability.

It will be apparent to those skilled in the art that various modifications and variations may be made to the embodiments described herein without departing from the spirit and scope of the claimed subject matter. Thus, it is intended that the specification cover the modifications and variations of the various embodiments described herein provided such modification and variations come within the scope of the appended claims and their equivalents.

What is claimed is:

1. A colored glass article, comprising:
   a glass in mole percent on an oxide basis, comprising:
      greater than or equal to 53 mol % to less than or equal to 66 mol % $SiO_2$;
      greater than or equal to 9 mol % to less than or equal to 18 mol % $Al_2O_3$;
      greater than or equal to 0 mol % to less than or equal to 15 mol % $B_2O_3$;
      greater than or equal to 0 mol % to less than or equal to 3 mol % $P_2O_5$;
      greater than or equal to 6 mol % to less than or equal to 16 mol % $Li_2O$;
      greater than or equal to 0 mol % to less than or equal to 15 mol % $Na_2O$;
      greater than or equal to 0 mol % to less than or equal to 5 mol % $K_2O$;
      greater than or equal to 0 mol % to less than or equal to 6 mol % MgO;
      greater than 0 mol % to less than or equal to 6 mol % CaO;
      greater than or equal to 0 mol % to less than or equal to 3 mol % ZnO;
      greater than or equal to 0 mol % to less than or equal to 2 mol % $TiO_2$;
      greater than 0 mol % to less than or equal to 2 mol % $CeO_2$;
      greater than or equal to 0 mol % to less than or equal to 1 mol % $Fe_2O_3$;
      greater than or equal to 0 mol % to less than or equal to 0.5 mol % $SnO_2$;
      greater than or equal to 0 mol % to less than or equal to 0.05 mol % $SO_3$;
      greater than or equal to 0 mol % to less than or equal to 1 mol % $WO_3$;
      greater than or equal to 0 mol % to less than or equal to 1 mol % $Nb_2O_5$;
      greater than or equal to 0 mol % to less than or equal to 1 mol % $Bi_2O_3$;
      greater than or equal to 0 mol % to less than or equal to 1 mol % $MoO_3$; and
      greater than or equal to 0 mol % to less than or equal to 3 mol % $La_2O_3$;
      wherein $TiO_2+CeO_2$ is greater than or equal to 0.2 mol % and less than or equal to 1.5 mol %; and wherein $Li_2O+Na_2O$ is greater than or equal to 8 mol %;
   wherein the colored glass article has a thickness greater than or equal to 250 μm and less than or equal to 6 mm,
   wherein the colored glass article is an ion-exchanged colored glass article, wherein the colored glass article comprises a depth of compression greater than or equal to 30 μm, wherein the colored glass article has a surface compressive stress greater than or equal to 300 MPa, wherein the colored glass article has a maximum central tension greater than or equal to 40 MPa; and
   wherein the colored glass article has a transmittance color coordinate in the CIELAB color space, as measured under F2 illumination and a 10° standard observer angle, of L* greater than or equal to 85 and less than or equal to 98, a* greater than or equal to −4.0 and less than or equal to 0, and b* greater than or equal to 0.1 and less than or equal to 12.0.

2. A consumer electronic device, comprising:
   a housing comprising the colored glass article of claim 1, wherein the housing has a front surface, a back surface, and side surfaces; and
   electrical components provided at least partially within the housing, the electrical components including at least a controller, a memory, and a display, the display being provided at or adjacent the front surface of the housing.

3. A colored glass article, comprising:
   a glass in mole percent on an oxide basis, comprising:
      greater than or equal to 53 mol % to less than or equal to 66 mol % $SiO_2$;
      greater than or equal to 9 mol % to less than or equal to 18 mol % $Al_2O_3$;
      greater than 0 mol % to less than or equal to 15 mol % $B_2O_3$;
      greater than or equal to 6 mol % to less than or equal to 16 mol % $Li_2O$;
      greater than 0 mol % to less than or equal to 15 mol % $Na_2O$;
      greater than or equal to 0 mol % to less than or equal to 5 mol % $K_2O$;
      greater than 0 mol % to less than or equal to 6 mol % MgO;

greater than 0 mol % to less than or equal to 6 mol % CaO;
greater than or equal to 0 mol % to less than or equal to 3 mol % ZnO;
greater than 0 mol % to less than or equal to 2 mol % $TiO_2$;
greater than 0 mol % to less than or equal to 2 mol % $CeO_2$;
greater than 0 mol % to less than or equal to 1 mol % $Fe_2O_3$;
greater than or equal to 0 mol % to less than or equal to 0.5 mol % $SnO_2$;
greater than or equal to 0 mol % to less than or equal to 0.05 mol % $SO_3$;
greater than or equal to 0 mol % to less than or equal to 1 mol % $WO_3$;
greater than or equal to 0 mol % to less than or equal to 1 mol % $Nb_2O_5$;
greater than or equal to 0 mol % to less than or equal to 1 mol % $Bi_2O_3$;
greater than or equal to 0 mol % to less than or equal to 1 mol % $MoO_3$; and
greater than or equal to 0 mol % to less than or equal to 3 mol % $La_2O_3$;
wherein $TiO_2+CeO_2$ is greater than or equal to 0.2 mol % and less than or equal to 1.5 mol %; and wherein $Li_2O+Na_2O$ is greater than or equal to 8 mol %;
wherein the colored glass article has a thickness greater than or equal to 250 μm and less than or equal to 6 mm,
wherein the colored glass article is an ion-exchanged colored glass article, wherein the colored glass article comprises a depth of compression greater than or equal to 30 μm, wherein the colored glass article has a surface compressive stress greater than or equal to 300 MPa, wherein the colored glass article has a maximum central tension greater than or equal to 40 MPa; and
wherein the colored glass article has a transmittance color coordinate in the CIELAB color space, as measured under F2 illumination and a 10° standard observer angle, of L* greater than or equal to 85 and less than or equal to 98, a* greater than or equal to −4.0 and less than or equal to 0, and b* greater than or equal to 0.1 and less than or equal to 12.0.

4. A consumer electronic device, comprising:
a housing comprising the colored glass article of claim 3, wherein the housing has a front surface, a back surface, and side surfaces; and
electrical components provided at least partially within the housing, the electrical components including at least a controller, a memory, and a display, the display being provided at or adjacent the front surface of the housing.

5. The colored glass article of claim 1, comprising greater than or equal to 6 mol % to less than or equal to 14 mol % $Li_2O$.

6. The colored glass article of claim 1, comprising greater than or equal to 0.4 mol % to less than or equal to 0.8 mol % $CeO_2$.

7. The colored glass article of claim 1, comprising greater than or equal to 0.6 mol % to less than or equal to 1.5 mol % $TiO_2$.

8. The colored glass article of claim 1, comprising greater than or equal to 0 mol % to less than or equal to 0.1 mol % $Fe_2O_3$.

9. The colored glass article of claim 1, comprising greater than or equal to 0.1 mol % to less than or equal to 7 mol % $Na_2O$.

10. The colored glass article of claim 1, comprising greater than or equal to 0.5 mol % to less than or equal to 3 mol % $Na_2O$.

11. The colored glass article of claim 1, comprising greater than 0 mol % to less than or equal to 3 mol % $K_2O$.

12. The colored glass article of claim 1, comprising greater than 0 mol % to less than or equal to 0.5 mol % $K_2O$.

13. The colored glass article of claim 1, comprising wherein $Li_2O+Na_2O$ is greater than or equal to 10 mol % to less than or equal to 19 mol %.

14. The colored glass article of claim 1, comprising greater than 0 mol % to less than or equal to 4.5 mol % MgO.

15. The colored glass article of claim 1, comprising greater than 0 mol % to less than or equal to 5 mol % CaO.

16. The colored glass article of claim 1, comprising greater than 0.05 mol % to less than or equal to 2 mol % $CeO_2$.

17. The colored glass article of claim 3, comprising greater than or equal to 6 mol % to less than or equal to 14 mol % $Li_2O$.

18. The colored glass article of claim 3, comprising greater than or equal to 0.4 mol % to less than or equal to 0.8 mol % $CeO_2$.

19. A colored glass article, comprising:
a glass in mole percent on an oxide basis, comprising:
greater than or equal to 53 mol % to less than or equal to 66 mol % $SiO_2$;
greater than or equal to 9 mol % to less than or equal to 18 mol % $Al_2O_3$;
greater than or equal to 0 mol % to less than or equal to 15 mol % $B_2O_3$;
greater than or equal to 0 mol % to less than or equal to 3 mol % $P_2O_5$;
greater than or equal to 6 mol % to less than or equal to 16 mol % $Li_2O$;
greater than or equal to 0 mol % to less than or equal to 15 mol % $Na_2O$;
greater than or equal to 0 mol % to less than or equal to 5 mol % $K_2O$;
greater than or equal to 0 mol % to less than or equal to 6 mol % MgO;
greater than 0 mol % to less than or equal to 6 mol % CaO;
greater than or equal to 0 mol % to less than or equal to 3 mol % ZnO;
greater than or equal to 0 mol % to less than or equal to 2 mol % $TiO_2$;
greater than or equal to 0 mol % to less than or equal to 2 mol % $CeO_2$;
greater than or equal to 0 mol % to less than or equal to 1 mol % $Fe_2O_3$;
greater than or equal to 0 mol % to less than or equal to 0.5 mol % $SnO_2$;
greater than or equal to 0 mol % to less than or equal to 0.05 mol % $SO_3$;
greater than or equal to 0 mol % to less than or equal to 1 mol % $WO_3$;
greater than or equal to 0 mol % to less than or equal to 1 mol % $Nb_2O_5$;
greater than or equal to 0 mol % to less than or equal to 1 mol % $Bi_2O_3$;
greater than or equal to 0 mol % to less than or equal to 1 mol % $MoO_3$; and
greater than or equal to 0 mol % to less than or equal to 3 mol % $La_2O_3$;
wherein $Li_2O+Na_2O$ is greater than or equal to 8 mol %;

wherein the colored glass article has a thickness greater than or equal to 250 μm and less than or equal to 6 mm, wherein the colored glass article is an ion-exchanged colored glass article, wherein the colored glass article comprises a depth of compression greater than or equal to 30 μm, wherein the colored glass article has a surface compressive stress greater than or equal to 300 MPa, wherein the colored glass article has a maximum central tension greater than or equal to 40 MPa; and wherein the colored glass article has a transmittance color coordinate in the CIELAB color space, as measured under F2 illumination and a 10° standard observer angle, of L* greater than or equal to 85 and less than or equal to 98.

20. The colored glass article of claim 19, comprising greater than or equal to 6 mol % to less than or equal to 14 mol % $Li_2O$.

* * * * *